United States Patent
Nakayama et al.

(10) Patent No.: US 8,009,465 B2
(45) Date of Patent: Aug. 30, 2011

(54) MAGNETORESISTIVE ELEMENT

(75) Inventors: Masahiko Nakayama, Fuchu (JP); Tadashi Kai, Tokyo (JP); Tatsuya Kishi, Yokohama (JP); Yoshiaki Fukuzumi, Yokohama (JP); Toshihiko Nagase, Sagamihara (JP); Sumio Ikegawa, Musashino (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 143 days.

(21) Appl. No.: 12/364,132

(22) Filed: Feb. 2, 2009

(65) Prior Publication Data

US 2009/0140358 A1 Jun. 4, 2009

Related U.S. Application Data

(60) Division of application No. 12/019,743, filed on Jan. 25, 2008, now Pat. No. 7,518,907, which is a continuation of application No. 11/245,353, filed on Oct. 7, 2005, now Pat. No. 7,355,884.

(30) Foreign Application Priority Data

| Oct. 8, 2004 | (JP) | 2004-296455 |
| Oct. 8, 2004 | (JP) | 2004-296456 |
| Jul. 15, 2005 | (JP) | 2005-207531 |
| Jul. 15, 2005 | (JP) | 2005-207628 |

(51) Int. Cl.
  *G11C 11/00* (2006.01)
(52) U.S. Cl. ........ 365/158; 365/145; 365/171; 365/173; 365/97; 257/295; 257/296; 257/421; 257/422
(58) Field of Classification Search .......... 365/145, 365/148, 158, 171, 173, 97; 257/295, 296, 257/421, 422
See application file for complete search history.

(56) References Cited

U.S. PATENT DOCUMENTS

| 5,748,524 | A | 5/1998 | Chen et al. |
| 5,757,695 | A | 5/1998 | Shi et al. |
| 5,953,248 | A | 9/1999 | Chen et al. |
| 6,205,053 | B1 | 3/2001 | Anthony |
| 6,365,948 | B1 | 4/2002 | Kumagai et al. |
| 6,563,682 | B1 | 5/2003 | Sugawara et al. |
| 6,605,836 | B2 | 8/2003 | Kishi et al. |
| 6,765,824 | B2 | 7/2004 | Kishi et al. |
| 6,949,779 | B2 | 9/2005 | Kai et al. |
| 7,095,071 | B2 | 8/2006 | Fukuzumi et al. |
| 7,140,096 | B2 | 11/2006 | Kishi et al. |
| 7,326,982 | B2 | 2/2008 | Iwata et al. |

(Continued)

FOREIGN PATENT DOCUMENTS

JP  11-273337  10/1999

(Continued)

*Primary Examiner* — Pho M Luu
*Assistant Examiner* — Tha-o Bui
(74) *Attorney, Agent, or Firm* — Oblon, Spivak, McClelland, Maier & Neustadt, L.L.P.

(57) ABSTRACT

A magnetoresistive element includes a first ferromagnetic layer having a first magnetization, the first magnetization having a first pattern when the magnetoresistive element is half-selected during a first data write, a second pattern when the magnetoresistive element is selected during a second data write, and a third pattern of residual magnetization, the first pattern being different from the second and third pattern, a second ferromagnetic layer having a second magnetization, and a nonmagnetic layer arranged between the first ferromagnetic layer and the second ferromagnetic layer and having a tunnel conductance changing dependent on a relative angle between the first magnetization and the second magnetization.

17 Claims, 65 Drawing Sheets

U.S. PATENT DOCUMENTS

| | | |
|---|---|---|
| 7,411,263 B2 | 8/2008 | Nakayama et al. |
| 7,414,880 B2 | 8/2008 | Kai et al. |
| 2002/0130339 A1 | 9/2002 | Kishi et al. |
| 2003/0185050 A1* | 10/2003 | Kishi et al. .................... 365/173 |
| 2004/0062938 A1 | 4/2004 | Kai et al. |
| 2004/0246777 A1 | 12/2004 | Maejima et al. |
| 2004/0256688 A1* | 12/2004 | Braun ............................ 257/438 |
| 2005/0078417 A1 | 4/2005 | Kishi et al. |
| 2005/0199926 A1 | 9/2005 | Fukuzumi et al. |
| 2005/0242384 A1* | 11/2005 | Iwata et al. ................... 257/296 |
| 2006/0082933 A1 | 4/2006 | Kishi et al. |
| 2007/0012972 A1 | 1/2007 | Nakayama et al. |
| 2007/0013015 A1 | 1/2007 | Kai et al. |

FOREIGN PATENT DOCUMENTS

| | | |
|---|---|---|
| JP | 2002-231904 | 8/2002 |
| JP | 2002-280637 | 9/2002 |
| JP | 2003-78112 | 3/2003 |
| JP | 2003-283001 | 10/2003 |
| JP | 2004-128015 | 4/2004 |
| JP | 2004-128067 | 4/2004 |
| JP | 2004-146614 | 5/2004 |
| JP | 2004-179183 | 6/2004 |
| JP | 2005-353788 | 12/2005 |
| WO | WO 03/107350 A2 | 12/2003 |

* cited by examiner

MTJ element A (residual magnetization state: "0"-data (parallel))

MTJ element A (residual magnetization state: "1"-data (anti-parallel))

MTJ element B1 (state of semi-selected cell: "0"-data (parallel))

MTJ element B1 (state of semi-selected cell: "1"-data (anti-parallel))

MTJ element B2 (state of semi-selected cell: "0"-data (parallel))

MTJ element B2 (state of semi-selected cell: "1"-data (parallel))

MTJ element C (state of selected cell: "0"-data (parallel) → "1"-data (anti-parallel))

MTJ element C (residual magnetization state after write: "1"-data (anti-parallel))

MTJ element C (state of selected cell: "1"-data (anti-parallel) → "0"-data (parallel))

※Magnetic field Hx + Hy
Magnetization direction of pinned layer: ⇒

MTJ element C (residual magnetization state after write: "0"-data (parallel))

※No magnetic field (S-shaped domain)
Magnetization direction of pinned layer: ⇒

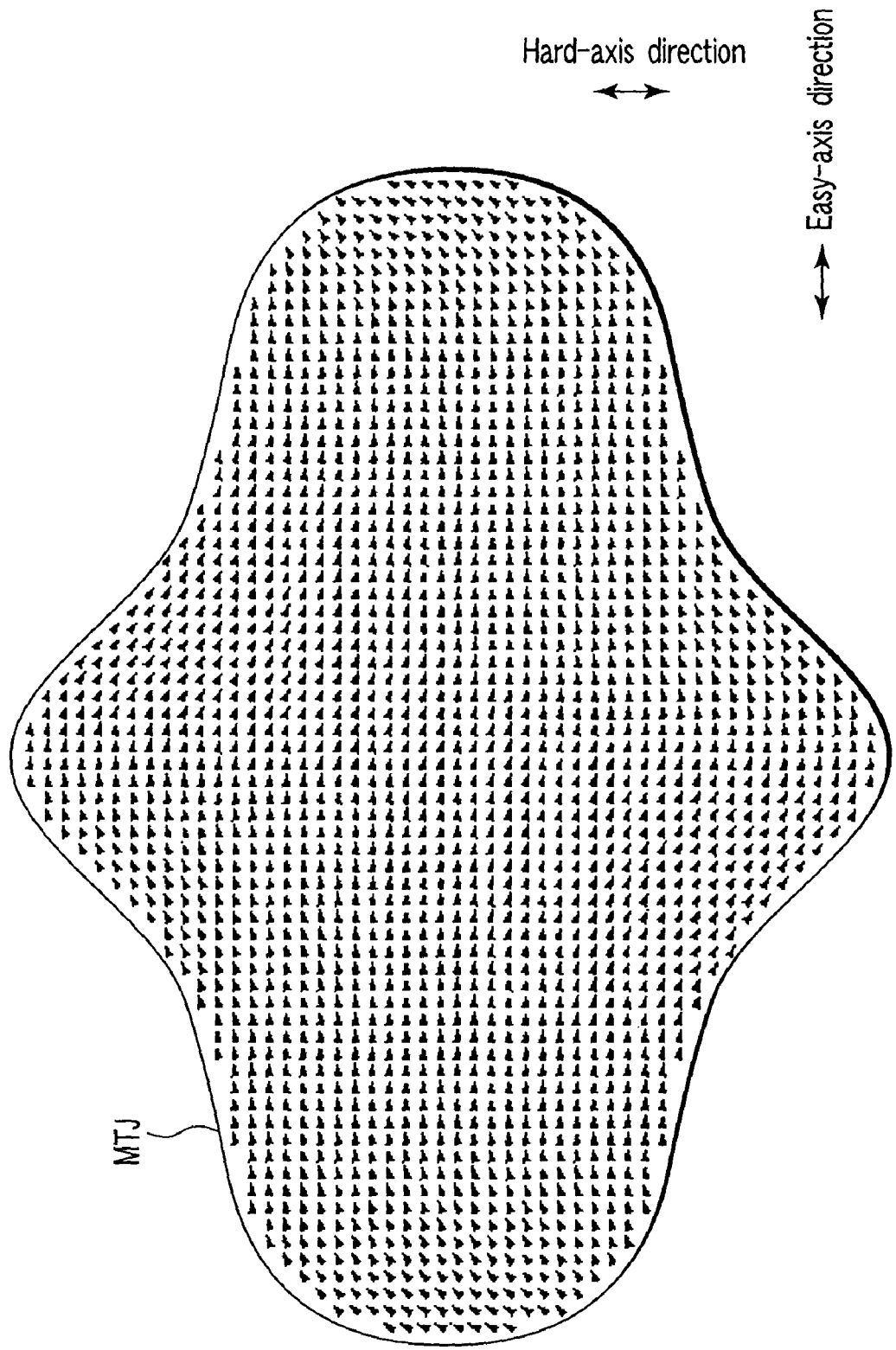
Hard-axis direction
Easy-axis direction
F I G. 12

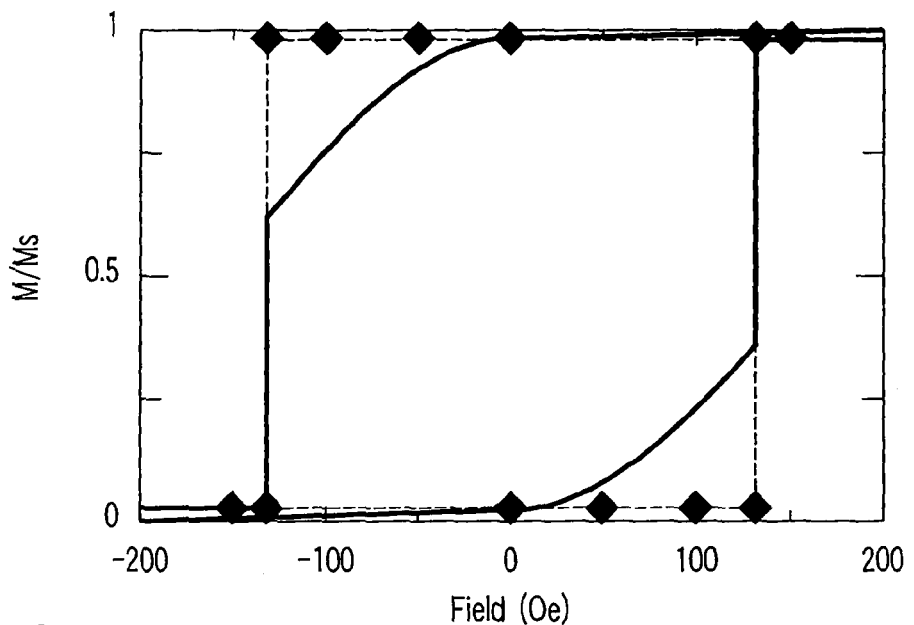
FIG. 13  MH curve and residual magnetization curve in easy-axis direction
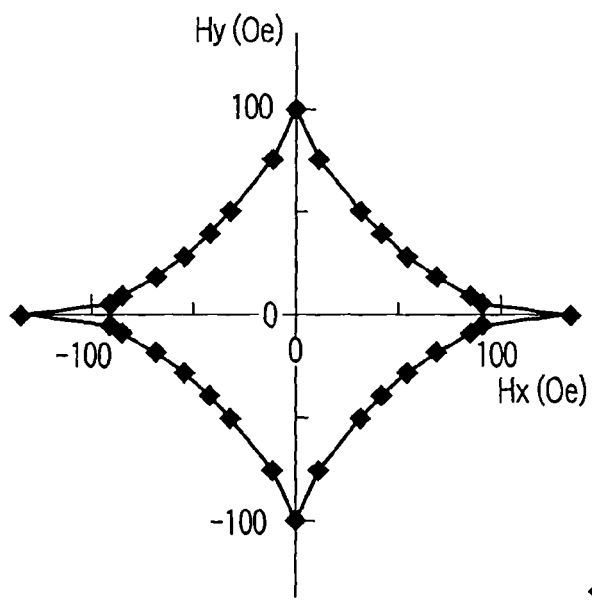
FIG. 14
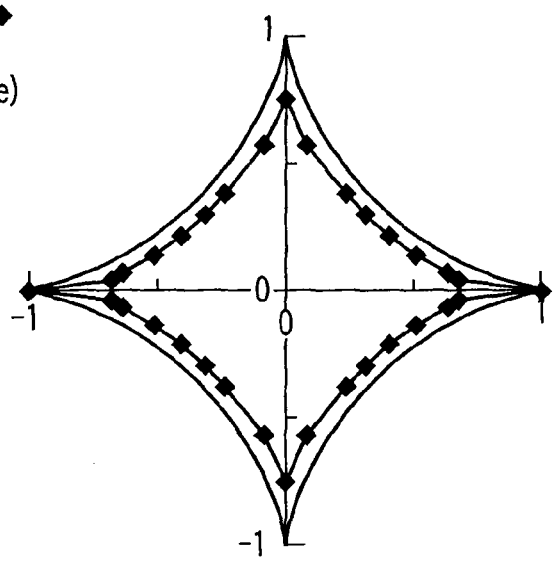
FIG. 15

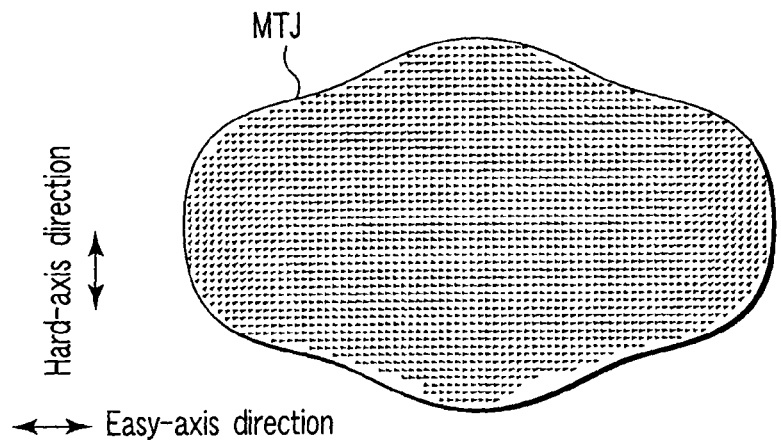
F I G. 28
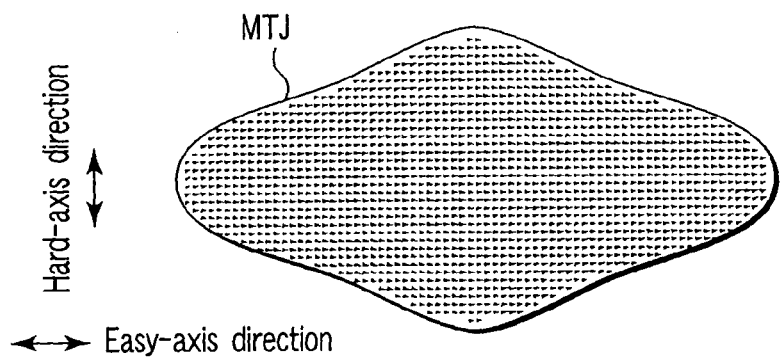
F I G. 29
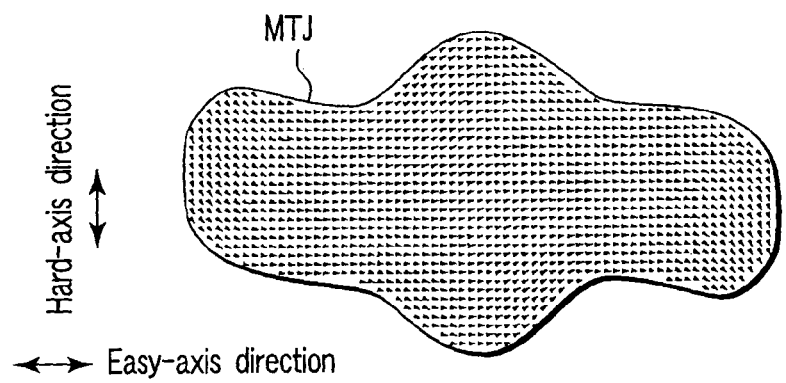
F I G. 30

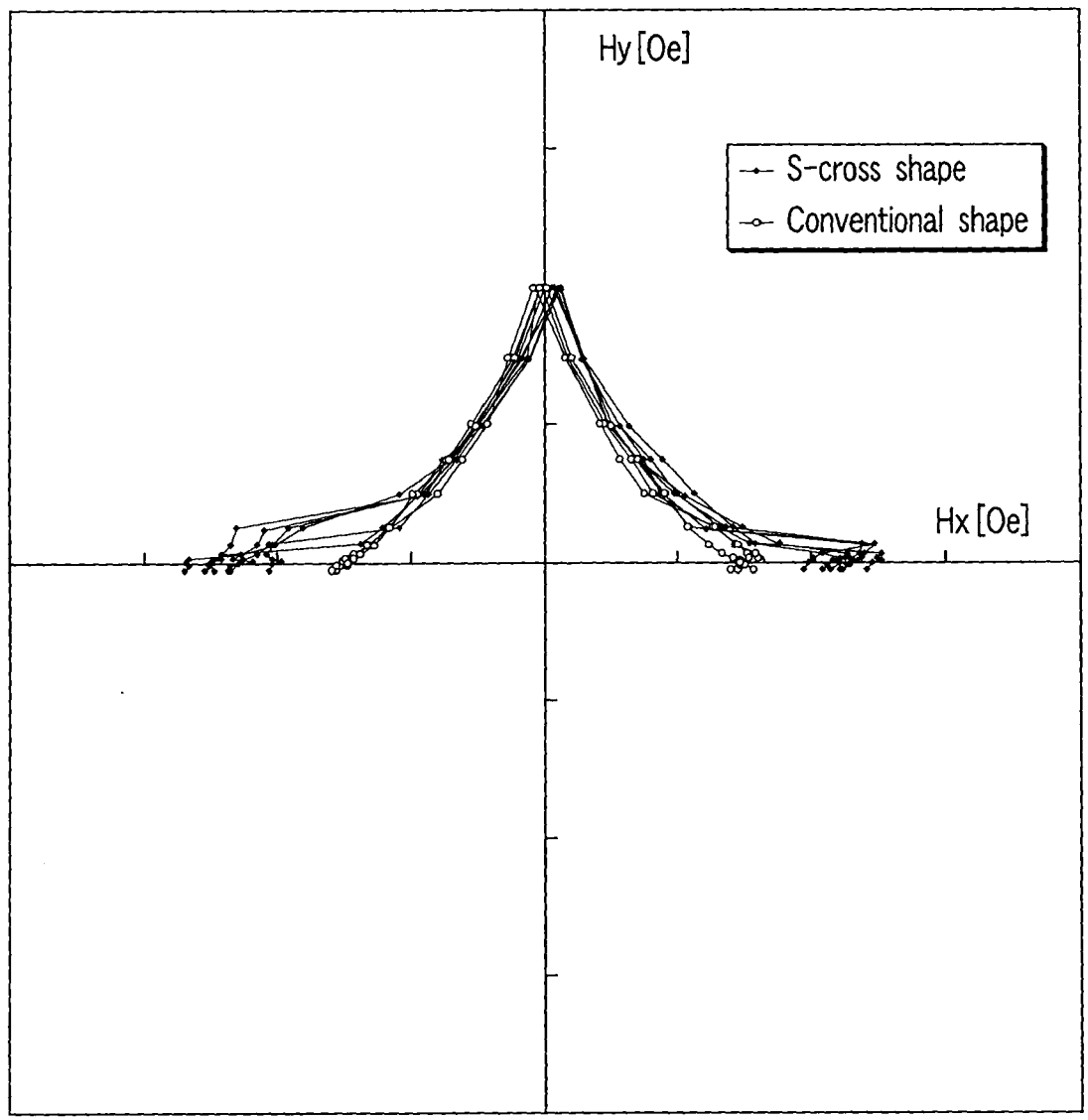
F I G. 34

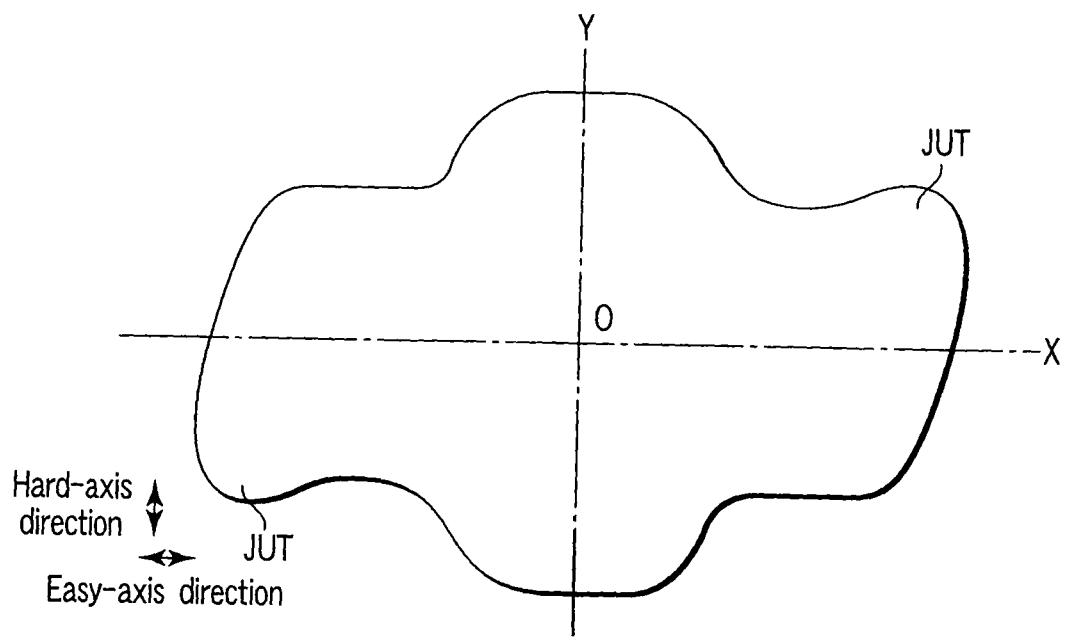
F I G. 37
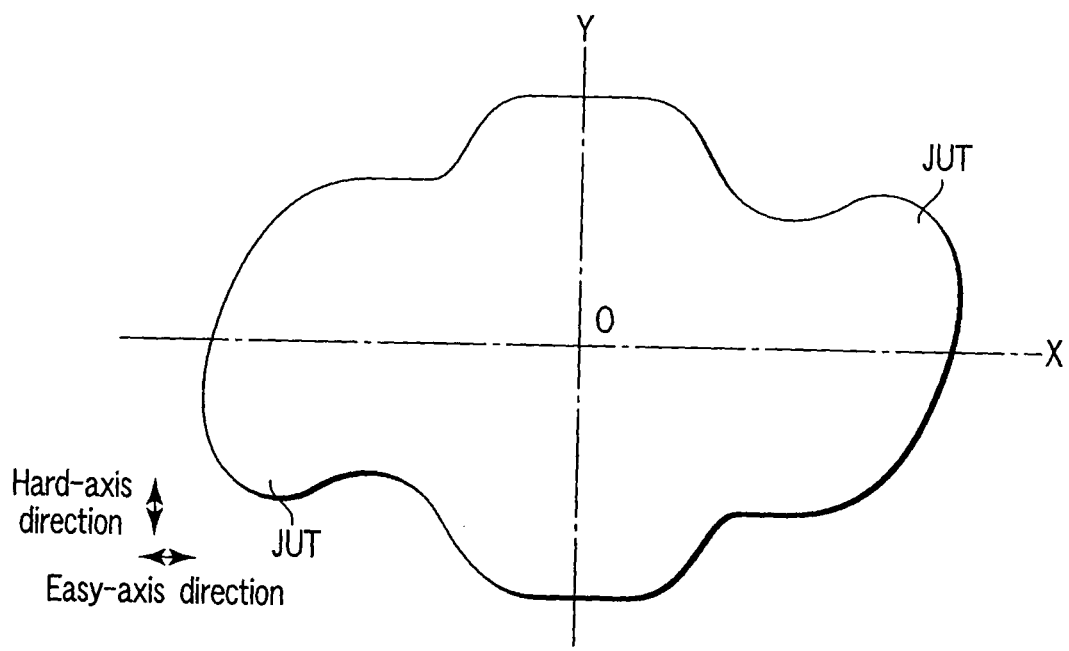
F I G. 38

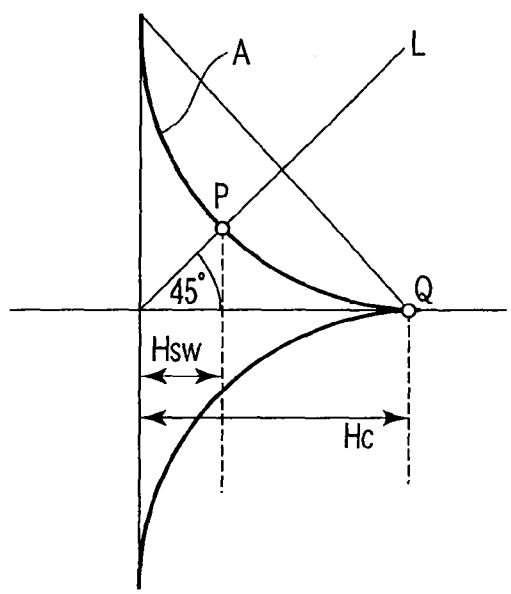
F I G. 46
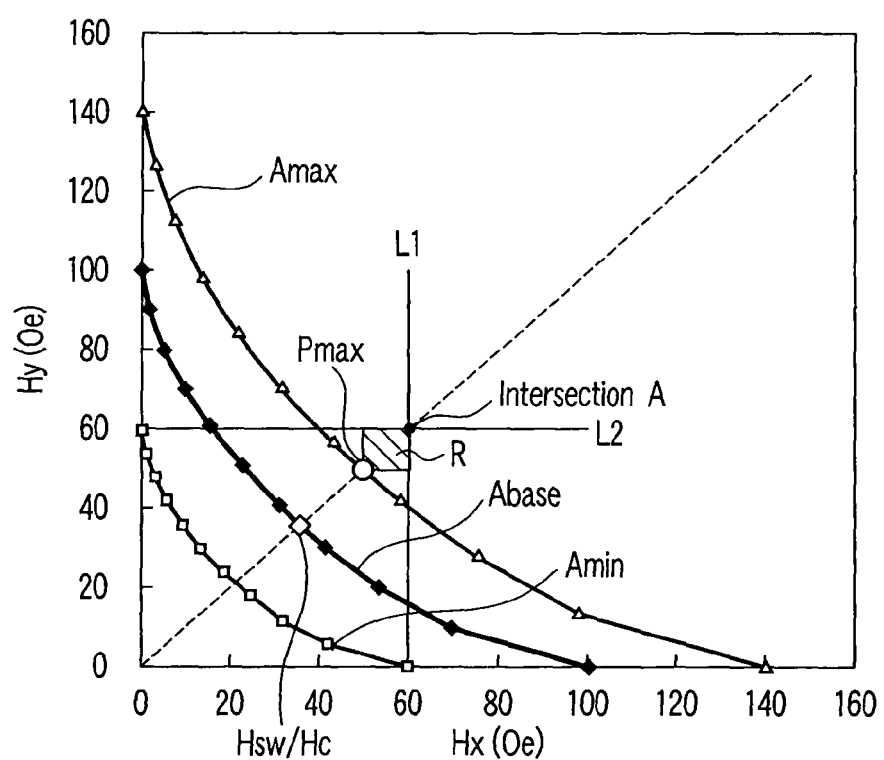
F I G. 47

| Hsw/Hc | Write margin |
|---|---|
| 0.43 | −0.01 |
| 0.42 | 0.01 |
| 0.41 | 0.02 |
| 0.40 | 0.03 |
| 0.35 | 0.09 |
F I G. 48
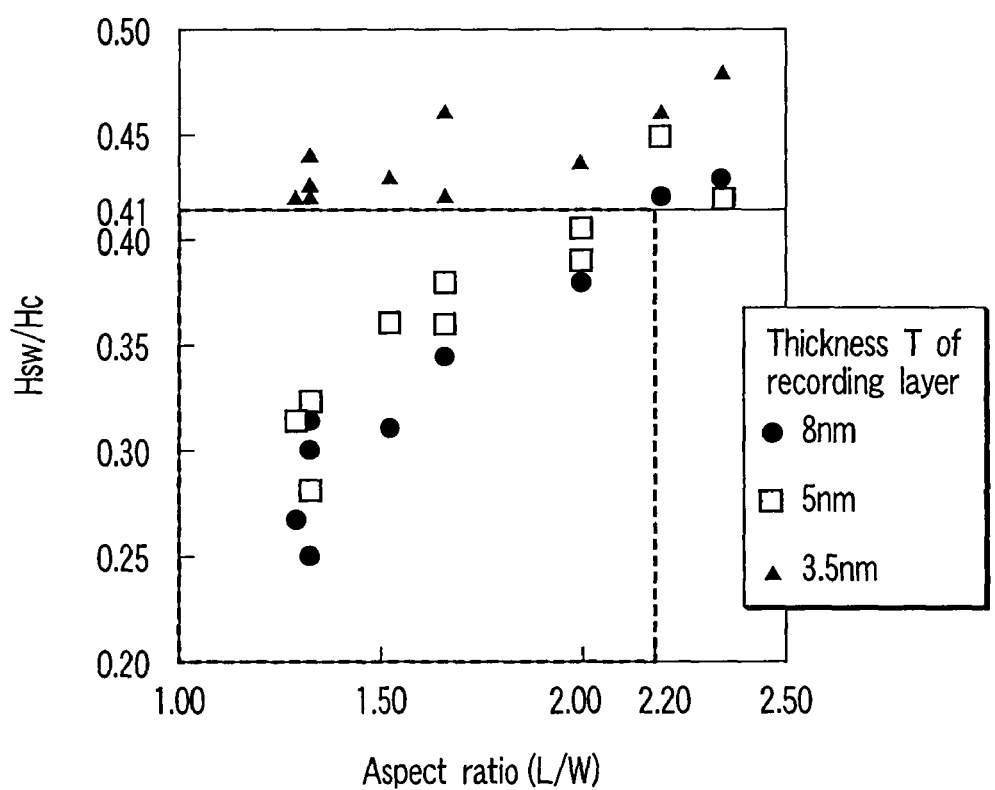
F I G. 49

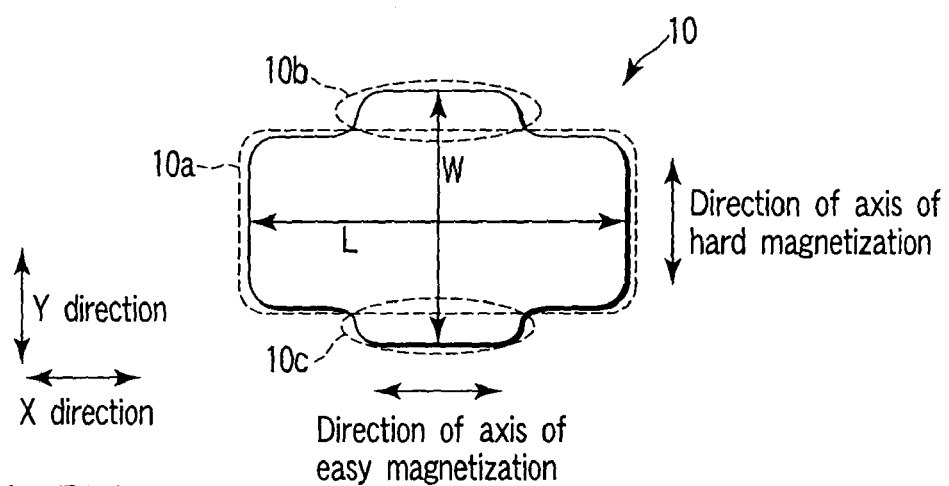
F I G. 57A
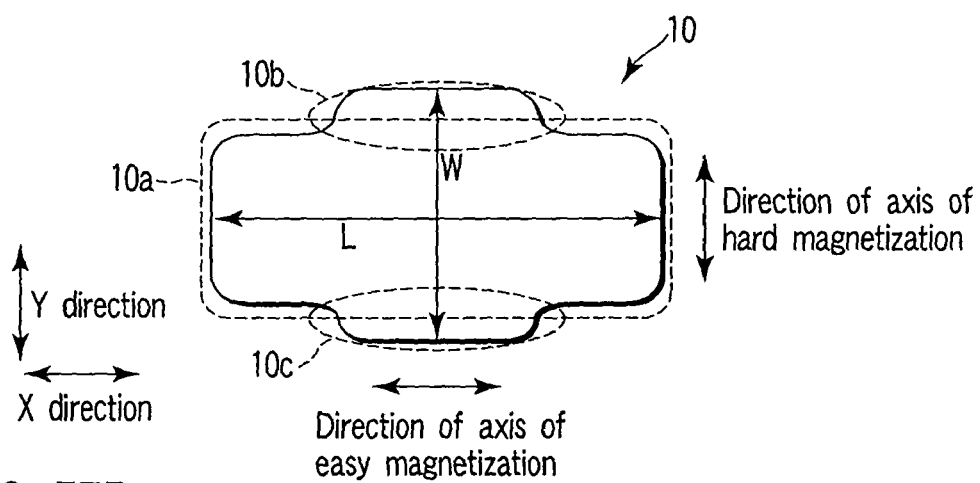
F I G. 57B
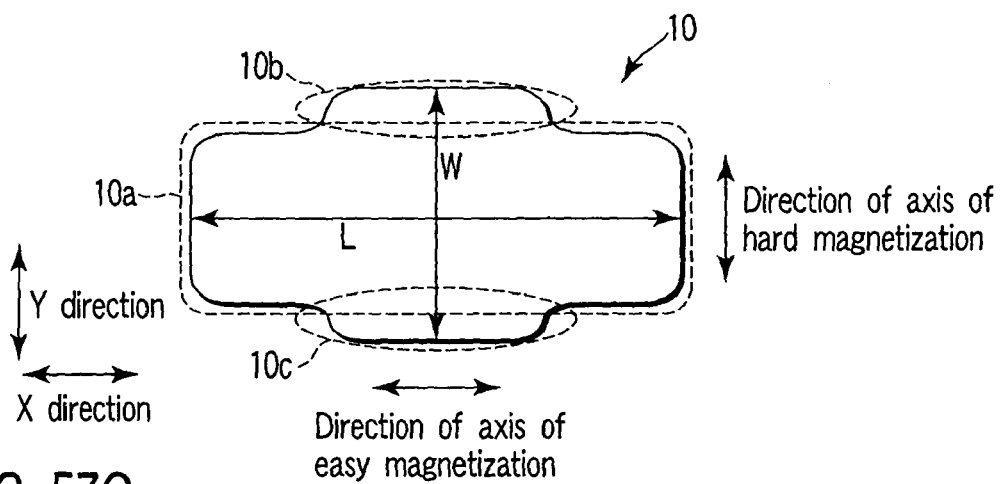
F I G. 57C

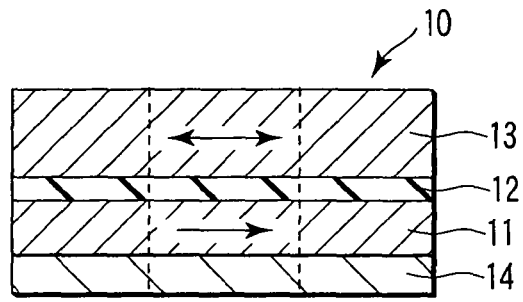
F I G. 66A
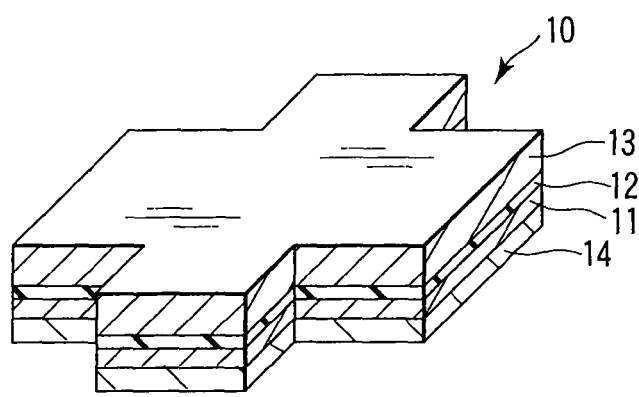
F I G. 66B
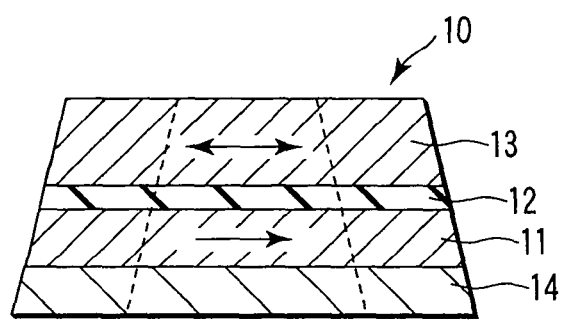
F I G. 67A
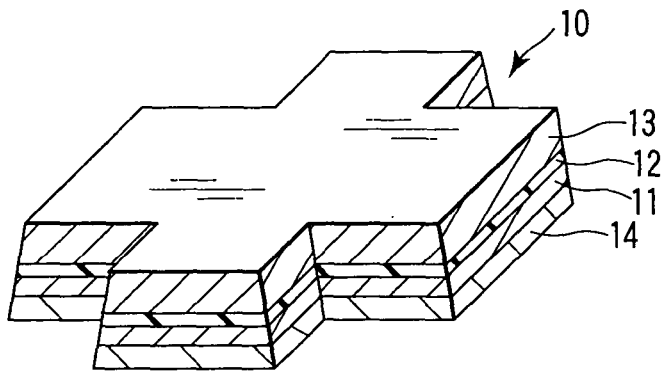
F I G. 67B

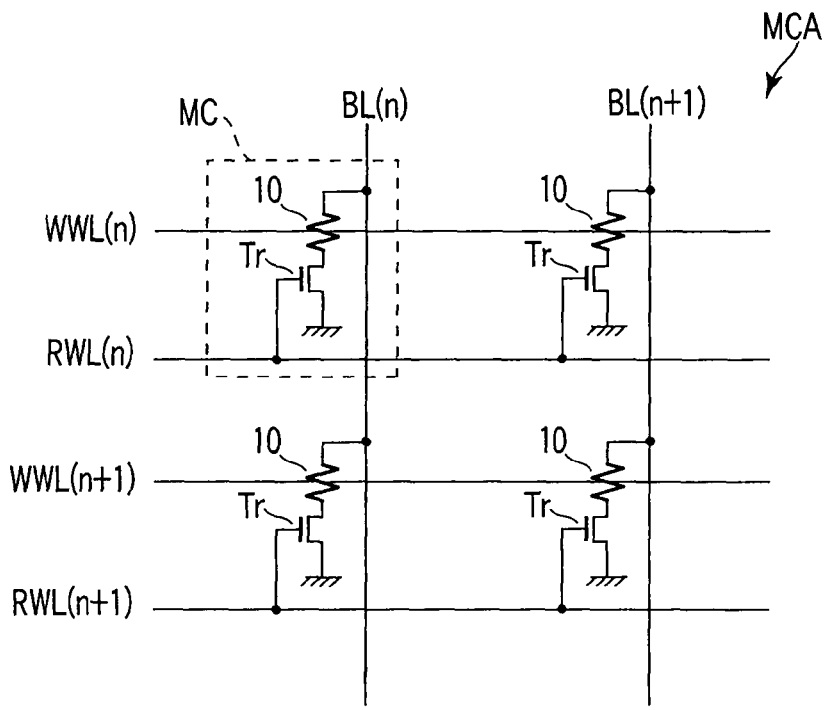
F I G. 75A
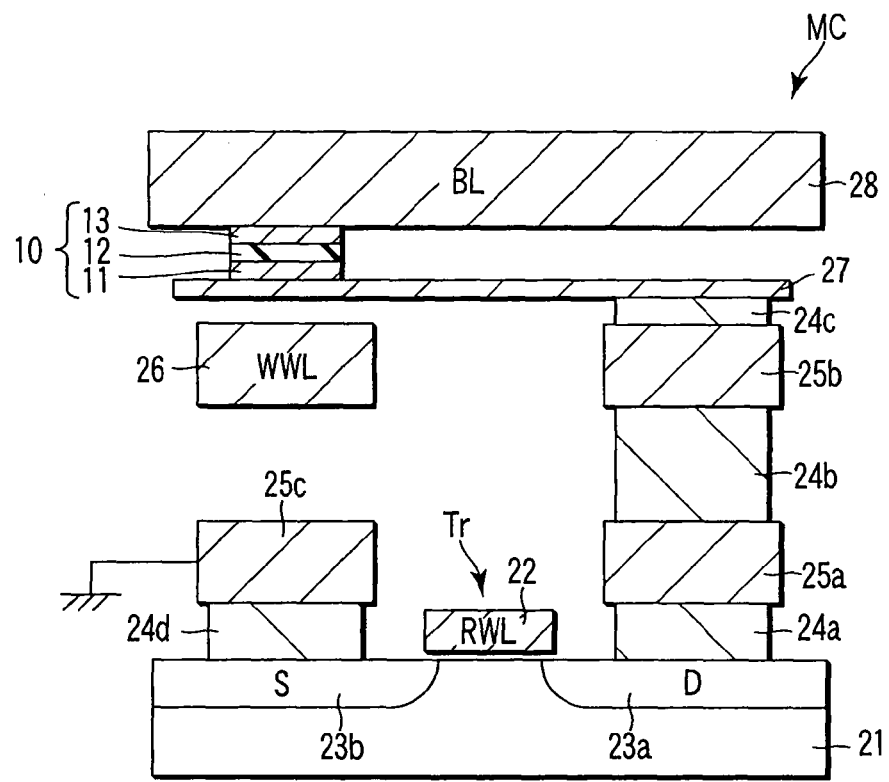
F I G. 75B

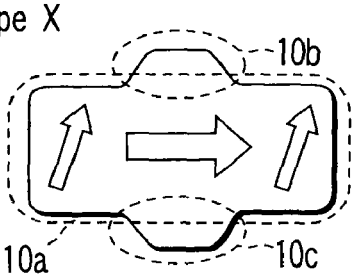
FIG. 83
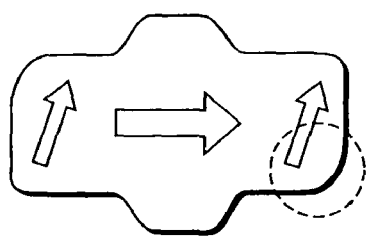 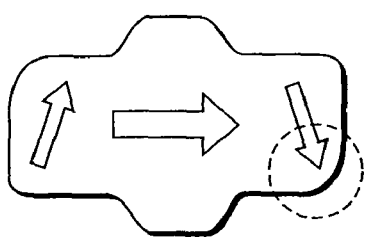
S-shaped residual domain    C-shaped residual domain
FIG. 84A                    FIG. 84B X direction (direction of axis of easy magnetization)
Y direction (direction of axis of hard magnetization)

X direction (direction of axis of easy magnetization)
Y direction (direction of axis of hard magnetization)

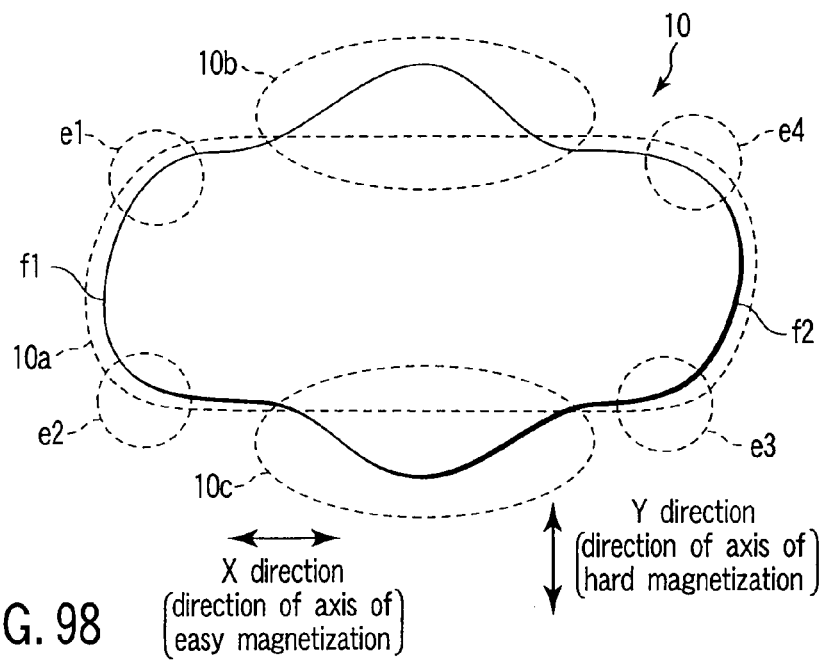
F I G. 98
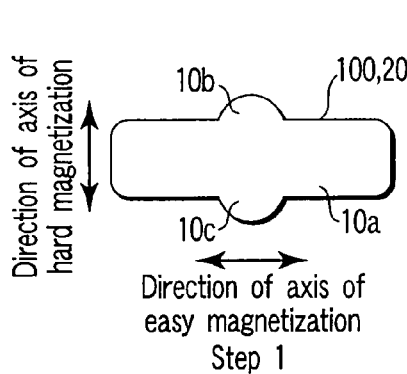
Step 1
F I G. 99A
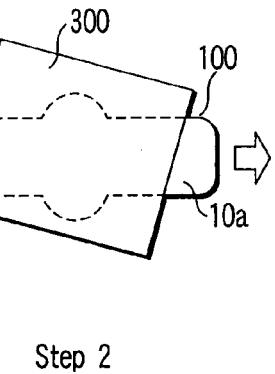
Step 2
F I G. 99B
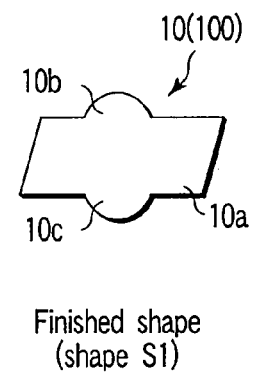
Finished shape (shape S1)
F I G. 99C
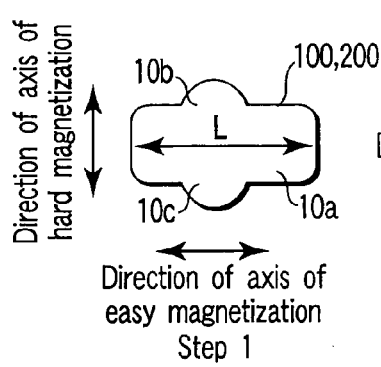
Step 1
F I G. 100A
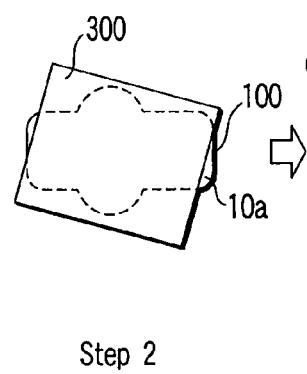
Step 2
F I G. 100B
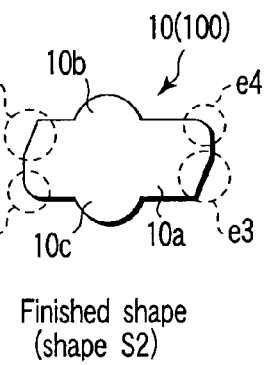
Finished shape (shape S2)
F I G. 100C

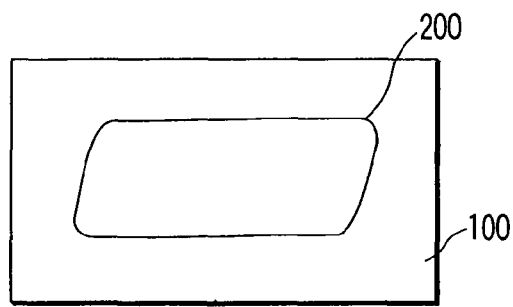
F I G. 101A
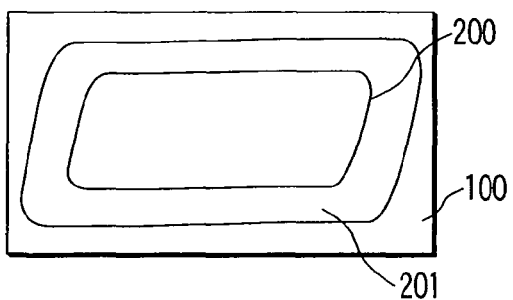
F I G. 101B
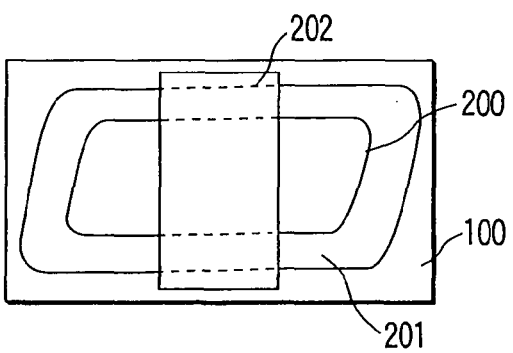
F I G. 101C
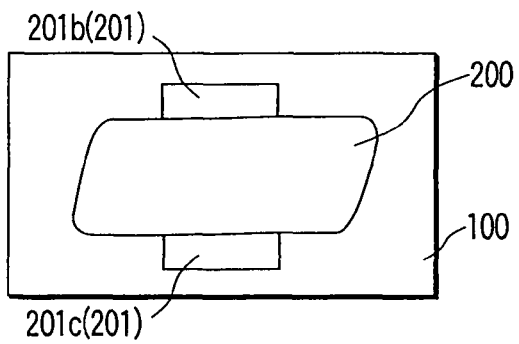
F I G. 101D
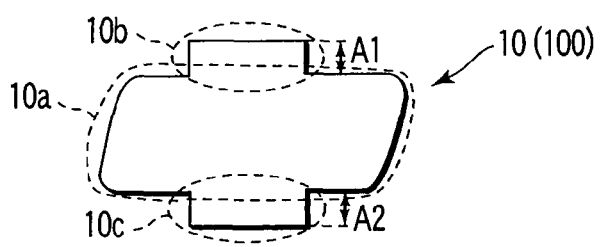
F I G. 101E

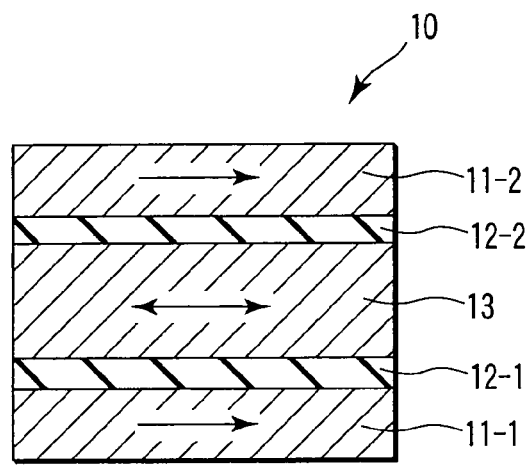
F I G. 103
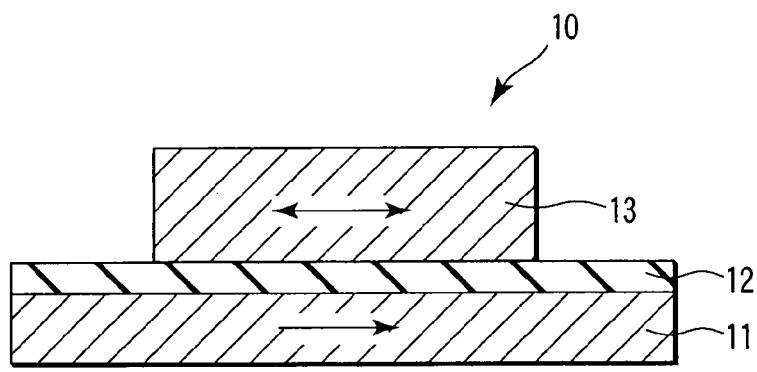
F I G. 104A
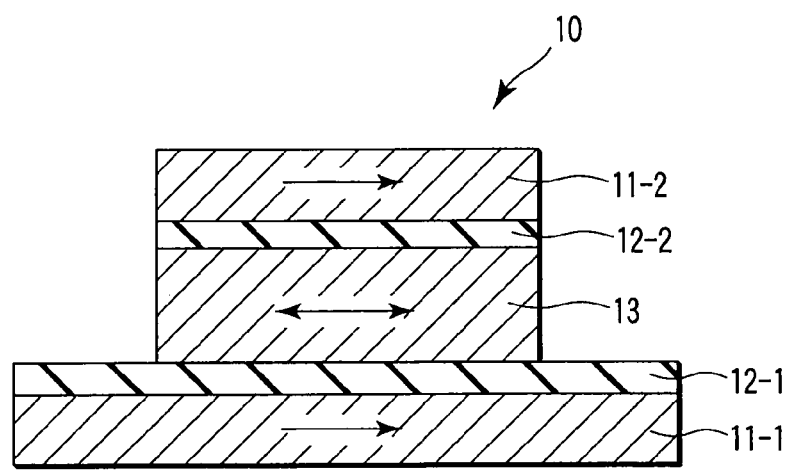
F I G. 104B

MAGNETORESISTIVE ELEMENT

CROSS-REFERENCE TO RELATED APPLICATIONS

This application is a divisional of U.S. application Ser. No. 12/019,743, filed Jan. 25, 2008, which is based upon and claims the benefit of priority under 35 U.S.C. §120 from U.S. application Ser. No. 11/245,353, filed Oct. 7, 2005, now U.S. Pat. No. 7,355,884, issued Apr. 8, 2008. This application claims the benefit of priority under U.S.C. §119 from prior Japanese Patent Applications Nos. 2004-296455, filed Oct. 8, 2004; 2004-296456, filed Oct. 8, 2004; 2005-207531, filed Jul. 15, 2005; and 2005-207628, filed Jul. 15, 2005. The entire contents of each of these documents are incorporated herein by reference.

BACKGROUND OF THE INVENTION

1. Field of the Invention

The present invention particularly relates to a switching mechanism of the magnetization state of a magnetoresistive element serving as a data storage medium of a magnetic random access memory.

2. Description of the Related Art

Various types of solid-state magnetic memories have been proposed conventionally. In recent years, magnetic random access memories using magnetic memory elements which exhibit a giant magnetoresistive effect have been proposed. As a result, the dominating magnetic memory elements presently use a ferromagnetic tunnel junction.

A ferromagnetic tunnel junction has a layered structure of, e.g., a ferromagnetic layer/insulating layer (tunnel barrier layer)/ferromagnetic layer. When a voltage is applied to the insulating layer, a tunnel current flows to the insulating layer. In this case, the junction resistance value of the ferromagnetic tunnel junction (the tunnel conductance of the insulating layer) changes in accordance with the cosine of the relative angle between the magnetizations of the two ferromagnetic layers.

The junction resistance value is minimum when the magnetizations of the two ferromagnetic layers are set in the same direction (parallel state) or maximum when the magnetizations have reverse directions (anti-parallel state).

This phenomenon is called a tunnel magnetoresistive (TMR) effect. Recent reports have revealed, e.g., that the change rate (MR ratio) of the resistance value of a magnetic tunnel junction (MTJ) element by the TMR effect is 49.7% at room temperature.

In a magnetic memory element having a ferromagnetic tunnel junction, one of two ferromagnetic layers is a reference layer (pinned layer) with a fixed magnetization state, and the other is a storage layer (free layer) whose magnetization state changes in accordance with data. When the magnetizations of the reference layer and storage layer are parallel, the state is defined as, e.g., "0", and the anti-parallel state is defined as "1".

Data is written by, e.g., applying, to the magnetic memory element, a magnetic field generated by a write current supplied to a write line and inverting the magnetization direction of the storage layer of the magnetic memory element. Data is read out by supplying a read current to the ferromagnetic tunnel junction of the magnetic memory element and detecting a change in resistance of the ferromagnetic tunnel junction caused by the TMR effect.

A magnetic memory is formed by arranging such magnetic memory elements in an array. In the actual structure, one switching transistor is connected to one magnetic memory element to enable random access to the magnetic memory elements, like, e.g., a dynamic random access memory (DRAM).

There is also proposed another technique in which a magnetic memory element formed by combining a diode and a ferromagnetic tunnel junction is arranged at the intersection between a word line and a bit line.

From the viewpoint of integration of magnetic memory elements with ferromagnetic tunnel junctions, the cell size must be small. Hence, the size of the ferromagnetic layer of the magnetic memory element inevitably decreases. Generally, the coercive force of a ferromagnetic layer increases in inverse proportion to its size.

The coercive force can be used as a measure of the magnitude of a switching field necessary for inverting magnetization. An increase in coercive force means an increase in magnitude of the switching field of the magnetic memory element.

Hence, if the size of the ferromagnetic layer is reduced by micropatterning the magnetic memory element, a large write current is necessary in the data write. This leads to an undesirable increase in power consumption.

For practical use of a bulk magnetic memory, it is therefore indispensable to simultaneously reduce the size of a magnetic memory element and the coercive force of a ferromagnetic layer used in it.

A solid-state magnetic memory must stably store data because it operates as a nonvolatile memory. There is a parameter called a thermal fluctuation constant, which can be used as a criterion for determining whether data can be stored stably for a long time. As is generally known, the thermal fluctuation constant is proportional to the volume and coercive force of the ferromagnetic layer.

When the coercive force of the ferromagnetic layer is decreased to reduce power consumption, the thermal stability degrades, and it becomes impossible to store data for a long time. That is, it is also an important challenge to realize practical use of a bulk magnetic memory having a magnetic memory element which has high thermal stability and is capable of continuously storing data for a long time.

When a magnetic memory is formed by magnetic memory elements, the shape of the magnetic memory element is often set to a rectangle.

However, as the size of the magnetic memory element decreases, a special magnetic domain called an edge domain is generated at each short-side end of the ferromagnetic layer included in the magnetic memory element, as is known.

The edge domain indicates a magnetic domain at a short-side end of a rectangular ferromagnetic layer, where magnetization rotates in a spiral shape along the short sides. An edge domain phenomenon indicates a phenomenon that the magnetization of a rectangular ferromagnetic layer rotates in a spiral shape along the short sides at the short-side ends.

The edge domain phenomenon occurs when the demagnetization energy at the short-side ends of the rectangular ferromagnetic layer is reduced. FIG. 105 shows an example of such a magnetic structure (magnetic domain). At the central portion of the magnetization region, magnetization occurs in the direction along the magnetic anisotropy, i.e., in the direction along the long sides. At the two ends, however, magnetization occurs in a direction different from the central portion, i.e., in the direction along the short sides.

Flux reversal in the magnetic memory element will be examined. When a magnetic field is applied to the rectangular ferromagnetic layer, the edge domain of the ferromagnetic layer gradually becomes large. Magnetizations in the edge domains at the two short-side ends of the ferromagnetic layer are parallel or anti-parallel to each other.

When the edge domains are directed in the same direction (parallel), a domain wall of 360° is formed, and the coercive force increases.

To solve this problem, a technique of using an elliptical ferromagnetic layer as the storage layer has been proposed (e.g., reference 1).

The edge domain is very sensitive to the shape of the ferromagnetic layer. When the storage layer has an elliptical shape, occurrence of an edge domain can be prevented, and a single domain can be implemented. The magnetization direction can uniformly be reversed throughout the ferromagnetic layer. Hence, the switching field (reversal field) can be reduced.

There is also proposed a technique of using, as the storage layer, a ferromagnetic layer of a shape such as a parallelogram shape whose short and long sides do not meet at right angles (e.g., reference 2).

In this case, an edge domain still exists though it occupies not so large area as in a rectangular layer. Since no complex small domain is generated in the process of flux reversal, flux reversal can occur almost uniformly. As a consequence, the switching field (reversal field) can be reduced.

Still another structure has been proposed in which a plurality of basic structures each including a ferromagnetic layer/nonmagnetic layer/ferromagnetic layer are stacked while keeping the rectangular shape of the ferromagnetic layer unchanged (e.g., reference 3).

In this case, when the two ferromagnetic layers stacked have different magnetic moments or thicknesses, magnetizations of the ferromagnetic layers can be directed in reverse directions by antiferromagnetic coupling. For this reason, effectively, the magnetizations cancel each other. The whole storage layer becomes equivalent to a ferromagnetic layer having small magnetization in the direction of axis of easy magnetization.

When a magnetic field is applied in a direction reverse to the direction of small magnetization in the direction of axis of easy magnetization of the storage layer, the magnetization of the storage layer reverses while maintaining antiferromagnetic coupling. Since the lines of magnetic force are closed, the influence of the demagnetizing field is small. The switching field of the storage layer is determined by the coercive force of the two ferromagnetic layers. That is, the switching field is small, and flux reversal easily occurs.

As described above, reducing the magnetic field (switching field) necessary for flux reversal in the storage layer and improving the thermal stability are indispensable factors for the magnetic memory. To implement them, various kinds of shapes and also a multilayered structure of ferromagnetic layers which are ferromagnetically coupled have been proposed until now in regard to the magnetic memory element.

However, in the ferromagnetic layer of a small magnetic memory element used in a highly integrated magnetic memory, when the length of the short side is, e.g., several μm or submicron or less, a magnetic structure (edge domain) different from that of the central portion is generated because of the influence of the demagnetizing field at the ends of the magnetization region.

In a small magnetic memory element used in a highly integrated magnetic memory, the influence of an edge domain generated at its ends is large, and the change in magnetic structure (magnetization pattern) in flux reversal is complex. As a result, the coercive force increases, and the switching field increases.

To prevent such a complex change in magnetic structure as much as possible, the edge domain is fixed (e.g., reference 4).

With this method, the behavior at the time of flux reversal can be controlled. However, the switching field cannot be reduced substantially. In addition, to fix the edge domain, another structure needs to be added, and it is inappropriate for increasing the density of magnetic memory elements.

References of the prior arts related to the present invention are as follows:

Reference 1: U.S. Pat. No. 5,757,695
Reference 2: Jpn. Pat. Appln. KOKAI Publication No. 11-273337
Reference 3: U.S. Pat. No. 5,953,248
Reference 4: U.S. Pat. No. 5,748,524
Reference 5: Jpn. Pat. Appln. KOKAI Publication No. 2004-128067
Reference 6: Jpn. Pat. Appln. KOKAI Publication No. 2004-146614
Reference 7: U.S. Pat. No. 5,640,343
Reference 8: U.S. Pat. No. 5,650,958

BRIEF SUMMARY OF THE INVENTION

According to a first aspect of the present invention, there is provided a magnetoresistive element comprising a first ferromagnetic layer having a first magnetization, the first magnetization having a first pattern when the magnetoresistive element is half-selected during a first data write, a second pattern when the magnetoresistive element is selected during a second data write, and a third pattern of residual magnetization, the first pattern being different from the second and third pattern, a second ferromagnetic layer having a second magnetization, and a nonmagnetic layer arranged between the first ferromagnetic layer and the second ferromagnetic layer and having a tunnel conductance changing dependent on a relative angle between the first magnetization and the second magnetization.

According to a second aspect of the present invention, there is provided a magnetic random access memory comprising a first write line through which a first write current flows, a second write line through which a second write current flows and crossing the first write line, a third write line crossing the first write line, a first memory cell comprising a first magnetoresistive element arranged at a intersection region between the first write line and the second write line, the first magnetoresistive element being applied with magnetic fields generated by the first write current and the second write current, and a second memory cell comprising a second magnetoresistive element arranged at a intersection region between the first write line and the third write line, the second magnetoresistive element being applied with a magnetic field generated by the first write current, and a magnetization pattern of the second magnetoresistive element during a first data write being different from a magnetization pattern of the first magnetoresistive element during a second data write.

BRIEF DESCRIPTION OF THE SEVERAL VIEWS OF THE DRAWING

FIG. 12 is a view showing Structure Example 1 of the magnetoresistive element;

FIG. 13 is a graph showing a magnetization curve in the easy-axis direction;

FIG. 14 is a view showing the asteroid curve of a cross-shaped magnetoresistive element;

FIG. 15 is a view showing the asteroid curve of a cross-shaped magnetoresistive element;

FIG. 28 is a view showing Structure Example 3 of the magnetoresistive element;

FIG. 29 is a view showing Structure Example 4 of the magnetoresistive element;

FIG. 30 is a view showing Structure Example 5 of the magnetoresistive element;

FIG. 34 is a graph showing the comparison of asteroid curve between the S-cross shape and a conventional shape;

FIG. 37 is a view showing still another example of the S-cross shape;

FIG. 38 is a view showing still another example of the S-cross shape;

FIGS. 45A, 45B, and 45C are views showing an MTJ element according to the embodiment of the present invention, in which FIG. 45A is a plan view, FIG. 45B is a sectional view, and FIG. 45C is a perspective view;

FIG. 46 is a view showing part of an asteroid curve so as to explain a write field ratio Hsw/Hc according to the embodiment of the present invention;

FIG. 47 is a view showing part of an asteroid curve so as to explain the write field ratio Hsw/Hc and write margin according to the embodiment of the present invention;

FIG. 48 is a table showing the write margin for the write field ratio Hsw/Hc according to the embodiment of the present invention;

FIG. 49 is a graph showing the relationship between the aspect ratio and Hsw/Hc according to the embodiment of the present invention;

FIGS. 57A to 57C are plan views showing the MTJ elements according to the embodiment of the present invention, which have round corners;

FIGS. 66A and 66B are views showing the MTJ element according to the embodiment of the present invention, which has continuously matching side surfaces, in which FIG. 66A is a sectional view, and FIG. 66B is a perspective view;

FIGS. 67A and 67B are views showing the MTJ element according to the embodiment of the present invention, which has a trapezoidal section and continuously matching side surfaces, in which FIG. 67A is a sectional view, and FIG. 67B is a perspective view;

FIGS. 68A and 68B are views showing the MTJ element according to the embodiment of the present invention, which has partially discontinuous side surfaces, in which FIG. 68A is a sectional view, and FIG. 68B is a perspective view;

FIGS. 69A and 69B are sectional views showing the tunnel junction structure of the MTJ element according to the embodiment of the present invention, in which FIG. 69A is a sectional view of a single tunnel junction structure, and FIG. 69B is a sectional view of a double tunnel junction structure;

FIGS. 75A and 75B are views showing select transistor memory cells of a magnetic random access memory according to an embodiment of the present invention, in which FIG. 75A is a circuit diagram showing a memory cell array, and FIG. 75B is a sectional view showing one cell;

FIGS. 76A and 76B are views showing select diode memory cells of a magnetic random access memory according to an embodiment of the present invention, in which FIG. 76A is a circuit diagram showing a memory cell array, and FIG. 76B is a sectional view showing one cell;

FIGS. 77A and 77B are views showing cross-point memory cells of a magnetic random access memory according to an embodiment of the present invention, in which FIG. 77A is a circuit diagram showing a memory cell array, and FIG. 77B is a sectional view showing one cell;

FIG. 83 is a table showing residual domain states possible for the shape X according to Example 1 of the present invention and domain states obtained by applying a magnetic field in the easy-axis direction;

FIGS. 84A and 84B are schematic views showing cases wherein an S-shaped residual domain state and a C-shaped residual domain state are assumed in the shape S according to Example 1 of the present invention;

FIG. 98 is a plan view showing another MTJ element according to Example 9 of the present invention;

FIGS. 99A to 99C are plan views showing steps in manufacturing the MTJ element according to Example 1 of the present invention;

FIGS. 100A to 100C are plan views showing steps in manufacturing the MTJ element according to Example 2 of the present invention;

FIGS. 101A to 101E are plan views showing steps in manufacturing the MTJ element according to Example 3 of the present invention;

FIG. 103 is a sectional view showing an MTJ element according to the embodiment of the present invention, which has a double tunnel junction structure;

FIGS. 104A and 104B are sectional views showing MTJ elements according to the embodiment of the present invention, which have convex sectional shapes.

DETAILED DESCRIPTION OF THE INVENTION

Figure 1:
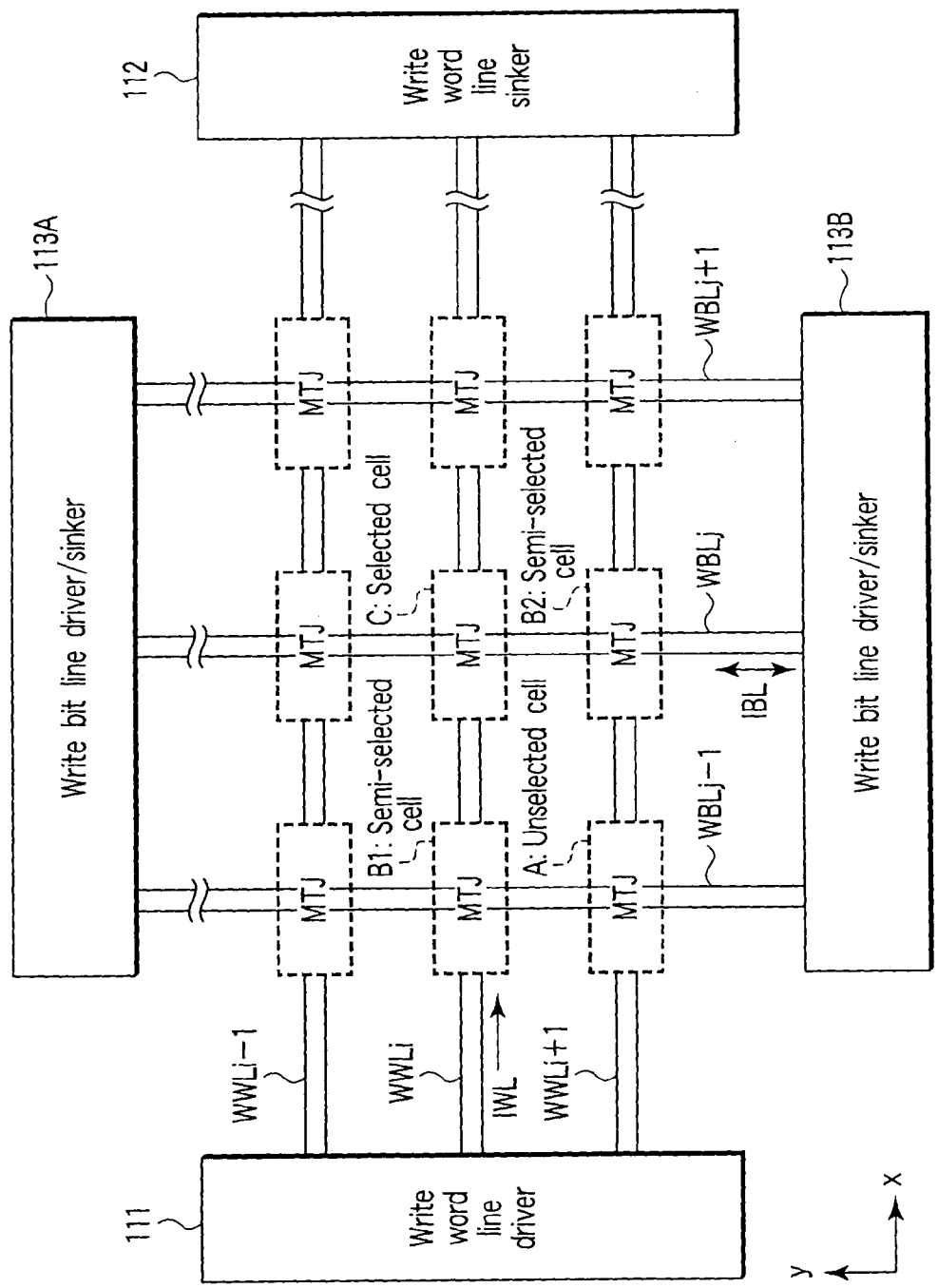
FIG. 1 is a view showing a magnetic random access memory according to an embodiment of the present invention.

The best mode for carrying out the present invention will be described below in detail with reference to the accompanying drawing.

1. Outline

In a switching mechanism (flux reversing method) according to an embodiment of the present invention, the magnetic structure (magnetization pattern) of a magnetoresistive element is controlled before/after and during a data write to reduce the switching field necessary for the data write, improve the write disturbance, and implement a thermally stable magnetic structure.

In a two-axis write, a magnetoresistive element is arranged at the intersection between two write lines crossing each other. When a magnetic field generated by a write current flowing to one of the two write lines is applied to the magnetoresistive element (half-selected state), the magnetic structure of the magnetoresistive element hardly causes flux reversal.

When a magnetic field generated by write currents flowing to the two write lines is applied to the magnetoresistive element (selected state), the magnetic structure of the magnetoresistive element easily causes flux reversal.

The magnetic structure that is easy or hard to cause flux reversal is implemented depending on the manner the magnetic field is applied to the magnetoresistive element, and the structure, material, layer thickness, shape, and magnetic anisotropy of the magnetoresistive element.

According to the embodiment of the present invention, all magnetoresistive elements included in a memory cell array have the same structure, material, layer thickness, shape, and magnetic anisotropy. However, the magnetic structure (magnetization pattern) during the data write changes between the selected state wherein the magnetic field generated by the write currents flowing to the two write lines is applied to the magnetoresistive element, and the half-selected state wherein the magnetic field generated by the write current flowing to one of the write lines is applied to the magnetoresistive element.

As for, e.g., the residual magnetization of the magnetoresistive element, i.e., the magnetization pattern of the magnetoresistive element before the data write, the structure, material, layer thickness, shape, and magnetic anisotropy of the magnetoresistive element are determined such that an S-shaped domain is formed. The S-shaped domain has the magnetization in the shape of S word.

In the half-selected state, for example, when the magnetic field generated by the write current is applied to the magnetoresistive element, magnetization at the central portion is directed in the hard-axis direction, and two C-shaped domains are generated in the element. In the C-shaped domain, the energy stored in the element increases, and the magnetic field necessary for flux reversal is large. Hence, the magnetic structure is actually hard to cause flux reversal. The C-shaped domain has the magnetization in the shape of C word.

In the selected state, for example, the synthetic field generated by the write currents flowing to the two write lines is applied to the magnetoresistive element. For this reason, no C-shaped domain is generated in the element, and flux reversal from the S-shaped domain occurs as usual. That is, since the energy stored in the magnetoresistive element in the selected sate is small, flux reversal can easily be caused by a small magnetic field, i.e., a small current.

As described above, in the magnetic random access memory according to the embodiment of the present invention, the magnetic structure (magnetization pattern) during the data write changes between the magnetoresistive element in the selected state and that in the half-selected state.

With this arrangement, any write disturbance in the magnetoresistive element in the half-selected state can be avoided. In addition, in the magnetoresistive element to which the synthetic field by the write currents flowing to the two write lines is applied, low power consumption can be realized because the switching field (reversal field) is small. In the remaining magnetoresistive elements, the thermal stability increases because of a large switching field (reversal field) so that the characteristic as a nonvolatile memory improves.

2. Embodiment

A most preferred embodiment will be described below.

(1) Magnetization State Switching Mechanism

FIG. 1 shows main parts of a magnetic random access memory to which a magnetization state switching mechanism according to the embodiment of the present invention is applied.

MTJ elements MTJ are arranged in an array. The shape of the MTJ element MTJ is not particularly limited in executing the magnetization state switching mechanism according to the embodiment of the present invention. This is because the magnetic structure that is easy or hard to cause flux reversal can be controlled by the manner a magnetic field is applied to the magnetoresistive element, and the structure, material, layer thickness, shape, and magnetic anisotropy of the magnetoresistive element.

Write word lines WWLi−1, WWLi, and WWLi+1 running in the x direction are arranged under the MTJ elements MTJ. A write word line driver 111 is connected to one end of each of the write word lines WWLi−1, WWLi, and WWLi+1. A write word line sinker 112 is connected to the other end.

Write bit lines WBLj−1, WBLj, and WBLj+1 running in the y direction are arranged above the MTJ elements MTJ. A write bit line driver/sinker 113A is connected to one end of each of the write bit lines WBLj−1, WBLj, and WBLj+1. A write bit line driver/sinker 113B is connected to the other end.

The embodiment of the present invention is related to the switching mechanism of the magnetization state of the magnetoresistive element. A circuit for a data read is not illustrated in the memory shown in FIG. 1.

As a characteristic feature of the magnetization state switching mechanism according to the embodiment of the present invention, the magnetization state during the write changes between a magnetoresistive element (selected cell) as a write target in the selected state and a magnetoresistive element (half-selected cell) as a non-write target in the half-selected state, as shown in, e.g., Table 1.

TABLE 1

|  | Selected Cell (C) | Semi-Selected Cell (B1, B2) |
|---|---|---|
| Magnetization State Before Write (Residual Magnetization) | S | S |
| Magnetization State During Write | Reversing | C |
| Magnetization State After Write (Residual Magnetization) | S | S |

S: S-Shaped Domain
C: C-Shaped Domain

As for the magnetization state (residual magnetization) before and after the data write, all memory cells including a selected cell (C) and half-selected cells (B1 and B2) have the same state, i.e., a magnetic structure (magnetization pattern) to form an S-shaped domain. To the contrary, as the magnetization state (residual magnetization) during the data write, the half-selected cells (B1 and B2) have a magnetic structure (magnetization pattern) to form a C-shaped domain.

The magnetic structure of the magnetoresistive element in the data write will be described below in detail.

Figure 2:
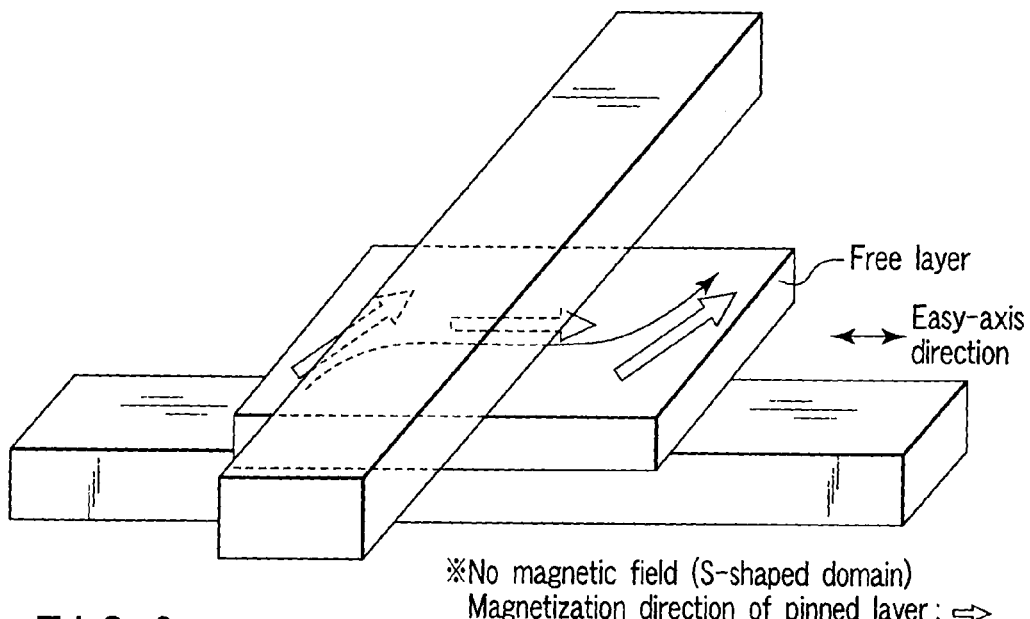
FIG. 2 is a perspective view showing a magnetization state switching mechanism according to the embodiment of the present invention.
Figure 3:
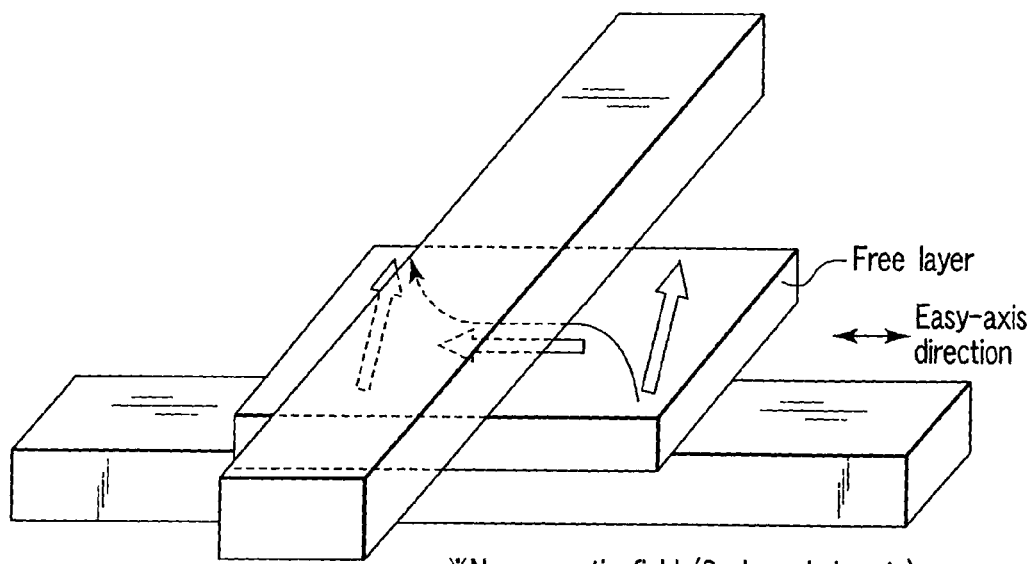
FIG. 3 is a perspective view showing the magnetization state switching mechanism according to the embodiment of the present invention.

As shown in FIGS. 2 and 3, the magnetization state (residual magnetization) before the data write forms an S-shaped domain. When the magnetization direction at the central portion of the free layer and that of the pinned layer are parallel, "0"-data is stored (FIG. 2). When the magnetization direction at the central portion of the free layer and that of the pinned layer are anti-parallel, "1"-data is stored (FIG. 3).

Magnetizations at the two easy-axis direction ends of the magnetoresistive element spirally rotate along the sides. For this reason, the magnetic structure (magnetization pattern) of the magnetoresistive element (the free layer) as a whole forms an S-shaped domain.

When a write current IWL is supplied to the write word line WWLi, and a write current IBL is supplied to the write bit line WBLj, a magnetic field Hy is generated by the write current IWL, and a magnetic field Hx is generated by the write current IBL.

Figure 4:
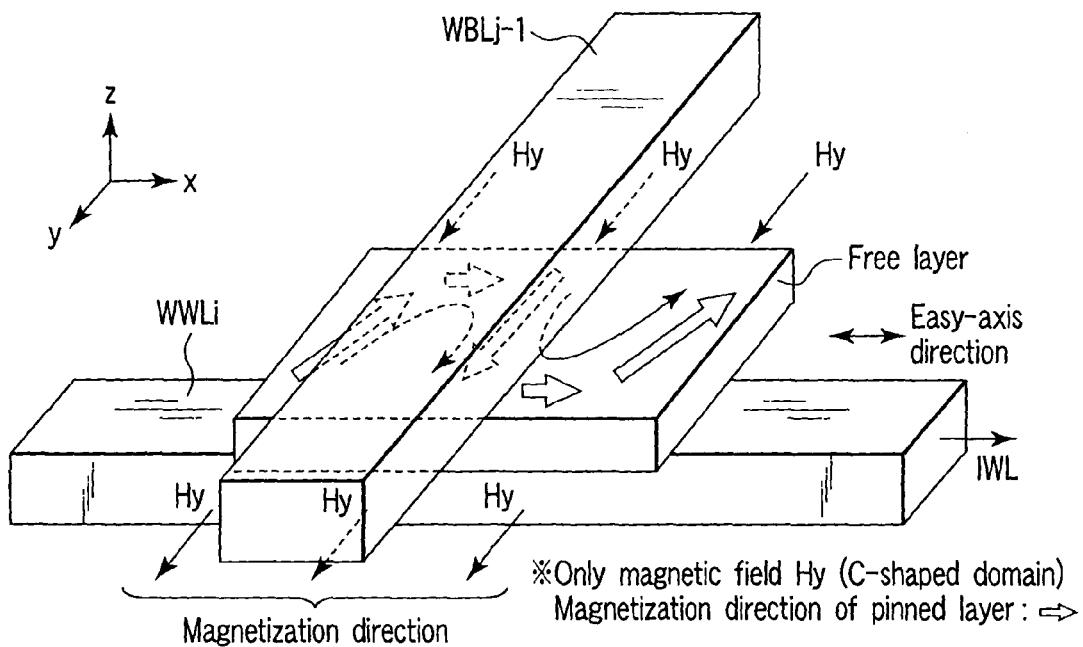
FIG. 4 is a perspective view showing the magnetization state switching mechanism according to the embodiment of the present invention.
Figure 5:
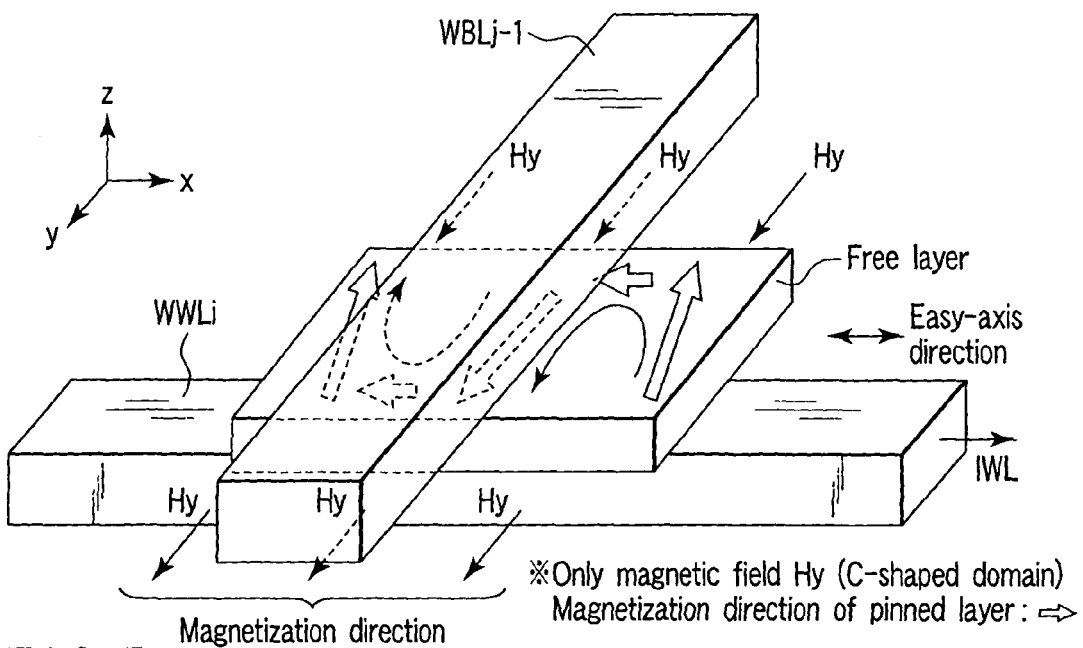
FIG. 5 is a perspective view showing the magnetization state switching mechanism according to the embodiment of the present invention.

As shown in FIGS. 4 and 5, only the magnetic field Hy generated by the write current IWL is applied to the half-selected cell B1. Hence, the magnetization at the central portion is directed in the same direction as the magnetic field Hy, i.e., in the y direction. As a result, the magnetic structure (magnetization pattern) of the magnetoresistive element (the free layer) forms two C-shaped domains.

The asteroid curve of the half-selected cell B1 has a shape different from those of an unselected cell A and the selected cell C. Since the value of the switching field (reversal field) increases, the half-selected cell B1 has a structure hard to cause flux reversal.

Figure 6:
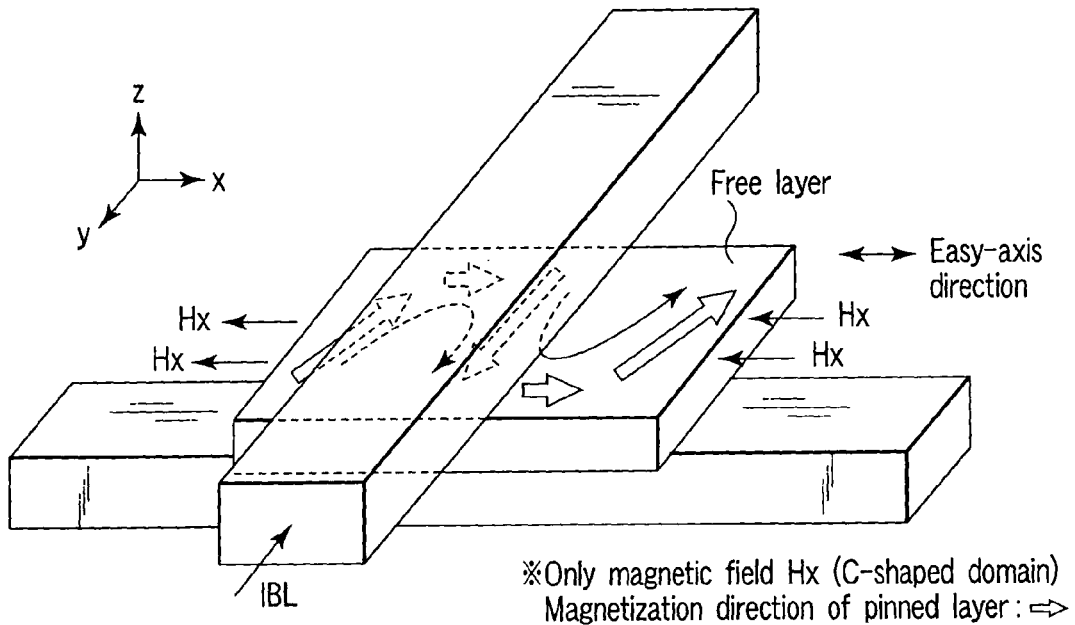
FIG. 6 is a perspective view showing the magnetization state switching mechanism according to the embodiment of the present invention.
Figure 7:
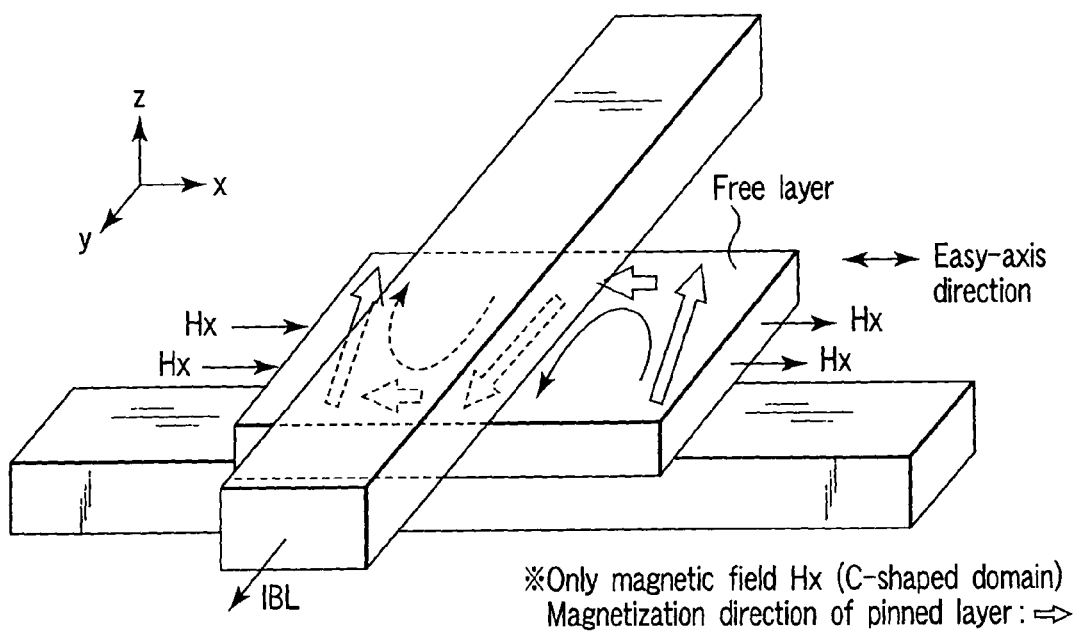
FIG. 7 is a perspective view showing the magnetization state switching mechanism according to the embodiment of the present invention.

As shown in FIGS. 6 and 7, only the magnetic field Hx generated by the write current IBL is applied to the half-selected cell B2. Hence, the magnetization at the central portion is directed in the y direction. As a result, the magnetic structure (magnetization pattern) of the magnetoresistive element (the free layer) forms two C-shaped domains.

The magnetization pattern of the half-selected cell B2 is generated when the direction of the applied current field is reverse to the direction of residual magnetization of the storage layer. When the direction of the applied current field is the same as the direction of residual magnetization of the storage layer, this magnetization pattern is not generated. That is, the magnetization patterns shown in FIGS. 6 and 7 indicate examples when the direction of the applied current field is reverse to the direction of residual magnetization of the storage layer.

The asteroid curve of the half-selected cell B2 has a shape different from those of the unselected cell A and selected cell C. Since the value of the switching field (reversal field) increases, the half-selected cell B2 also has a structure hard to cause flux reversal.

Figure 8:
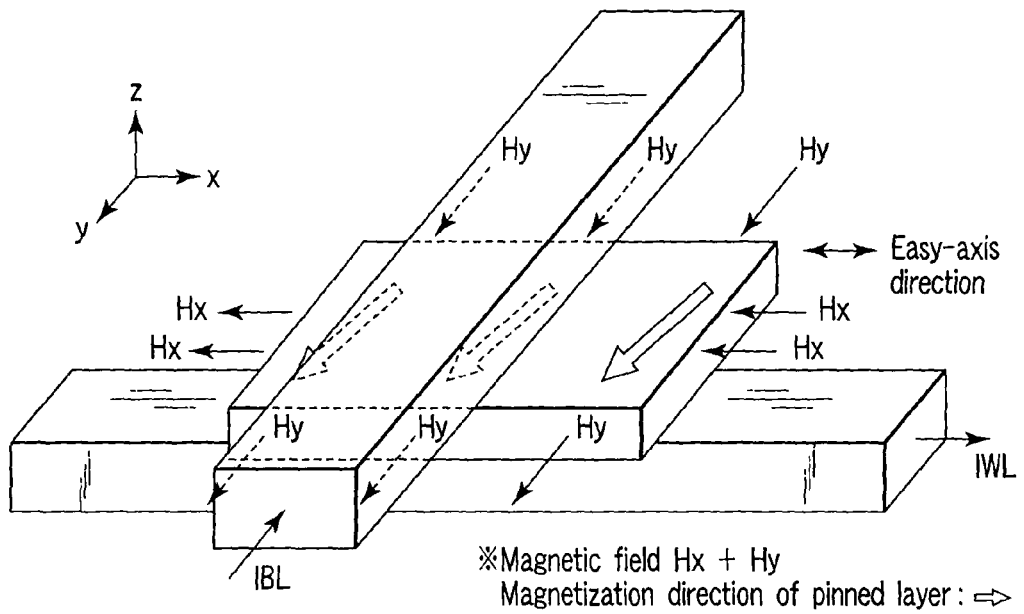
FIG. 8 is a perspective view showing the magnetization state switching mechanism according to the embodiment of the present invention.
Figure 10:
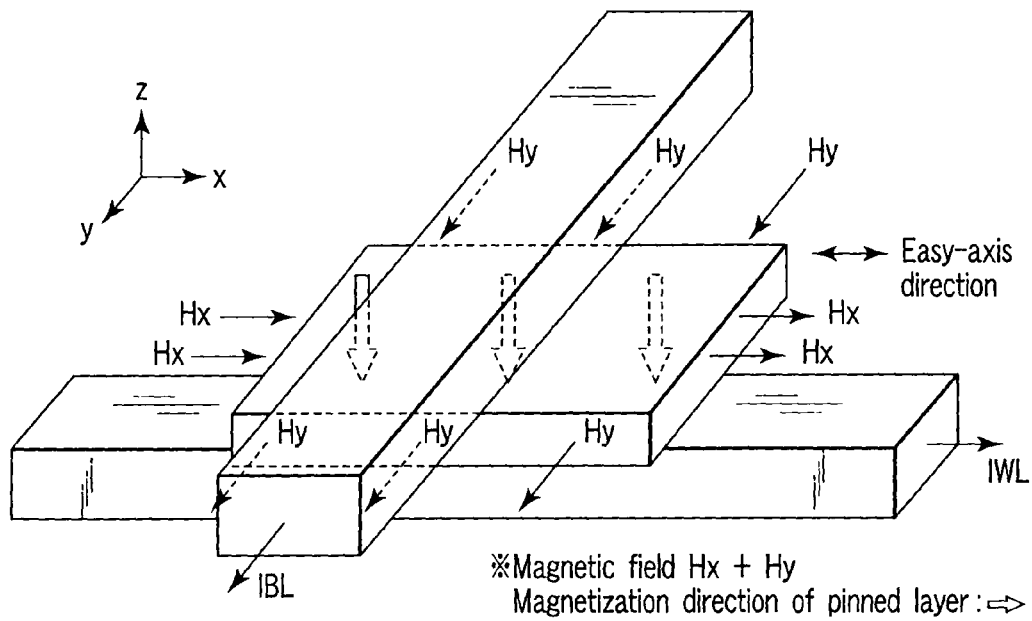
FIG. 10 is a perspective view showing the magnetization state switching mechanism according to the embodiment of the present invention.

To the contrary, as shown in FIGS. 8 and 10, the synthetic field of the magnetic field Hy generated by the write current IWL and the magnetic field Hx generated by the write current IBL is applied to the selected cell C. For this reason, the S-shaped domain does not change to the C-shaped domains. Flux reversal directly occurs from the S-shaped domain.

Since the switching field (reversal field) of the selected cell C remains small, it has a structure easy to cause flux reversal by a small write current.

Figure 9:
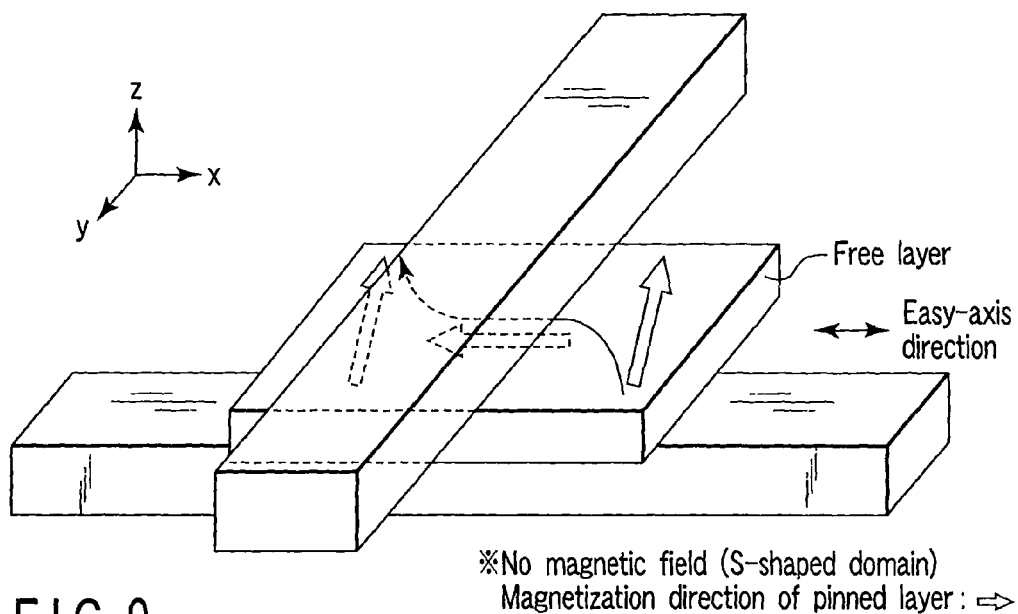
FIG. 9 is a perspective view showing the magnetization state switching mechanism according to the embodiment of the present invention.
Figure 11:
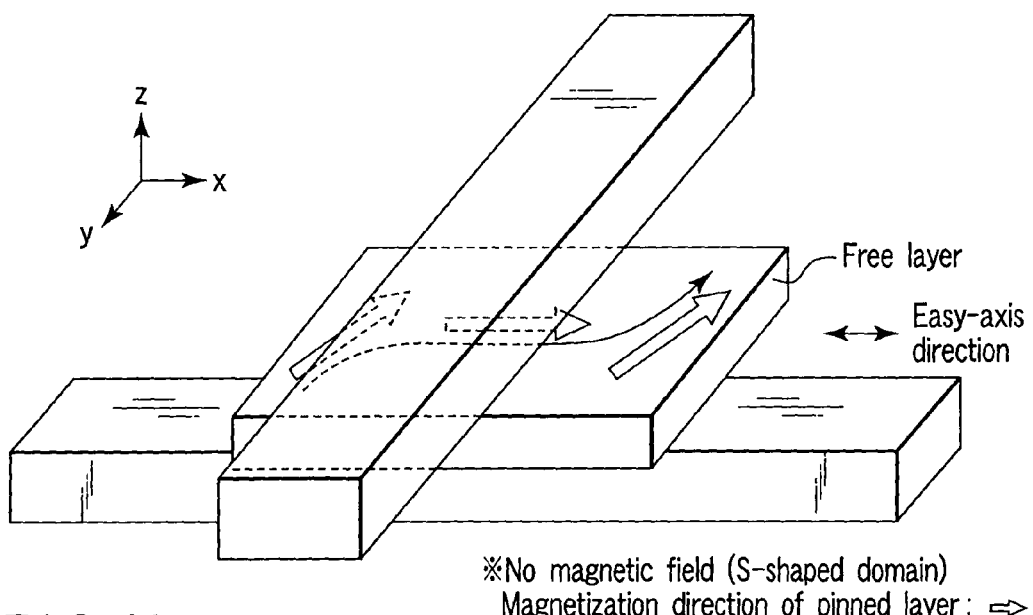
FIG. 11 is a perspective view showing the magnetization state switching mechanism according to the embodiment of the present invention.

The magnetization state (residual magnetization) after the data write forms an S-shaped domain, as shown in FIGS. 9 and 11.

(2) Structure Examples of Magnetoresistive Element

Structure examples of the magnetic random access memory to execute the magnetization state switching mechanism according to the embodiment of the present invention will be described next.

A. Structure Example 1

FIG. 12 shows Structure Example 1 of the magnetoresistive element.

The magnetoresistive element has a cross shape and is long in the easy-axis direction. All the corners of the cross shape are round. Small triangles in FIG. 12 indicate magnetization directions.

The width (the width in the hard-axis direction) of the magnetoresistive element is set to, e.g., about 0.50 μm (maximum value) at the central portion and about 0.26 μm at each end in the easy-axis direction. Although the width of the magnetoresistive element is not limited to this example, the maximum value is preferably 1 μm or less in consideration of integration of elements.

The length (the maximum length in the easy-axis direction) of the magnetoresistive element is set to, e.g., about 0.8 μm. The thickness of the magnetoresistive element is set to, e.g., about 5 nm. The length and thickness of the magnetoresistive element are not limited to this example, either.

The length of the magnetoresistive element is preferably set within the range of, e.g., one to ten times (8/5 times in this example) the maximum value of the width of the magnetoresistive element. The thickness of the magnetoresistive element is preferably, e.g., 3 to 50 nm (both inclusive). The magnetoresistive element is especially required to be as small as possible for integration.

In this example, $Co_9Fe$ is assumed as the material of the ferromagnetic layer of the magnetoresistive element. However, the material is not limited to this. For example, Fe, Co, Ni, a layered structure of these metals, or an alloy containing these metals can be used. The magnetoresistive element may include a layer made of a nonmagnetic metal material such as Cu, Au, Ru, or Al.

FIG. 13 shows a magnetization curve in the easy-axis direction which is calculated by simulations on the basis of the magnetoresistive element shown in FIG. 12.

The solid curve is the magnetization curve in the easy-axis direction. Each rhombic symbol indicates residual magnetization, i.e., a magnetization state in the zero field after a write by applying a magnetic field. As shown in FIG. 13, the coercive force in the easy-axis direction is 132 Oe.

As is apparent from FIG. 13, when the magnetoresistive element shown in FIG. 12 is used, sharp switching (flux reversal) can occur. More specifically, since no small magnetic domain with a complex shape is generated in the process of flux reversal, no intermediate magnetization state between the "0" state and the "1" state occurs.

FIGS. 14 and 15 show the asteroid curve of the magnetoresistive element shown in FIG. 12. An asteroid curve obtained by connecting rhombic symbols in FIG. 14 plots the switching field of the magnetoresistive element in FIG. 12. An asteroid curve obtained by connecting rhombic symbols in FIG. 15 corresponds to the asteroid curve in FIG. 14, which is normalized by the coercive force in the easy-axis direction. The solid line in FIG. 15 indicates the ideal shape of the asteroid curve.

Figure 16:
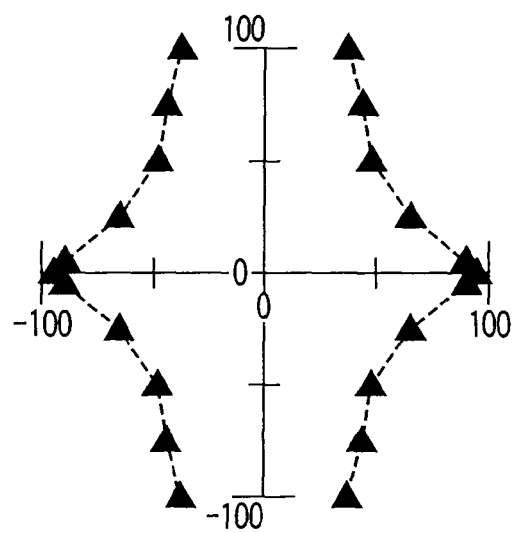
FIG. 16 is a view showing the asteroid curve of a rectangular magnetoresistive element.
Figure 17:
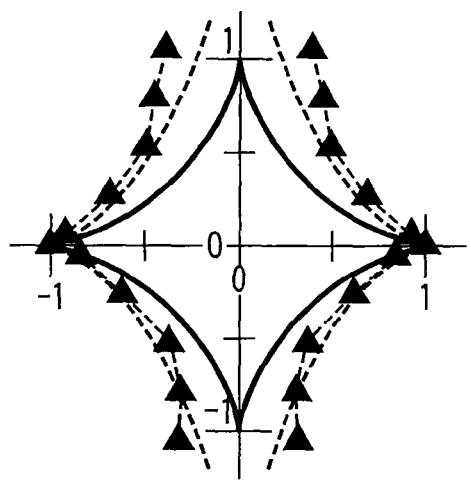
FIG. 17 is a view showing the asteroid curve of a rectangular magnetoresistive element.

FIG. 16 corresponding to FIG. 14 shows the asteroid curve (a curve obtained by connecting the triangular symbols) of a rectangular magnetoresistive element. FIG. 17 corresponding to FIG. 15 shows the asteroid curve in FIG. 16, which is normalized by the coercive force in the easy-axis direction. The solid line in FIG. 17 also indicates the ideal shape of the asteroid curve.

As can be seen from comparison between FIGS. 15 and 17, an almost ideal asteroid curve can be obtained by the cross-shaped magnetoresistive element (FIG. 12) to execute the magnetization state switching mechanism according to the embodiment of the present invention. However, the asteroid curve of the rectangular magnetoresistive element is different from the ideal shape.

Since the switching field of the cross-shaped magnetoresistive element decreases to about ½ that of the rectangular magnetoresistive element, flux reversal can be caused by a small switching field.

However, the possibility of flux reversal by a small switching field also means that flux reversal (write error) readily occurs in a half-selected magnetoresistive element.

For example, when the magnetization state switching mechanism according to the embodiment of the present invention is applied to the data write in the cross-shaped magnetoresistive element, a thermally stable magnetic structure can be implemented without any degradation in write disturbance even when the switching field is reduced.

FIGS. 18 to 22 show magnetic structures (magnetization patterns) before/after and during the data write when the magnetization state switching mechanism according to the embodiment of the present invention is executed for the magnetoresistive element shown in FIG. 12.

Figure 18:
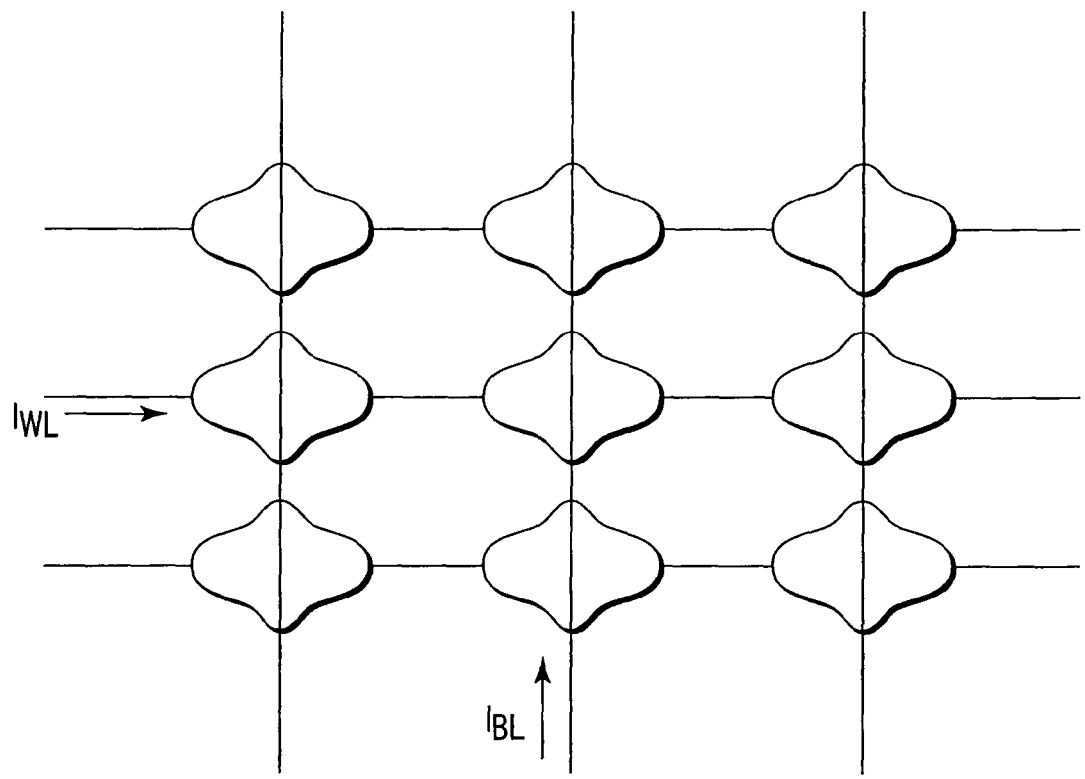
FIG. 18 is a view showing a memory cell array including the magnetoresistive element shown in FIG. 12.

FIG. 18 shows a state of a memory cell array using the magnetoresistive element shown in FIG. 12.

Figure 19:
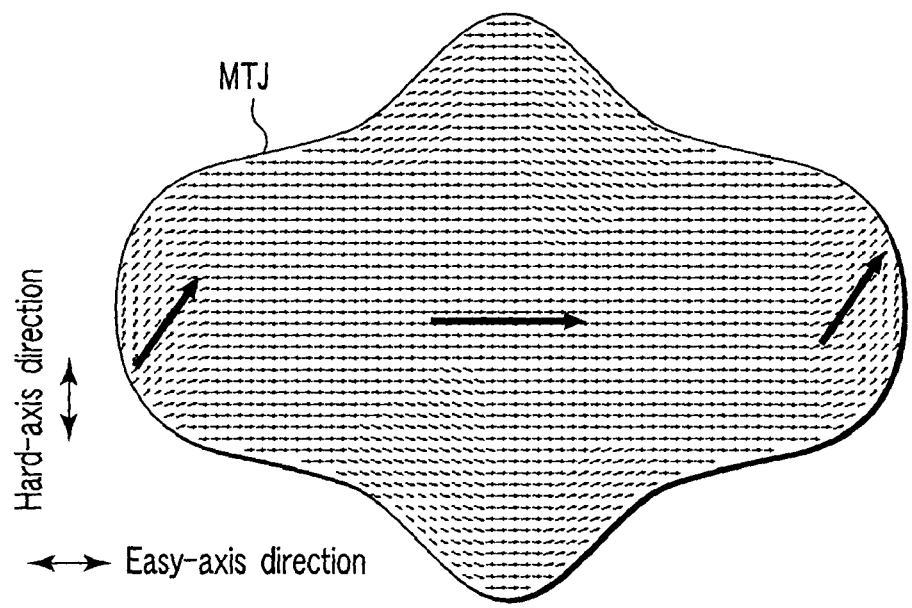
FIG. 19 is a view showing the switching mechanism of the magnetization state of the magnetoresistive element shown in FIG. 12.

As shown in FIG. 19, when no magnetic field is applied before the data write, the magnetic structure (residual magnetization) of the magnetoresistive element forms the S-shaped domain. This applies to all magnetoresistive elements included in the memory cell array shown in FIG. 18.

Figure 20:
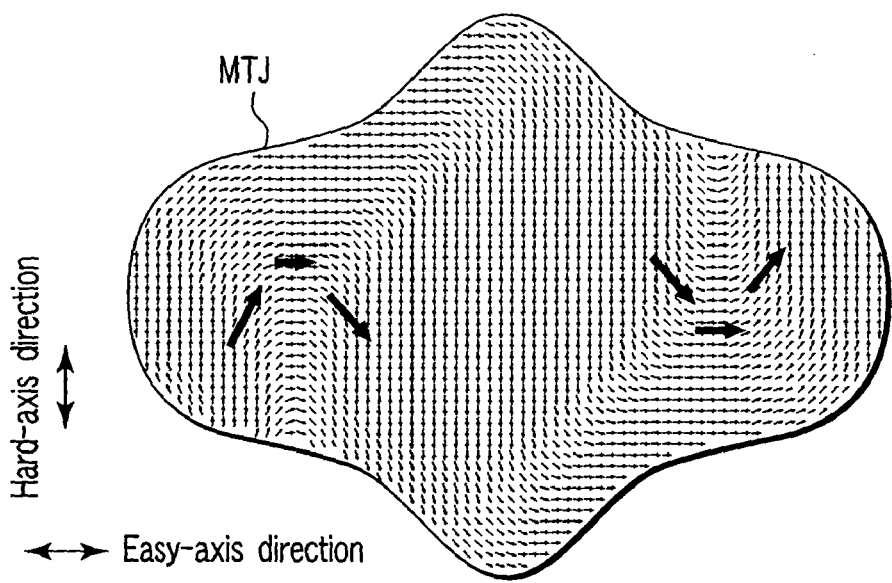
FIG. 20 is a view showing the switching mechanism of the magnetization state of the magnetoresistive element shown in FIG. 12.

When the data write is executed, during the data write, the magnetic structure of a magnetoresistive element (half-selected cell), to which only the magnetic field generated by the write current flowing to one write line is applied, changes from the S-shaped domain to the C-shaped domain, as shown in FIG. 20.

More specifically, magnetization (an aggregate of small triangles) at the central portion of the magnetoresistive element is directed in the hard-axis direction. Magnetization (an aggregate of small triangles) at each end is directed in the reverse direction. For this reason, C-shaped domains (two C-shaped domains in total) are generated in the left half and right half of the magnetoresistive element, as indicated by large arrows. The magnetic structure (magnetization pattern) is hard to cause flux reversal.

Figure 21:
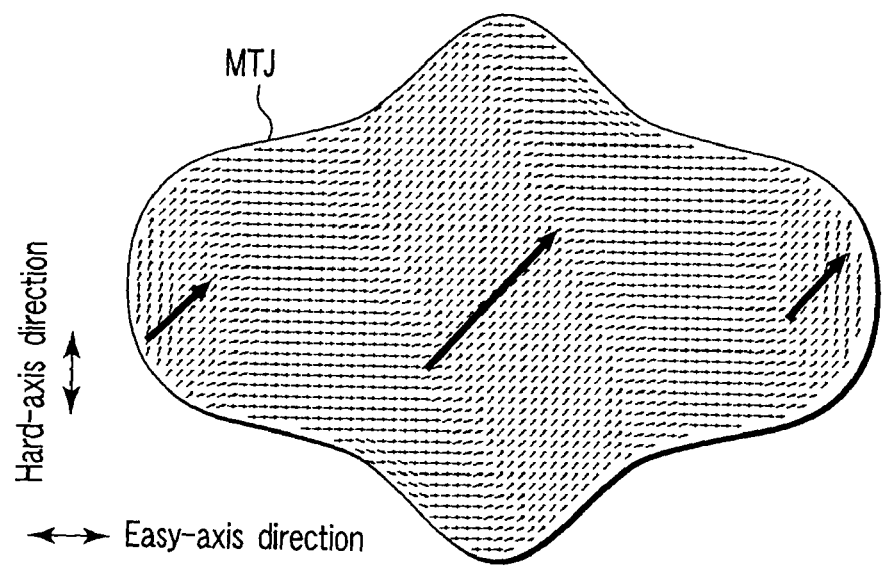
FIG. 21 is a view showing the switching mechanism of the magnetization state of the magnetoresistive element shown in FIG. 12.
Figure 22:
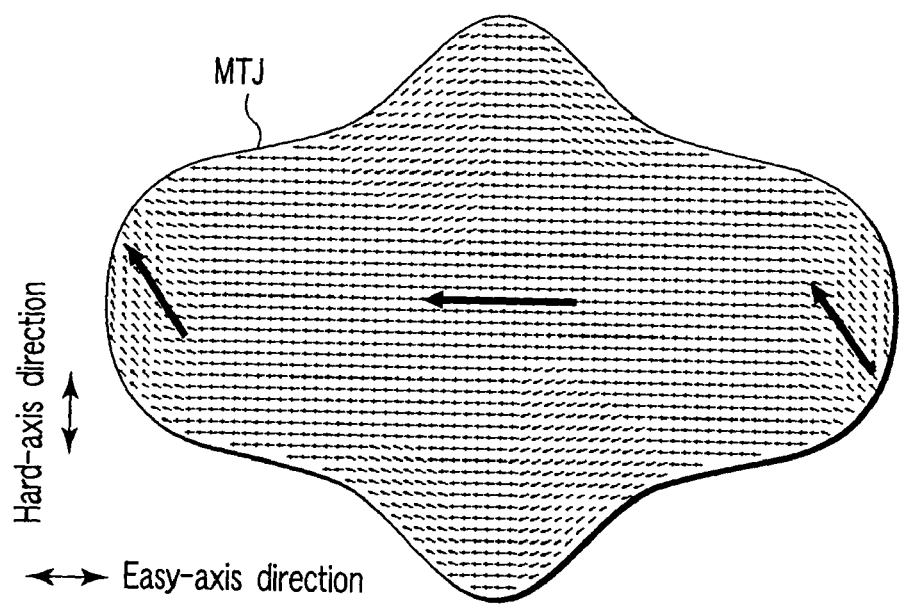
FIG. 22 is a view showing the switching mechanism of the magnetization state of the magnetoresistive element shown in FIG. 12.

As shown in FIG. 21, during the data write, the magnetic structure of a magnetoresistive element (selected cell), to which the magnetic field generated by the write currents flowing to two write lines is applied, is reversed from the S-shaped domain. The magnetization direction is reversed finally, as shown in FIG. 22.

As is apparent from FIGS. 20 and 21, the magnetic structure of the selected cell during the data write is different from that of the half-selected cell. The switching field (reversal field) at the time of flux reversal from the C-shaped domain is much larger than that at the time of flux reversal from the S-shaped domain. For this reason, the write selectivity improves, and any write error in the half-selected cell can be prevented. Additionally, the thermal agitation resistance can also be increased.

B. Structure Example 2

Figure 23:
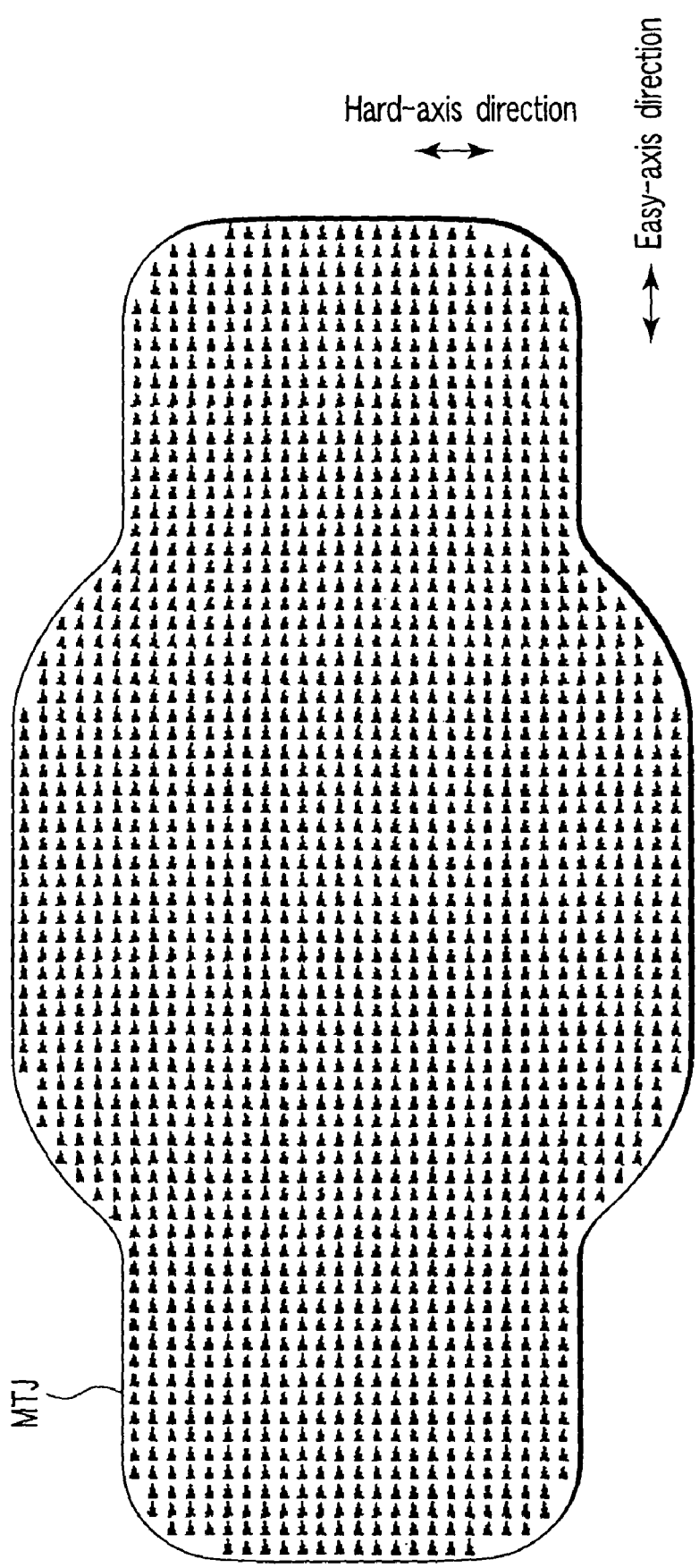
FIG. 23 is a view showing Structure Example 2 of the magnetoresistive element.

FIG. 23 shows Structure Example 2 of the magnetoresistive element.

The magnetoresistive element has a cross shape and is long in the easy-axis direction. All the corners of the cross shape are round. Small triangles in FIG. 23 indicate magnetization directions.

This magnetoresistive element is different from Structure Example 1 in that the size in the easy-axis direction is larger. That is, the ratio of the maximum value of the length in the easy-axis direction to the maximum value of the width in the hard-axis direction is higher than in Structure Example 1.

The width (the width in the hard-axis direction) of the magnetoresistive element is set to, e.g., about 0.50 µm (maximum value) at the central portion and about 0.26 µm at each end in the easy-axis direction. Although the width of the magnetoresistive element is not limited to this example, the maximum value is preferably 1 µm or less in consideration of integration of elements.

The length (the maximum length in the easy-axis direction) of the magnetoresistive element is set to, e.g., about 1 µm. The thickness of the magnetoresistive element is set to, e.g., about 5 nm. The length and thickness of the magnetoresistive element are not limited to this example, either.

The length of the magnetoresistive element is preferably set within the range of, e.g., one to ten times (2 times in this example) the maximum value of the width of the magnetoresistive element. The thickness of the magnetoresistive element is preferably, e.g., 3 to 50 nm (both inclusive). The magnetoresistive element is especially required to be as small as possible for integration.

As the material of the ferromagnetic layer of the magnetoresistive element, Fe, Co, Ni, a layered structure of these metals, or an alloy containing these metals (e.g., $Co_9Fe$) can be used. The magnetoresistive element may include a layer made of a nonmagnetic metal material such as Cu, Au, Ru, or Al.

FIGS. 24 to 27 show magnetic structures (magnetization patterns) before/after and during the data write when the magnetization state switching mechanism according to the embodiment of the present invention is executed for the magnetoresistive element shown in FIG. 23.

Figure 24:
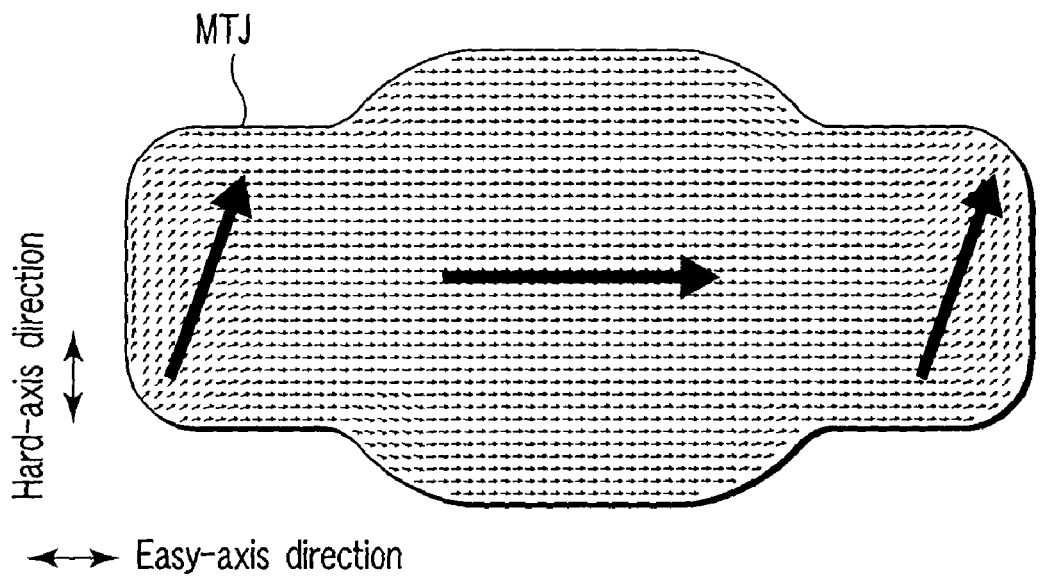
FIG. 24 is a view showing the switching mechanism of the magnetization state of the magnetoresistive element shown in FIG. 22.

As shown in FIG. 24, when no magnetic field is applied before the data write, the magnetic structure (residual magnetization) of the magnetoresistive element forms the S-shaped domain. This applies to all magnetoresistive elements included in the memory cell array.

Figure 25:
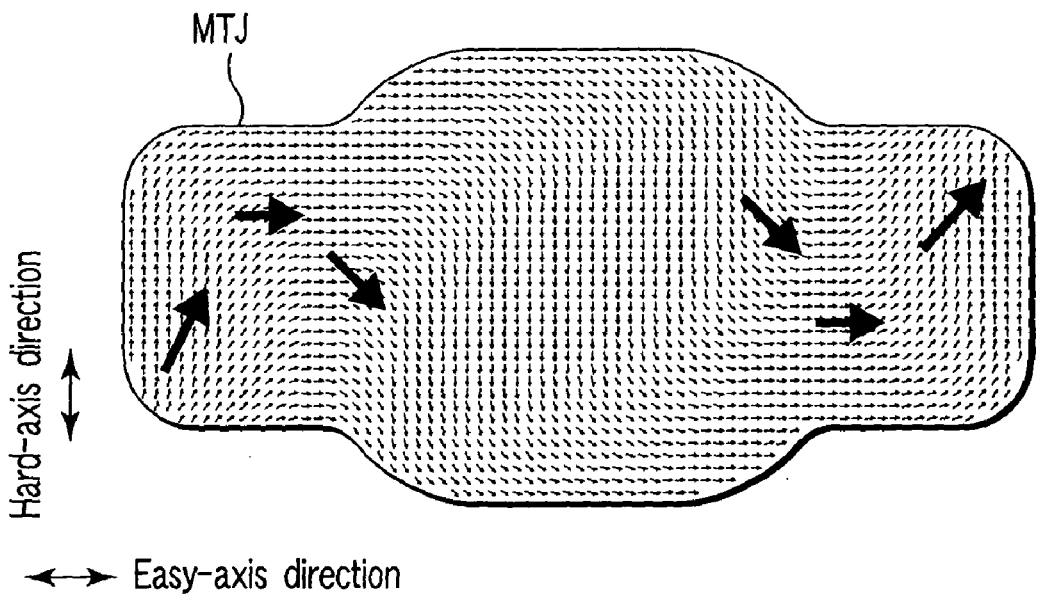
FIG. 25 is a view showing the switching mechanism of the magnetization state of the magnetoresistive element shown in FIG. 22.

During the data write, the magnetic structure of a magnetoresistive element (half-selected cell), to which only the magnetic field generated by the write current flowing to one write line is applied, changes from the S-shaped domain to the C-shaped domain, as shown in FIG. 25.

More specifically, magnetization (an aggregate of small triangles) at the central portion of the magnetoresistive element is directed in the hard-axis direction. Magnetization (an aggregate of small triangles) at each end is directed in the reverse direction. For this reason, C-shaped domains are generated in the left half and right half of the magnetoresistive element, as indicated by large arrows. The magnetic structure (magnetization pattern) is hard to cause flux reversal.

Figure 26:
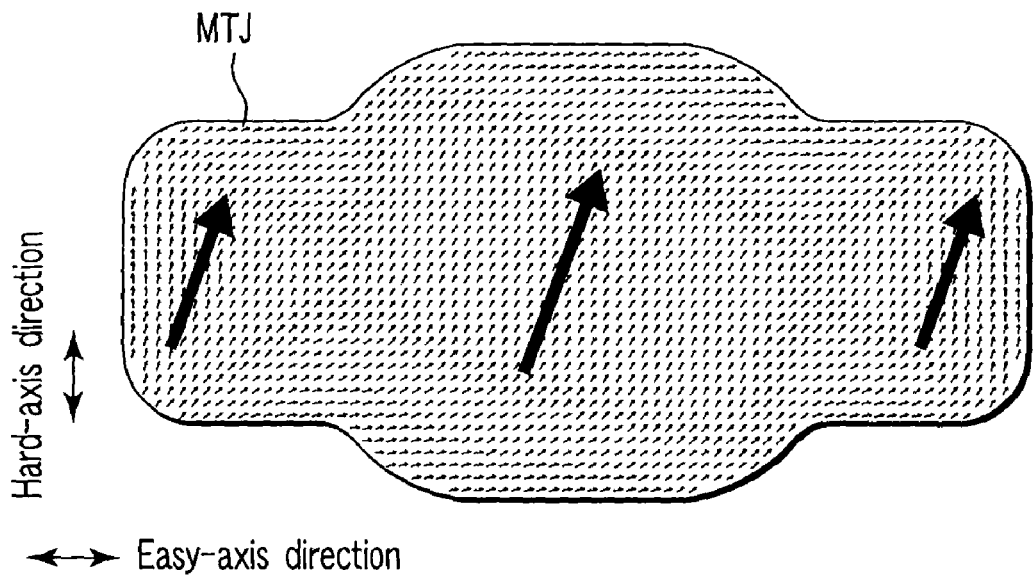
FIG. 26 is a view showing the switching mechanism of the magnetization state of the magnetoresistive element shown in FIG. 22.
Figure 27:
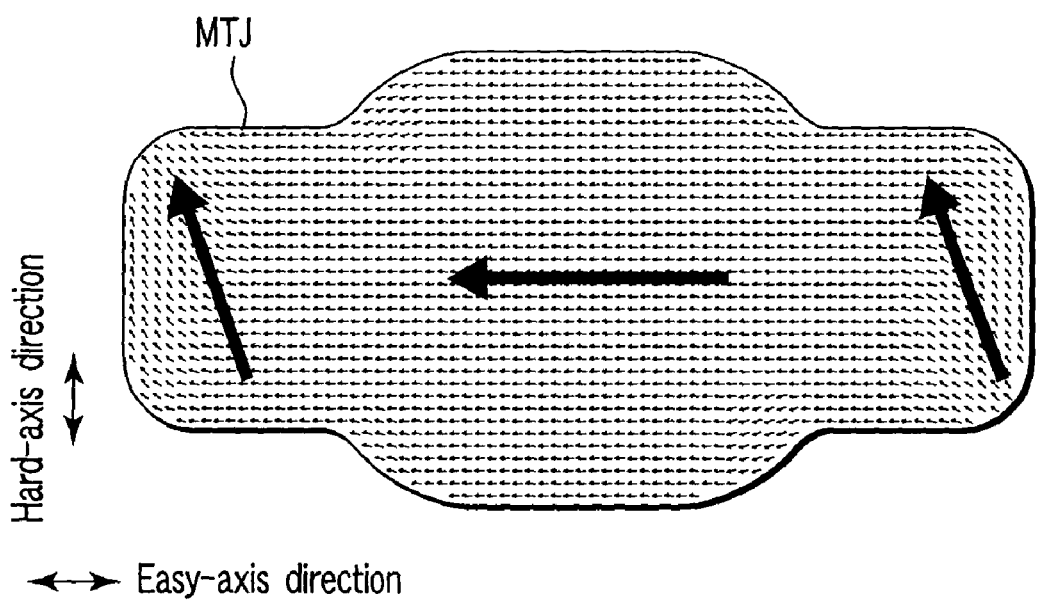
FIG. 27 is a view showing the switching mechanism of the magnetization state of the magnetoresistive element shown in FIG. 22.

As shown in FIG. 26, during the data write, the magnetic structure of a magnetoresistive element (selected cell), to which only the magnetic field generated by the write currents flowing to two write lines is applied, is reversed from the S-shaped domain. The magnetization direction is reversed finally, as shown in FIG. 27.

As is apparent from FIGS. 25 and 26, the magnetic structure of the selected cell during the data write is different from that of the half-selected cell. The switching field (reversal field) at the time of flux reversal from the S-shaped domain is much smaller than that at the time of flux reversal from the C-shaped domain. For this reason, the write selectivity improves. Additionally, the thermal agitation resistance can also be increased.

C. Structure Examples 3 to 5

FIGS. 28 to 30 show Structure Examples 3 to 5 of the magnetoresistive element.

In the example shown in FIG. 28, the magnetoresistive element is almost elliptical. More specifically, the magnetoresistive element has not a perfect elliptical shape but an elliptical shape having projecting portions at ends in the hard-axis direction. The shape of this example can also be regarded as a shape obtained by reducing both the hard-axis and easy-axis direction widths of the cross-shaped magnetoresistive element shown in FIG. 12.

In the example shown in FIG. 29, the magnetoresistive element is almost rhombic. More specifically, the magnetoresistive element has not a perfect rhombic shape but a rhombic shape having round corners and four sides slightly bent inward.

As a characteristic feature of the example shown in FIG. 30, projecting portions which project in the hard-axis direction are provided at easy-axis direction ends of the magnetoresistive element shown in FIG. 12. In this case, the magnetization pattern of a half-selected cell during the data write is more clearly formed from two C-shaped domains so that the write selectivity further improves.

D. Structure Example 6

Figure 31:
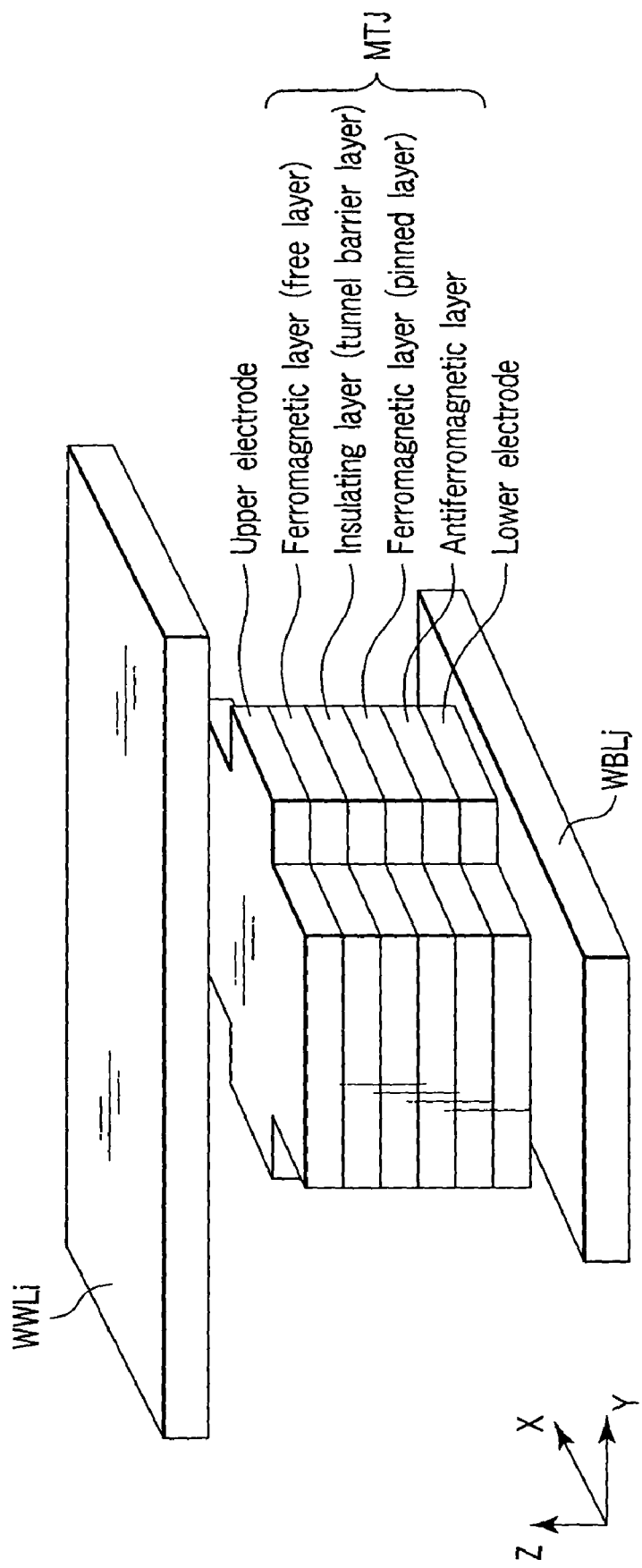
FIG. 31 is a perspective view showing Structure Example 6 of the magnetoresistive element.

FIG. 31 shows an example of the layer structure of the magnetoresistive element.

The magnetization state switching mechanism according to the embodiment of the present invention is related to the magnetic structure (magnetization pattern) of the free layer of the magnetoresistive element. A general layer structure of the magnetoresistive element will be described here.

The magnetoresistive element is arranged at the intersection between the write word line WWLi and the write bit line WBLj. The magnetoresistive element has a layered structure including, e.g., an antiferromagnetic layer/ferromagnetic layer (pinned layer)/insulating layer (tunnel barrier layer)/ferromagnetic layer (free layer) and is sandwiched between an upper electrode and a lower electrode.

This example shows a bottom-pin magnetoresistive element with the pinned layer arranged under the free layer. It may however be a top-pin magnetoresistive element having the pinned layer arranged above the free layer.

E. Others

Structure Examples 1 to 6 of the magnetoresistive element have been described assuming that each of the ferromagnetic layers (free layer and pinned layer) includes a single layer. However, each ferromagnetic layer of the magnetoresistive element may have a plurality of layers, e.g., two ferromagnetic layers and a nonmagnetic metal layer arranged between them.

Even when such a ferromagnetic layer with a multilayered structure is used, the coercive force can sufficiently be reduced, and the switching field can greatly be reduced while ensuring thermal stability.

As the material of the ferromagnetic layer of the magnetoresistive element, Fe, Co, Ni, a layered structure of these metals, or an alloy containing these metals (e.g., $Co_9Fe$) can be used. For the nonmagnetic metal layer, Cu, Au, Ru, or Al can be used. In the layered structure, magnetic coupling may exist between the two ferromagnetic layers sandwiching the nonmagnetic metal layer.

(3) Examination of Shape of Magnetoresistive Element

To implement an asteroid curve with a large write margin, it is important to stabilize the residual magnetization of the magnetoresistive element. The residual magnetization state of the magnetoresistive element largely depends on its shape.

The free layers of the magnetoresistive elements of Structure Examples 1 to 5 described above have a cross shape, a modification thereof, or a shape having a long portion running in the direction of axis of easy magnetization and projecting portions projecting in the direction of axis of hard magnetization from side surfaces except the ends of the long portion. All the shapes of Structure Examples 1 to 4 have reflection symmetry about a central axis extending in the easy-axis direction and a central axis extending in the hard-axis direction. Structure Example 5 described above has no reflection symmetry, unlike Structure Examples 1 to 4.

According to the shape of Structure Example 5, however, the residual magnetization of the magnetoresistive element can be stabilized more than the shapes of Structure Examples 1 to 4.

A shape of the magnetoresistive element capable of executing the magnetization state switching mechanism according to the embodiment of the present invention and stabilizing the residual magnetization state will be examined below.

The basic shape of the free layer of the magnetoresistive element to be examined below is a cross shape. This is because it is easiest to employ a cross shape as the basic shape to prevent easy flux reversal of a half-selected cell by the magnetization state switching mechanism according to the embodiment of the present invention. The free layer of the magnetoresistive element of the present invention may have a modification of a cross shape or a shape having a long portion running in the direction of axis of easy magnetization and projecting portions projecting in the direction of axis of hard magnetization from side surfaces except the ends of the long portion, as a matter of course.

Such a cross shape will be referred to here as an S-cross shape (because only a selected cell forms the S-shaped domain during the data write).

A. Shape of Ends in Easy-Axis Direction

The ends in the easy-axis direction are asymmetrical about a central axis X extending in the easy-axis direction and a central axis Y extending in the hard-axis direction.

Figure 32:
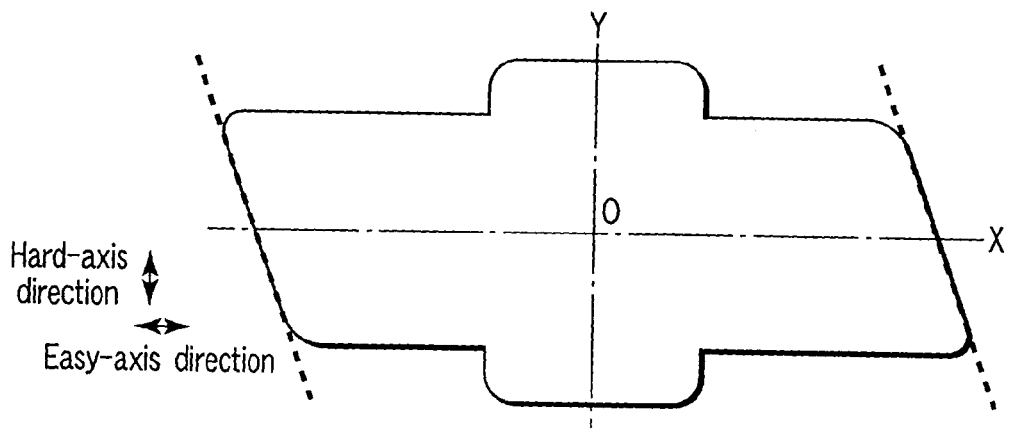
FIG. 32 is a view showing an example of an S-cross shape.

For example, as shown in FIG. 32, the magnetoresistive element includes a parallelogram (long portion) long in the easy-axis direction and projecting portions projecting in the hard-axis direction from the long sides of the parallelogram. All corners are round.

Figure 33A:
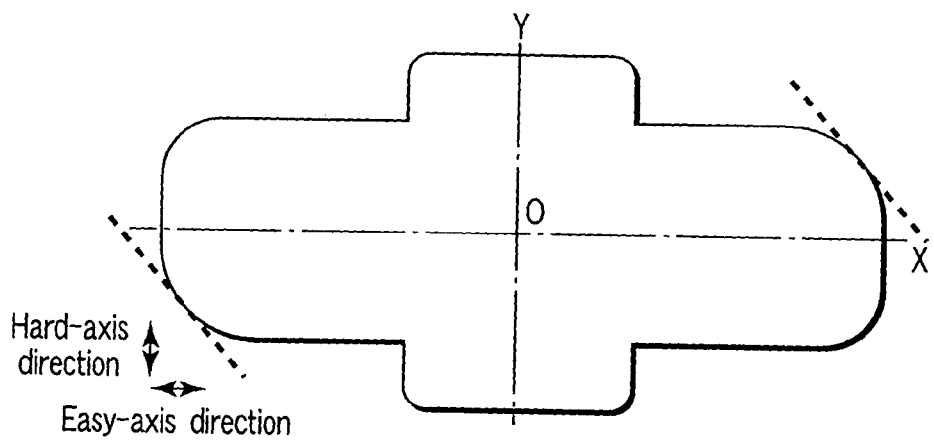
FIGS. 33A and 33B are views showing other examples of the S-cross shape.
Figure 33B:
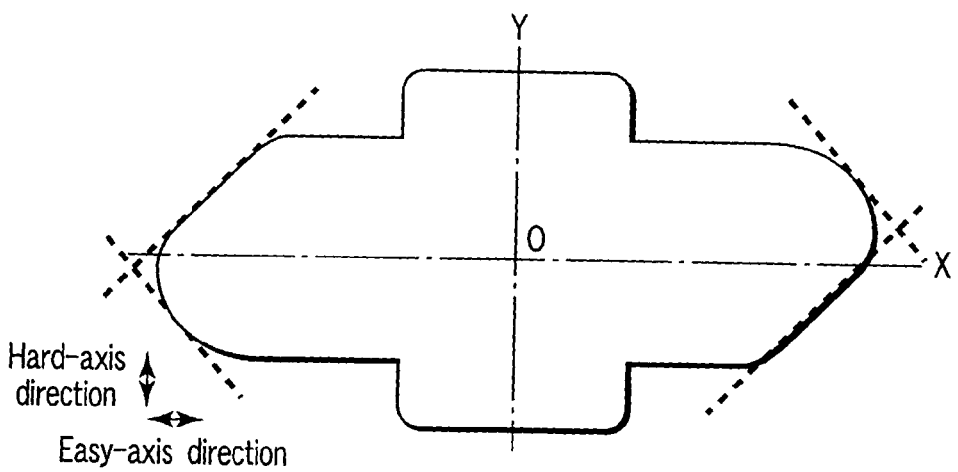

Alternatively, as shown in FIGS. 33A and 33B, the magnetoresistive element includes a rectangle (long portion) long in the easy-axis direction and projecting portions projecting in the hard-axis direction from the long sides of the parallelogram. Corners present on at least one of the two diagonal lines of the rectangle are cut off.

For example, referring to FIG. 33A, corners present on one of the two diagonal lines of the rectangle are cut along the dotted lines. Referring to FIG. 33B, all corners present on the two diagonal lines of the rectangle are cut along the dotted lines. In this case, corners present on one diagonal line are cut off in a larger amount than those present on the other diagonal line. The corners are round, as in FIG. 32.

When the ends in the easy-axis direction are asymmetrical about the central axis X extending in the easy-axis direction and the central axis Y extending in the hard-axis direction, the residual magnetization (S-shaped domain) stabilizes. For this reason, an asteroid curve with a large write margin as shown in FIG. 34 can be implemented, and any write error can be prevented by improving the write selectivity.

B. Whole Shape

The whole shape has two times-rotation symmetry and is asymmetrical about the central axis X extending in the easy-axis direction and the central axis Y extending in the hard-axis direction (the shape has no reflection symmetry).

In two times-rotation symmetry, when the magnetoresistive element is rotated clockwise or counterclockwise about a central point O by 360°/2, the shape is congruent to the initial shape. That is, two times-rotation symmetry means point symmetry about the central point O of the magnetoresistive element.

The above-described shapes shown in FIGS. 32, 33A, and 33B have two times-rotation symmetry and are asymmetrical about the central axis X extending in the easy-axis direction and the central axis Y extending in the hard-axis direction.

FIGS. 35 to 38 show other shape examples which satisfy the above conditions.

Figure 35:
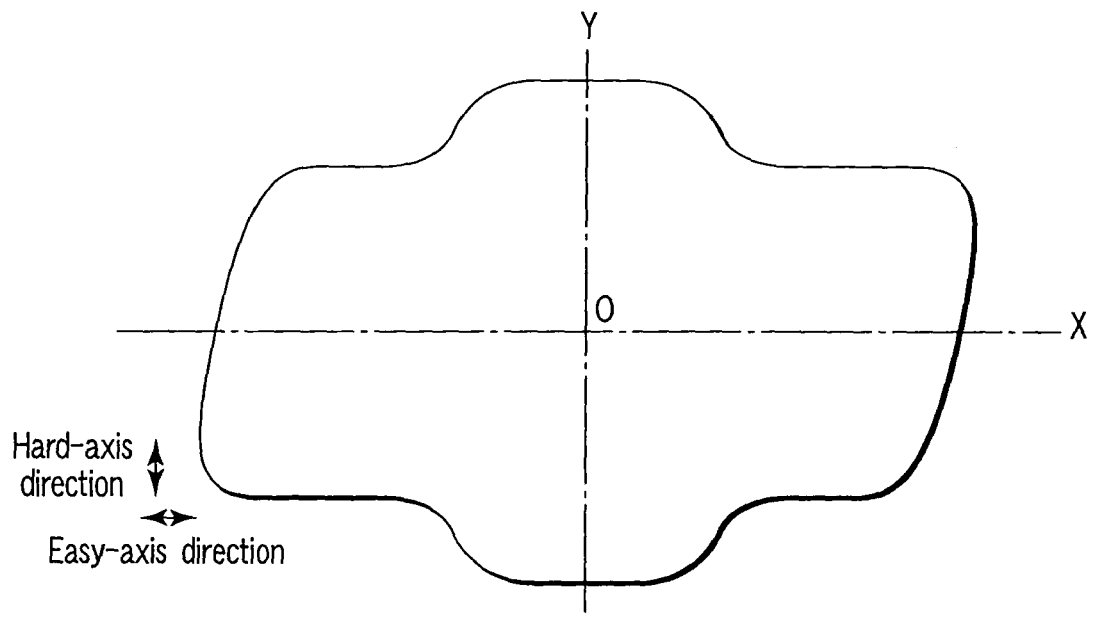
FIG. 35 is a view showing still another example of the S-cross shape.

The shape shown in FIG. 35 is approximate to that shown in FIG. 32.

The magnetoresistive element includes a parallelogram (long portion) long in the easy-axis direction and semicircles (projecting portions) projecting in the hard-axis direction from the long sides of the parallelogram. All corners are round.

According to this whole shape, residual magnetization as the initial state after the data write stabilizes, and the variation in write characteristic is reduced. Hence, the write selectivity can be improved.

Figure 36:
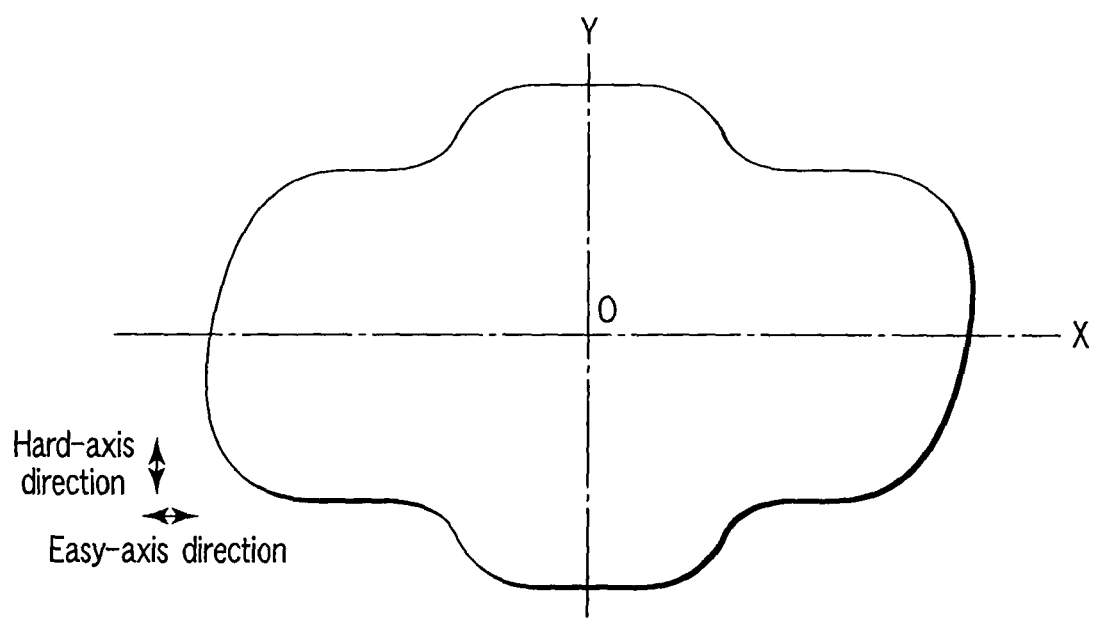
FIG. 36 is a view showing still another example of the S-cross shape.

The shape shown in FIG. 36 is approximate to that shown in FIG. 33A or 33B.

The magnetoresistive element includes a rectangle (long portion) long in the easy-axis direction and semicircles (projecting portions) projecting in the hard-axis direction from the long sides of the parallelogram. Corners on the two diagonal lines of the rectangle are cut off.

Corners present on one of the two diagonal lines of the rectangle are cut off in a larger amount than those present on the other diagonal line. All the corners are round.

According to this whole shape as well, residual magnetization as the initial state after the data write stabilizes, and the variation in write characteristic is reduced. Hence, the write selectivity can be improved.

In the shape shown in FIG. 37, the following characteristic features are added to the shape shown in FIG. 35.

Convex portions JUT projecting in the hard-axis direction are provided at the easy-axis direction ends of the magnetoresistive element. The magnetoresistive element has two ends in the easy-axis direction. One convex portion JUT is provided at each end. The projecting direction of the convex portion JUT provided at one easy-axis direction end of the magnetoresistive element is reverse to the projecting direction of the convex portion JUT provided at the other end.

All corners are round.

According to this whole shape, residual magnetization as the initial state after the data write stabilizes, and the variation in write characteristic is reduced. In addition, the magnetization pattern of a half-selected cell during the data write is more clearly formed from two C-shaped domains. Hence, the write selectivity is expected to further improve.

In the shape shown in FIG. 38, the following characteristic features are added to the shape shown in FIG. 36.

The convex portions JUT projecting in the hard-axis direction are provided at the easy-axis direction ends of the magnetoresistive element, like the shape shown in FIG. 37. One convex portion JUT is provided at each of the two easy-axis direction ends of the magnetoresistive element. The projecting direction of the convex portion JUT provided at one easy-axis direction end of the magnetoresistive element is reverse to the projecting direction of the convex portion JUT provided at the other end.

All corners are round, like the shape in FIG. 37.

According to this whole shape as well, residual magnetization as the initial state after the data write stabilizes, and the variation in write characteristic is reduced. In addition, the magnetization pattern of a half-selected cell during the data write is more clearly formed from two C-shaped domains. Hence, the write selectivity is expected to further improve.

Figure 39:
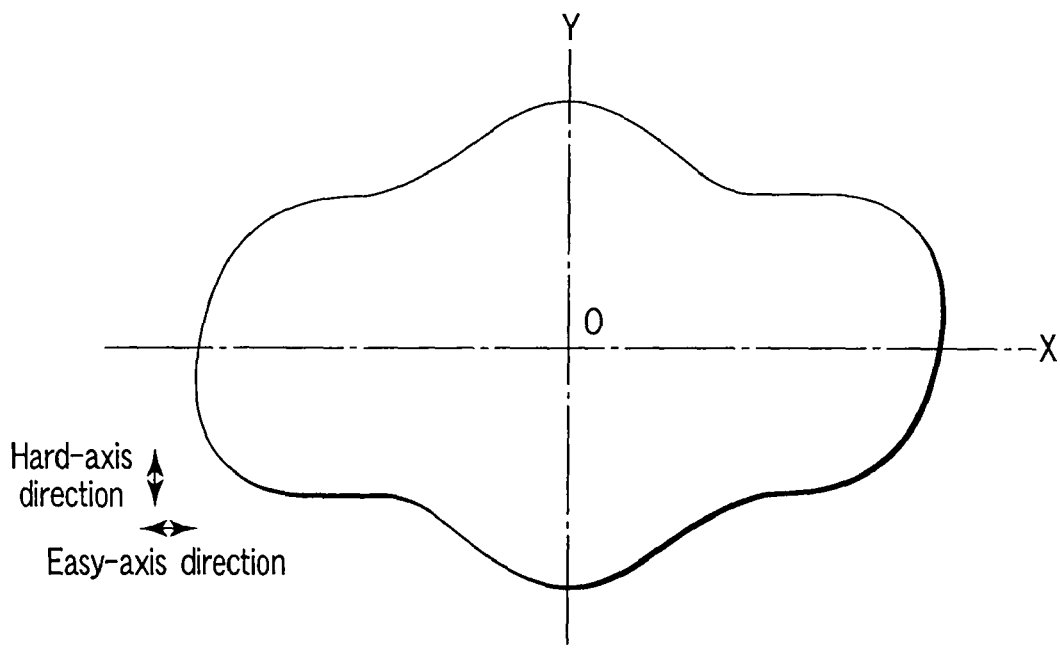
FIG. 39 is a view showing still another example of the S-cross shape.

In the shape shown in FIG. 39, the corners are rounder than those of the shape shown in FIG. 36. The projecting portions projecting in the hard-axis direction from the long sides of the long portion running in the easy-axis direction have a triangular shape with round corners.

Even in this whole shape, residual magnetization stabilizes in the S-shaped domain, and the magnetization pattern of a half-selected cell is formed from two C-shaped domains.

Figure 40:
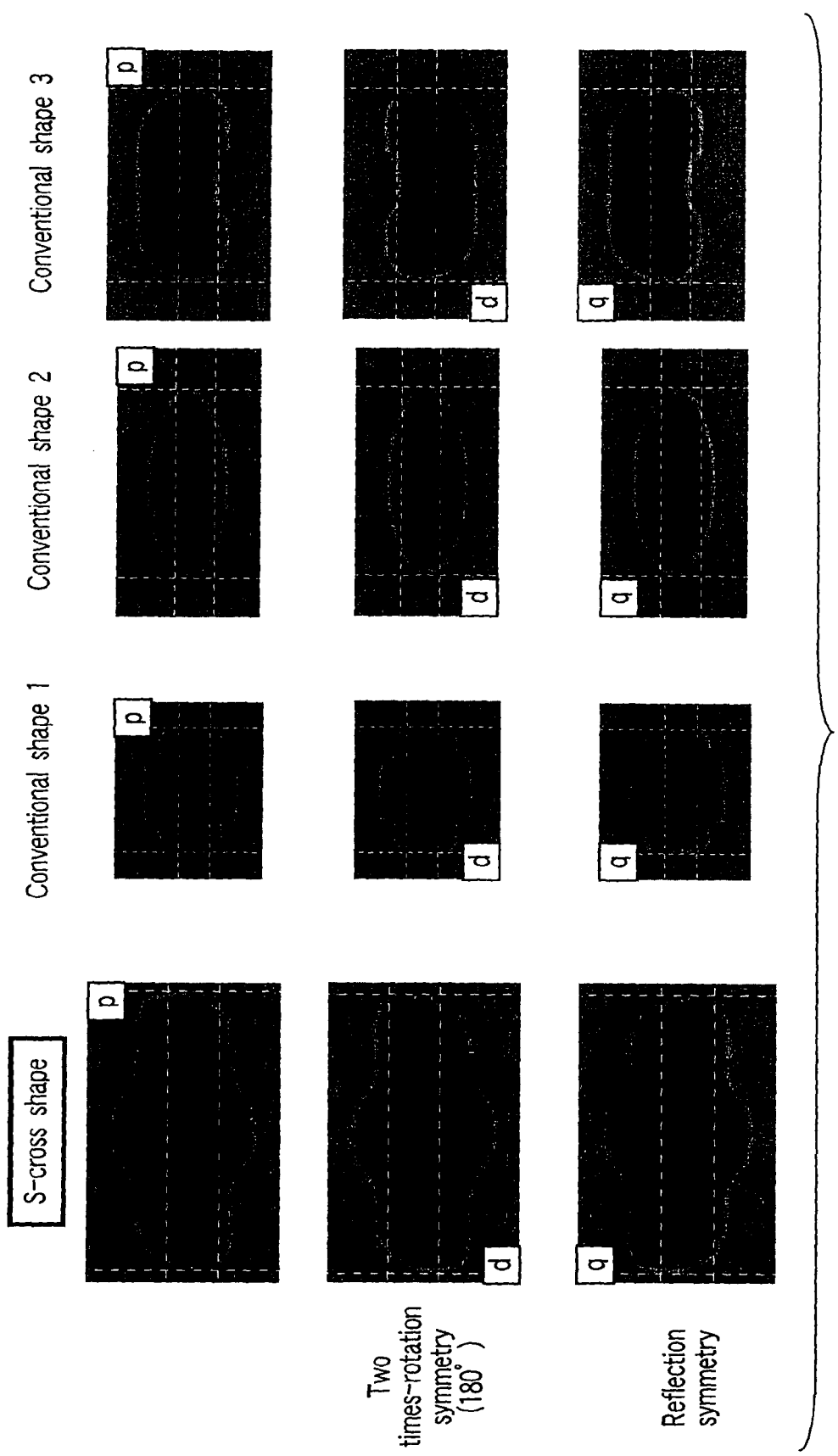
FIG. 40 is a view showing the comparison of two times-rotation symmetry and reflection symmetry between the S-cross shape and conventional shapes.

FIG. 40 shows the comparison between the S-cross shape and conventional shapes.

As the conventional shapes, three shapes: cross shape (conventional shape 1), elliptical shape (conventional shape 2), and beans shape (conventional shape 3) are exemplified.

The cross and elliptical shapes have two times-rotation symmetry but are reflection-symmetrical about the central axis extending in the easy-axis direction and the central axis extending in the hard-axis direction. The beans shape has no two times-rotation symmetry but is reflection-symmetrical about the central axis extending in the hard-axis direction.

To the contrary, the S-cross shape has two times-rotation symmetry and is asymmetrical, i.e., is not reflection-symmetrical about the central axis extending in the easy-axis direction and the central axis extending in the hard-axis direction.

C. Size

The maximum value of the hard-axis direction width of the magnetoresistive element having the S-cross shape is preferably 1 µm or less. The easy-axis direction length preferably falls within the range of, e.g., one to ten times the maximum value of the width in the hard-axis direction.

The free layer of the magnetoresistive element can either be a single layer or include a plurality of ferromagnetic layers like a synthetic anti-ferroelectric (SAF) structure. The thickness of the magnetoresistive element is preferably 3 to 50 nm (both inclusive).

D. Conclusion

When the shape of the magnetoresistive element is further improved to meet the requirement to execute the magnetization state switching mechanism according to the embodiment of the present invention, a stable operation without any write error can be implemented.

(4) Manufacturing Method

A method of manufacturing a magnetoresistive element capable of executing the magnetization state switching mechanism according to the embodiment of the present invention will be described next.

A magnetoresistive element is generally formed by exposing a resist by using one of light, electron beam, and X-rays, forming a resist pattern by development, and processing magnetic and nonmagnetic materials by ion milling or etching using the resist pattern as a mask.

To form a large magnetoresistive element on the order of, e.g., micron, a hard mask (e.g., silicon oxide or silicon nitride) is formed by transferring a resist pattern. Magnetic and nonmagnetic materials are processed by reactive ion etching (RIE) using the hard mask as a mask, thereby obtaining a magnetoresistive element.

To form a small magnetoresistive element with a submicron size of, e.g., 2 to 3 µm to 0.1 µm, photolithography can be used. In this case, a resist pattern is formed by photolithography and transferred to a hard mask. Magnetic and nonmagnetic materials are processed by reactive ion etching (RIE) using the hard mask as a mask, thereby obtaining a magnetoresistive element.

To form a minute magnetoresistive element with a size of, e.g., 0.5 µm or less, electron beam exposure can be used. In this case, a resist pattern is formed by electron beam exposure and transferred to a hard mask. Magnetic and nonmagnetic materials are processed by reactive ion etching (RIE) using the hard mask as a mask, thereby obtaining a magnetoresistive element.

However, when electron beam exposure is used, the size of the edge domain region of the magnetoresistive element according to the embodiment of the present invention further decreases because the size of the magnetoresistive element is very small. It is therefore very difficult to form a magnetoresistive element with an accurate shape.

As a measure, the proximity effect correction of an electron beam is used.

Normally, proximity effect correction is used to form an accurate pattern by correcting an intra-graphic proximity effect generated by back scattering of an electron beam from a substrate.

In forming, e.g., a rectangular pattern, the stored charge amount is insufficient at the corners of the rectangle so that they are rounded. To form sharp corners, a correction point beam is injected near the corners and, more particularly, outside the contour of an element with a size of 0.5 µm or less to increase the stored charge amount. With this process, an accurate pattern can be obtained.

A cross-shaped magnetoresistive element is formed here by using this method. For example, a rectangle is defined as the basic pattern. A correction point beam is injected near two corners facing each other, thereby obtaining an accurate cross shape.

At this time, the shape can be corrected by increasing the injection charge amount as compared to the normal proximity effect correction, appropriately correcting the correction point beam injection position, or using both the methods.

Consequently, a cross-shaped magnetoresistive element capable of executing the magnetization state switching mechanism according to the embodiment of the present invention can be formed. To obtain a cross shape, a plurality of points may be irradiated with a correction point beam.

(5) Examples of Memory Cell Array

Examples of the memory cell array of a magnetic random access memory will be described next, which uses the magnetization state switching mechanism according to the embodiment of the present invention.

Figure 41:
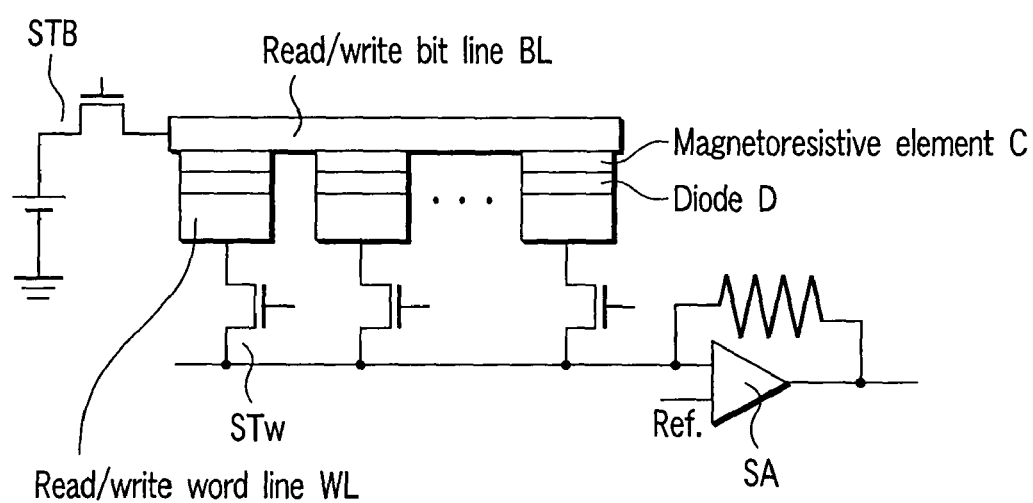
FIG. 41 is a view showing an example of the memory cell array of the magnetic random access memory.

FIG. 41 shows a cross-point memory cell array.

Read/write word lines WL and read/write bit lines BL cross each other. A magnetoresistive element C is arranged at each intersection. The magnetoresistive element C is electrically connected to the read/write word line WL and read/write bit line BL.

A diode D is arranged between the magnetoresistive element C and the read/write word line WL. The diode D has a function of preventing a so-called sneak current unique to the cross-point memory cell array in the read/write. The sneak current is avoided by, e.g., applying a bias voltage to the diodes D, unselected read/write word lines WL, and unselected read/write bit lines BL.

A sense amplifier SA is connected to the read/write word line WL through, e.g., a select transistor STw. A power supply is connected to the read/write bit line BL through, e.g., a select transistor STB.

Figure 42:
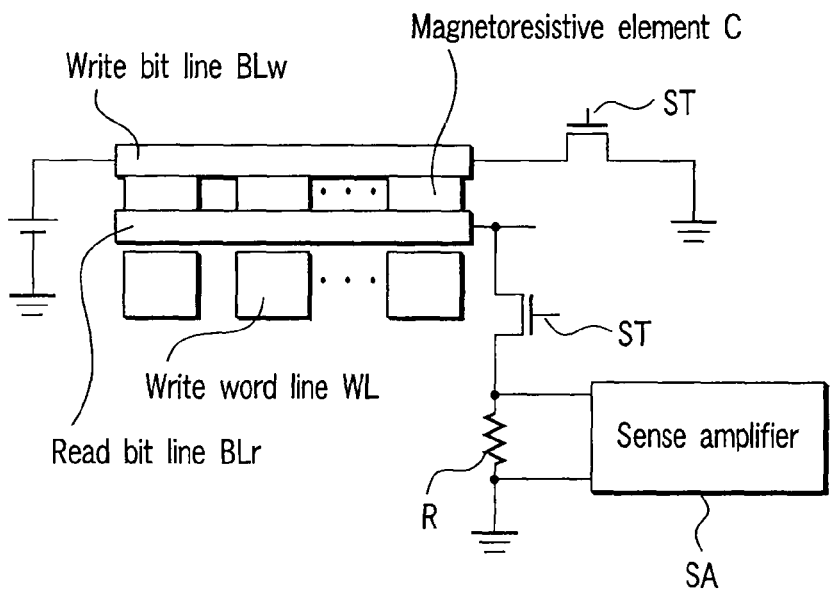
FIG. 42 is a view showing another example of the memory cell array of the magnetic random access memory.

FIG. 42 shows a ladder memory cell array.

The plurality of magnetoresistive elements C are arranged in a ladder shape between write bit lines BLw and read bit lines BLr. The write bit lines BLw and read bit lines BLr run in the same direction.

Write word lines WL are arranged immediately under the magnetoresistive elements C. The write word line WL is spaced apart from the magnetoresistive element C by a predetermined distance and runs in a direction perpendicular to the write bit lines BLw.

A resistive element R is connected to the read bit line BLr through, e.g., a select transistor ST. The sense amplifier SA senses read data by detecting a voltage generated across the resistive element R. A power supply is connected to one end of the write bit line BLw. A ground point is connected to the other end of the write bit line BLw through, e.g., the select transistor ST.

Figure 43:
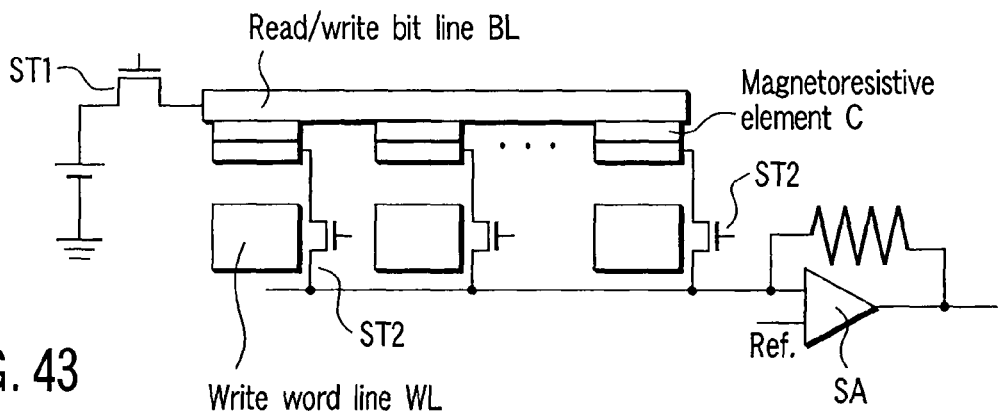
FIG. 43 is a view showing still another example of the memory cell array of the magnetic random access memory.
Figure 44:
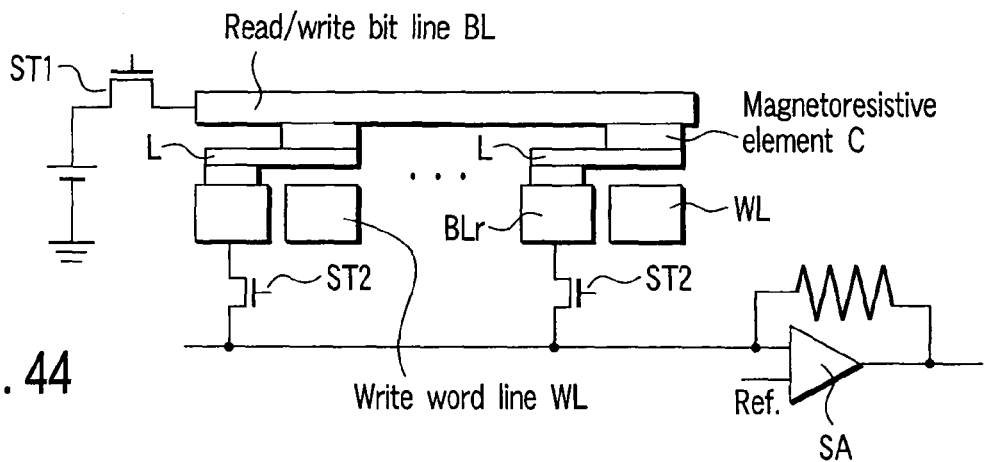
FIG. 44 is a view showing still another example of the memory cell array of the magnetic random access memory.

FIGS. 43 and 44 show 1-transistor/1-MTJ memory cell arrays.

The write word lines WL and read/write bit lines BL cross each other. The magnetoresistive element C is arranged at each intersection. The magnetoresistive element C is electrically connected to the read/write bit line BL. The write word lines WL are arranged immediately under the magnetoresistive elements C. The write word line WL is spaced apart from the magnetoresistive element C by a predetermined distance.

One terminal of the magnetoresistive element C is connected to the sense amplifier SA through, e.g., a select transistor ST2. The read/write bit line BL is connected to a power supply through a select transistor ST1.

In the structure shown in FIG. 44, one terminal of the magnetoresistive element C is connected to a lower electrode L serving as a lead. For this reason, even when the select transistor ST2 is arranged immediately under the magnetoresistive element D, the write word line WL can be arranged near the magnetoresistive element C.

3. Others

In the magnetization state switching mechanism (flux reversal) of the magnetoresistive element according to the embodiment of the present invention, a selected cell and a half-selected cell have different magnetization patterns during the write. Since the half-selected cell is set in the state hard to cause flux reversal, the write disturbance can be improved. In addition, the thermal stability can be increased, and the switching field can be reduced.

When the magnetization state switching mechanism is applied to a magnetic random access memory, the value of the write current to generate a magnetic field necessary for the data write (flux reversal) can be made small, resulting in an advantage in reducing power consumption. Furthermore, the memory cell size can be reduced because of the high thermal stability.

Hence, a magnetic random access memory capable of increasing the degree of integration and executing a high-speed write at a low power consumption can be provided.

4. First Example of Magnetoresistive Element

The first example of a magnetoresistive element to execute the above-described 2.(1) "Magnetization State Switching Mechanism" will be described next.

In the first example of the magnetoresistive element, a magnetic tunnel junction (MTJ) element will be described in (1) as an example of the magnetoresistive element. A magnetic random access memory (MRAM) having the MTJ element as a storage element will be described in (2). In the following description, the same reference numerals denote the same parts throughout the drawing.

(1) MTJ Element

An MTJ element according to an embodiment of the present invention will be described first. A. Outline of MTJ Element, B. Planar Shape, C. Sectional Shape, D. Tunnel Junction Structure, E. Interlayer Exchange Coupling Structure, F. Material, G. Examples, and H. Manufacturing Method Examples will be described here.

A. Outline of MTJ Element

Figure 45A:
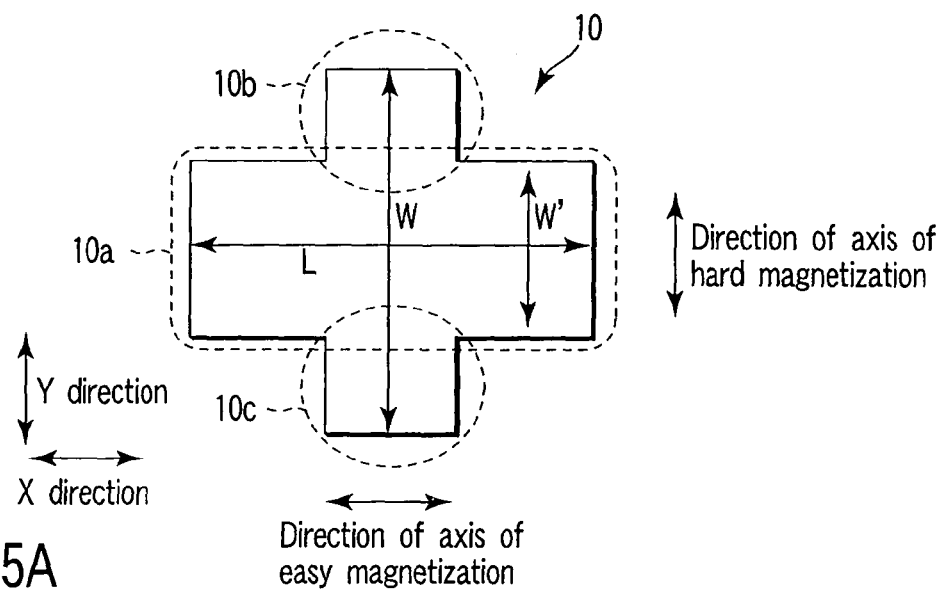
Figure 45B:
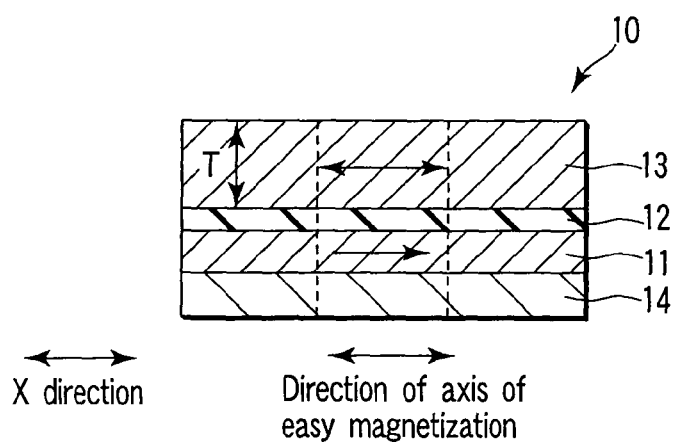
Figure 45C:
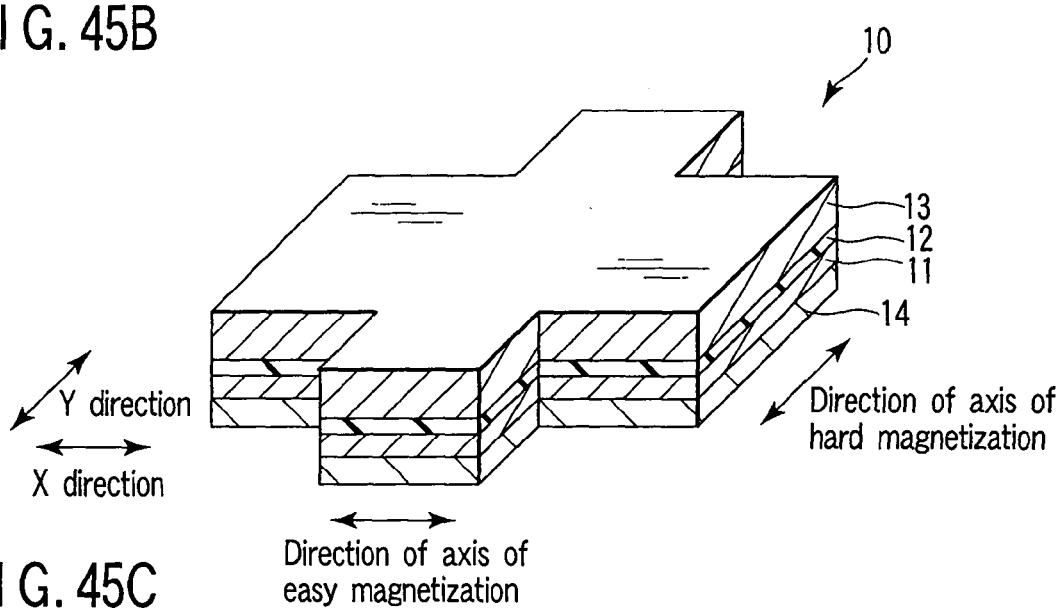

FIGS. 45A, 45B, and 45C are respectively plan, sectional, and perspective views showing an MTJ element according to an embodiment of the present invention. The outline of the MTJ element will be described below.

As shown in FIGS. 45A to 45C, an MTJ element 10 according to the embodiment of the present invention has at least a fixed layer (pinned layer) 11 with a fixed magnetization direction, a recording layer (free layer) 13 with a reversible magnetization direction, and a nonmagnetic layer (e.g., a tunnel insulating layer) 12 sandwiched between the fixed layer 11 and the recording layer 13. An antiferromagnetic layer 14 to fix the magnetization of the fixed layer 11 is provided under the fixed layer 11.

The MTJ element 10 includes a long portion 10a running in the X direction and projecting portions 10b and 10c projecting in the Y direction (a direction perpendicular to the X direction) from, e.g., near the central portions of the two side surfaces of the long portion 10a so that a so-called cross shape is formed. In other words, in the planar shape of the MTJ element 10, a Y-direction width W near the central portion is larger than a Y-direction width W' at the ends. In the shape shown in FIGS. 45A to 45C, the X direction as the running direction of the long portion 10a corresponds to the direction of axis of easy magnetization of the MTJ element 10. The Y direction as the projecting direction of the projecting portions 10b and 10c corresponds to the direction of axis of hard magnetization of the MTJ element 10.

A thickness T of the recording layer 13 of the MTJ element 10 is preferably 5 to 20 nm, as indicated by expression (1). An aspect ratio L/W of the MTJ element 10 is preferably 1.5 to 2.2, as indicated by expression (2).

$$5 \text{ nm} \leq T \leq 20 \text{ nm} \quad (1)$$

$$1.5 \leq L/W \leq 2.2 \quad (2)$$

Expressions (1) and (2) are derived on the basis of the following reasons in consideration of a write field Hsw in the test element group (TEG) of the so-called cross-shaped MTJ element 10.

The aspect ratio L/W of the MTJ element 10 is defined in the following way. In the planar shape shown in FIG. 45A, let L be the maximum length in the X direction, W be the maximum width in the Y direction, and L/W be the aspect ratio. In the MTJ element 10 with the illustrated shape, the length L is the maximum distance which is obtained when the side surfaces at the X-direction ends of the long portion 10a are connected in the X direction (direction of axis of easy magnetization). The width W is the maximum distance which is obtained when the side surface at the Y-direction end of the projecting portion 10b and the side surface at the Y-direction end of the projecting portion 10c are connected in the Y direction (direction of axis of hard magnetization).

A write field ratio Hsw/Hc is defined in the following manner. As shown in FIG. 46, let Hsw be the write field (a synthetic field in the easy-axis and hard-axis directions) necessary for flux reversal at a point P where a line L tilted by 45° from the origin crosses an asteroid curve A, and Hc be the write field (a magnetic field in only the easy-axis direction) necessary for flux reversal at a point Q. Hsw/Hc is defined as the write field ratio.

To implement a 1-Mbit element array, Hsw/Hc is preferably 0.41 or less in consideration of an Hc variation. The reason for this is as follows. As shown in FIG. 47, considering an Hc variation of ±10%, a maximum asteroid curve Amax and minimum asteroid curve Amin are defined on the basis of a basic asteroid curve Abase. Lines L1 and L2 perpendicular to the X- and Y-axes are drawn from X- and Y-intercepts obtained from the minimum asteroid curve Amin. An intersection A where the lines L1 and L2 cross is obtained. When the intersection A is located outside a point Pmax on the maximum asteroid curve Amax, the write operation can be implemented. That is, the area of a hatched region R in FIG. 47 indicates the write margin. To implement the write operation, the write margin must be larger than zero. The write margin with respect to the write field ratio Hsw/Hc was checked. As is apparent from FIG. 48, when the write field ratio Hsw/Hc is 0.43, the write margin (the area of the region R in FIG. 47) is −0.01, i.e., smaller than 0. When the write field ratio Hsw/Hc is 0.42, the write margin is 0.01, i.e., very small and may cause a write error. Hence, the most preferable write field ratio Hsw/Hc is 0.41 or less at which the write margin is 0.02 or more.

The lower limit value of expression (1) and the upper limit value of expression (2) are derived in the following way from the relationship between the aspect ratio L/W and Hsw/Hc. Referring to FIG. 49, when the thickness T of the recording layer 13 is 3.5 nm, Hsw/Hc is larger than 0.41 regardless of the aspect ratio L/W. When the thickness T of the recording layer 13 is 5.0 nm or 8.0 nm, and the aspect ratio L/W is about 2.2 or less, Hsw/Hc is 0.41 or less. However, when the aspect ratio L/W exceeds 2.2, Hsw/Hc exceeds 0.41. As is apparent from this result, to satisfy Hsw/Hc≦0.41, it is preferable to set the thickness T of the recording layer 13 to 5 nm or more (the lower limit value of expression (1)) and the aspect ratio L/W to 2.2 or less (the upper limit value of expression (2)).

The upper limit value of expression (1), which defines the thickness T of the recording layer 13 as 20 nm or less, is derived from the following reason. Because of a characteristic feature of a magnetic material, when the thickness exceeds 20 nm, a vortex occurs, and magnetization having a certain direction changes. For this reason, the element cannot be used as a magnetoresistive element to record "0" and "1" (Jing Shi, S. Tehrani, and M. R. Schieinfein, App. Phys. Lett. 76. pp. 2588-2590 (2000)). To make the element function as a magnetoresistive element, the thickness T of the recording layer 13 is preferably 20 nm or less.

Figure 50:
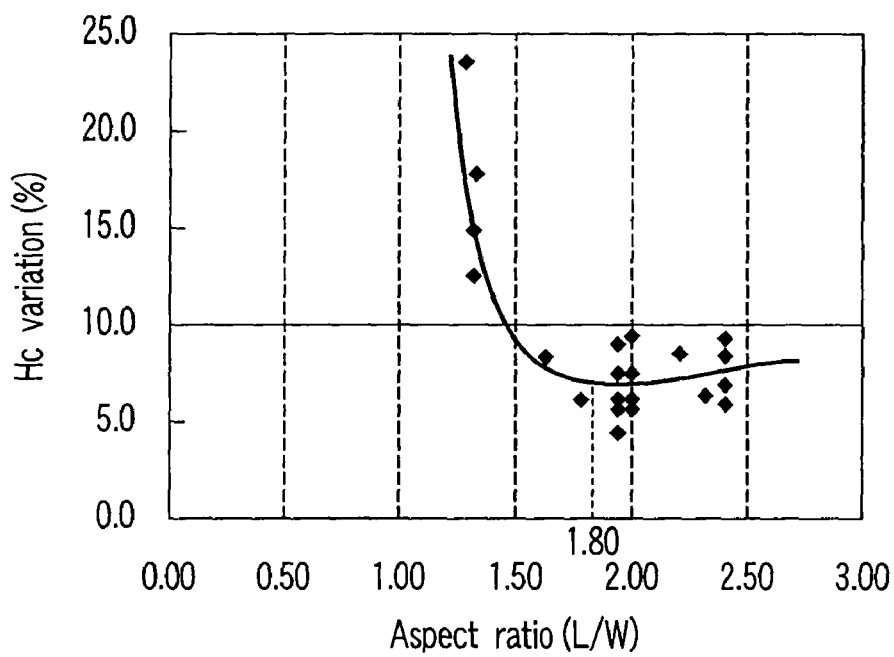
FIG. 50 is a graph showing the experiment result of the relationship between an Hc variation and the aspect ratio according to the embodiment of the present invention.

The lower limit value of expression (2), which defines the aspect ratio L/W as 1.5 or more, is derived from the following reason. FIG. 50 shows the experiment result of the relationship between the Hc variation and the aspect ratio L/W. As shown in FIG. 50, when the aspect ratio L/W is lower than 1.5, the Hc variation exceeds 10%, and a write error in a half-selected cell occurs. To make the Hc variation smaller than 10%, the aspect ratio L/W is preferably 1.5 or more.

As described above, in the embodiment of the present invention, preferably, the MTJ element 10 (at least the recording layer 13) has a so-called cross shape, the aspect ratio L/W of the MTJ element 10 is 1.5 to 2.2 (both inclusive), and the thickness T of the recording layer 13 is 5 to 20 nm (both inclusive).

The aspect ratio L/W is preferably 1.5 to 2.2, as described above. The aspect ratio L/W can also be defined as follows from the experiment result shown in FIG. 50. As shown in FIG. 50, the Hc variation can be suppressed most when the aspect ratio L/W is 1.8 to 2.0. From this fact, the preferable range of the aspect ratio L/W may be defined as about 1.8 to 2.0. In addition, the Hc variation can be suppressed when the aspect ratio L/W is 2.5 or less, as shown in FIG. 50. Hence, the aspect ratio L/W may be about 1.5 to 2.5.

The thickness T of the recording layer 13 is preferably 5 to 20 nm, as described above. However, the thickness T is more preferably 5 to 8 nm because generation of a vortex can be suppressed further when the thickness T is 8 nm or less.

If the thickness T of the recording layer 13 is not uniform (e.g., if the thickness is larger at the center than at the ends), the thickness of the thickest part is preferably defined to satisfy expression (1).

The occupation ratio of the projecting portions 10b and 10c to the entire MTJ element 10 can be changed variously. For example, the maximum Y-direction length (height) of each of the projecting portions 10b and 10c can be set to ⅕ to ⅓ (both inclusive) the Y-direction width of the long portion 10a connected to the projecting portions 10b and 10c. The maximum X-direction length (width) of each of the projecting portions 10b and 10c can be set to ¼ to ½ (both inclusive) the maximum X-direction length of the long portion 10a.

B. Planar Shape

FIGS. 51 to 65 are plan views of the MTJ element according to the embodiment of the present invention. The planar shape of the MTJ element according to the embodiment of the present invention is not limited to the so-called cross shape shown in FIG. 45A and can be changed variously as will be described below.

Figure 51:
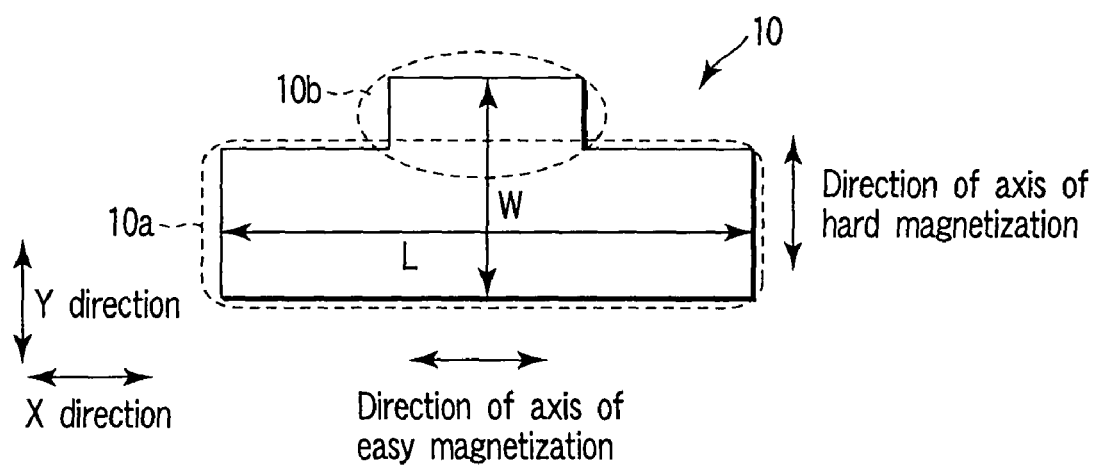
FIG. 51 is a plan view showing a so-called convex shape of the MTJ element according to the embodiment of the present invention.

As shown in FIG. 51, the MTJ element 10 includes the long portion 10a running in the X direction and the projecting portion 10b projecting in the Y direction from, e.g., near the center of one side surface of the long portion 10a so that a so-called convex shape is formed. In the planar shape shown in FIG. 51, the length L to define the aspect ratio L/W is defined by the maximum distance which is obtained when the side surfaces at the X-direction ends of the long portion 10a are connected in the X direction (direction of axis of easy magnetization). The width W is defined by the maximum distance which is obtained when the side surface at the Y-direction end of the projecting portion 10b and the side surface at the Y-direction end of the long portion 10a are connected in the Y direction (direction of axis of hard magnetization).

Figure 52:
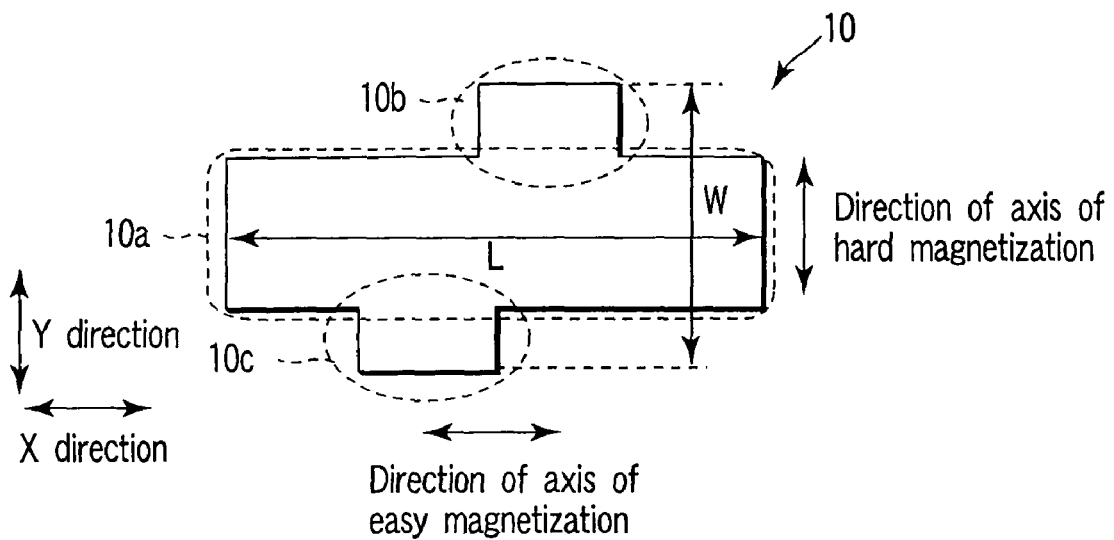
FIG. 52 is a plan view showing the MTJ element according to the embodiment of the present invention, which has projecting portions arranged asymmetrically.

As shown in FIG. 52, the MTJ element 10 includes the long portion 10a running in the X direction and the projecting portions 10b and 10c projecting in the Y direction from the side surfaces of the long portion 10a. The projecting portions 10b and 10c are provided asymmetrically with respect to the long portion 10a. That is, the projecting portions 10b and 10c need not always be provided symmetrically with respect to the long portion 10a. The projecting portions 10b and 10c preferably project from near the central portions of the side surfaces of the long portion 10a such that the shape becomes as close as possible to a cross. In the planar shape shown in FIG. 52, the length L to define the aspect ratio L/W is defined by the maximum distance which is obtained when the side surfaces at the X-direction ends of the long portion 10a are connected in the X direction (direction of axis of easy magnetization). The width W is defined by the maximum distance which is obtained when the side surface at the Y-direction end of the projecting portion 10b and the side surface at the Y-direction end of the projecting portion 10c are connected in the Y direction (direction of axis of hard magnetization), not by the maximum distance obtained by connecting the side surfaces obliquely.

Figure 53:
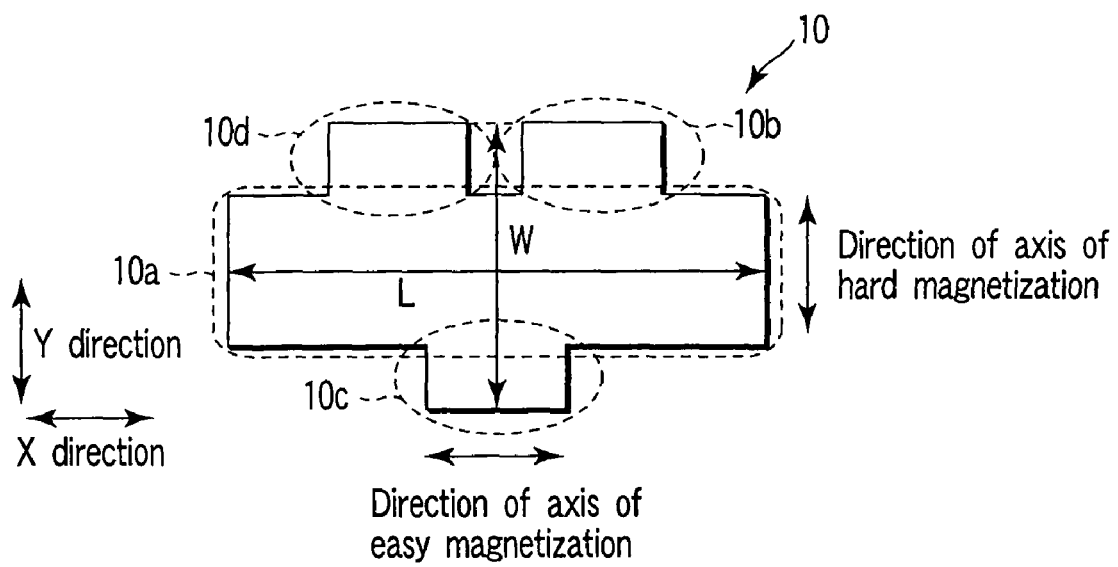
FIG. 53 is a plan view showing the MTJ element according to the embodiment of the present invention, which has two or more projecting portions.
Figure 54A:
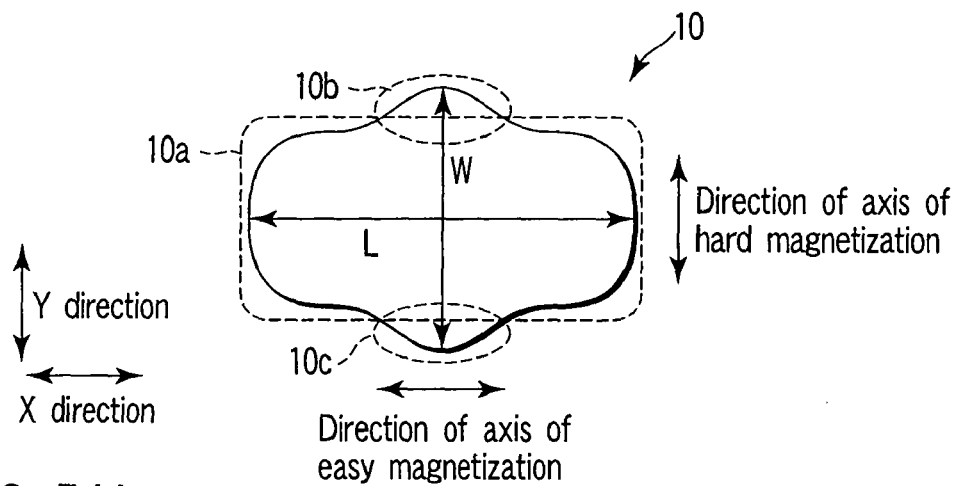
FIGS. 54A to 54C are plan views showing the MTJ elements according to the embodiment of the present invention, which have round corners.
Figure 54B:
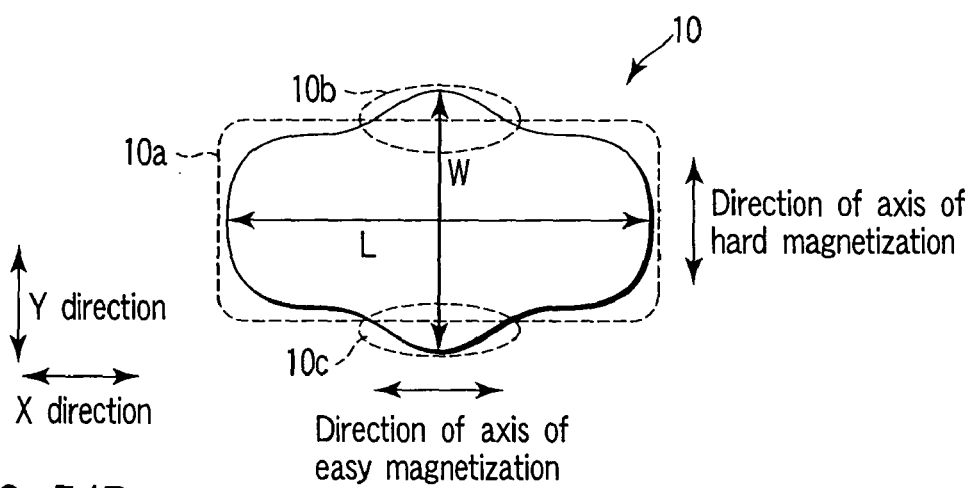
Figure 54C:
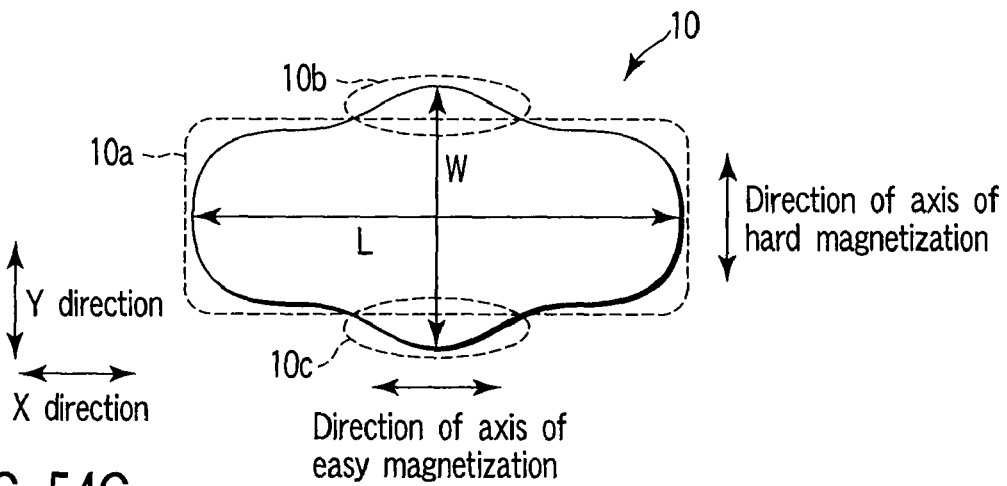
Figure 55A:
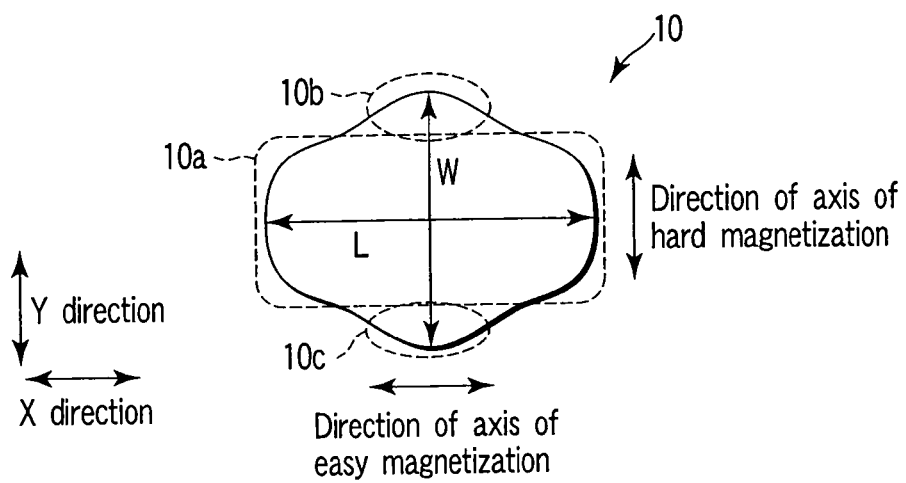
FIGS. 55A to 55C are plan views showing the MTJ elements according to the embodiment of the present invention, which have round corners.
Figure 55B:
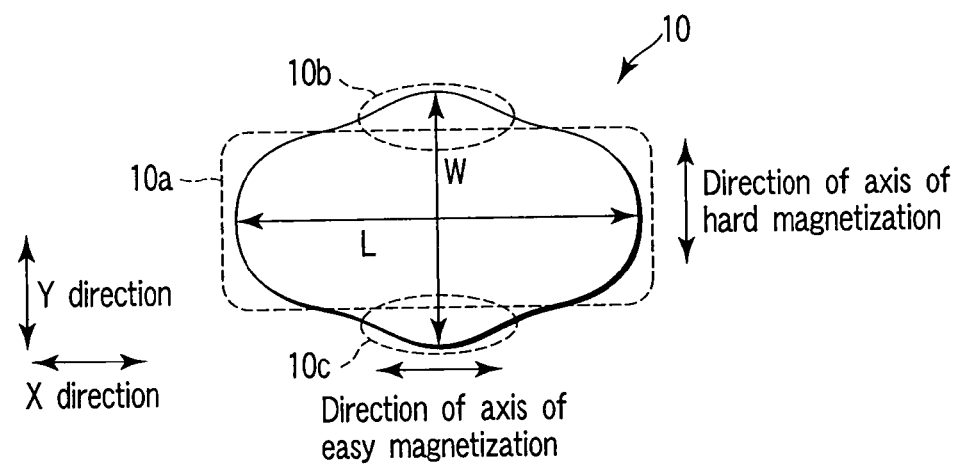
Figure 55C:
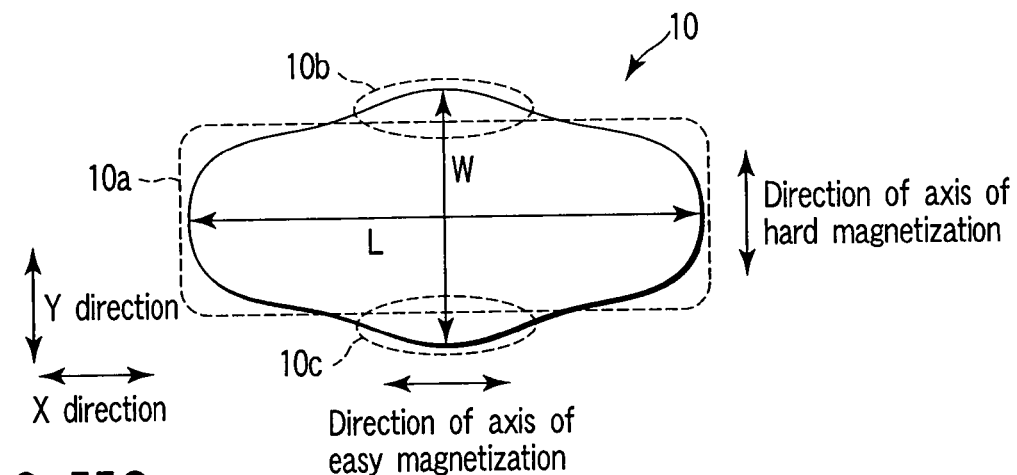
Figure 56A:
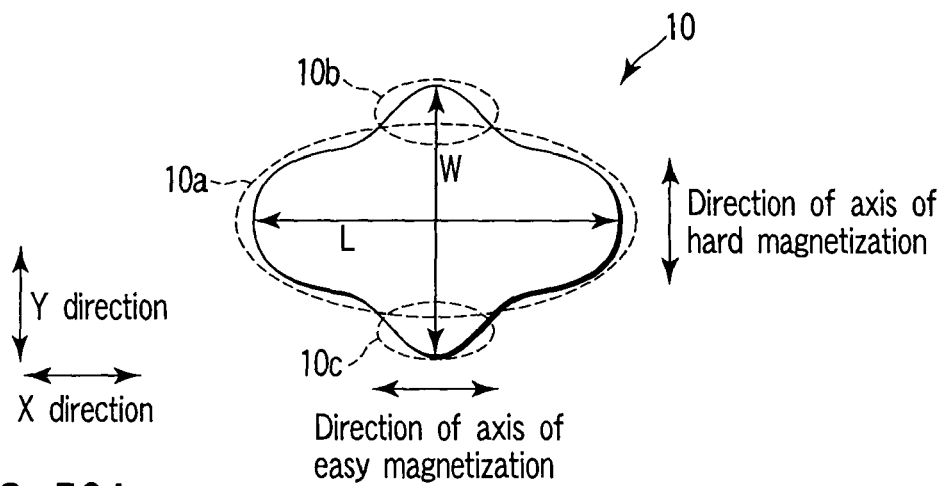
FIGS. 56A to 56C are plan views showing the MTJ elements according to the embodiment of the present invention, which have round corners.
Figure 56B:
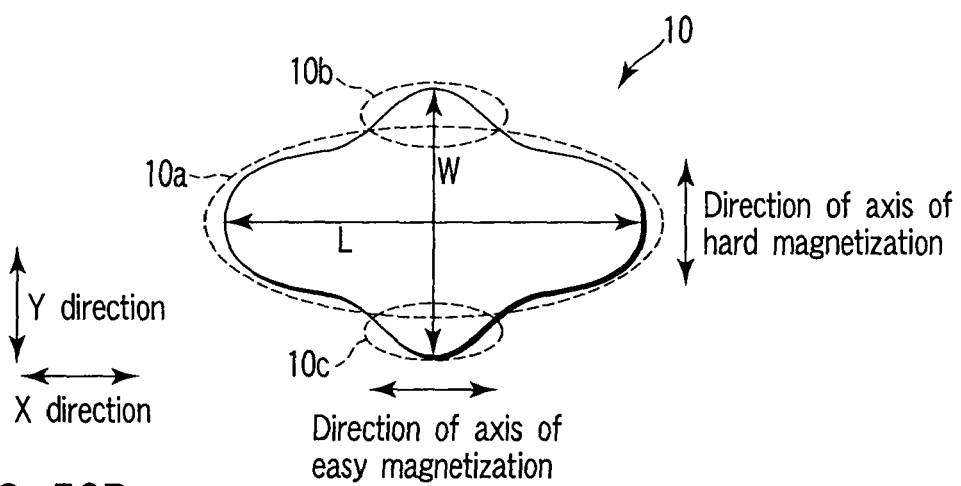
Figure 56C:
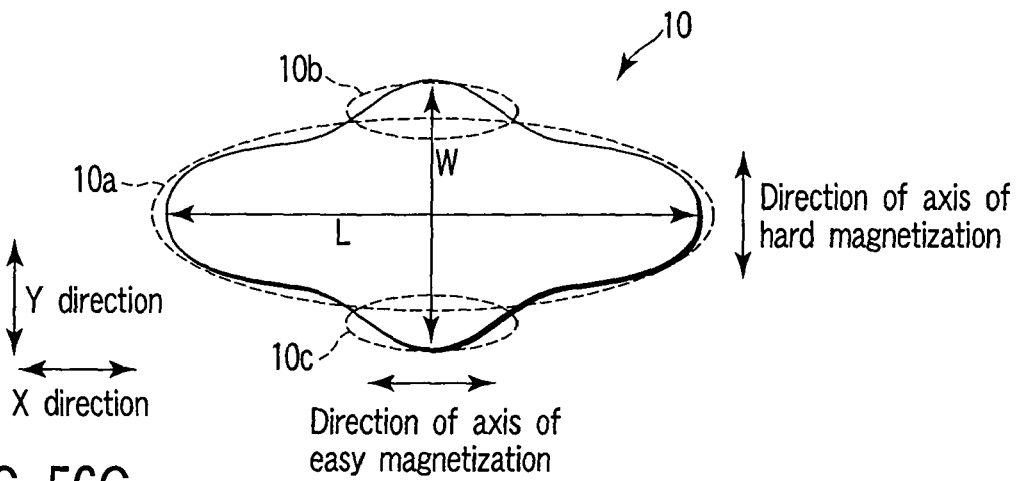
Figure 58A:
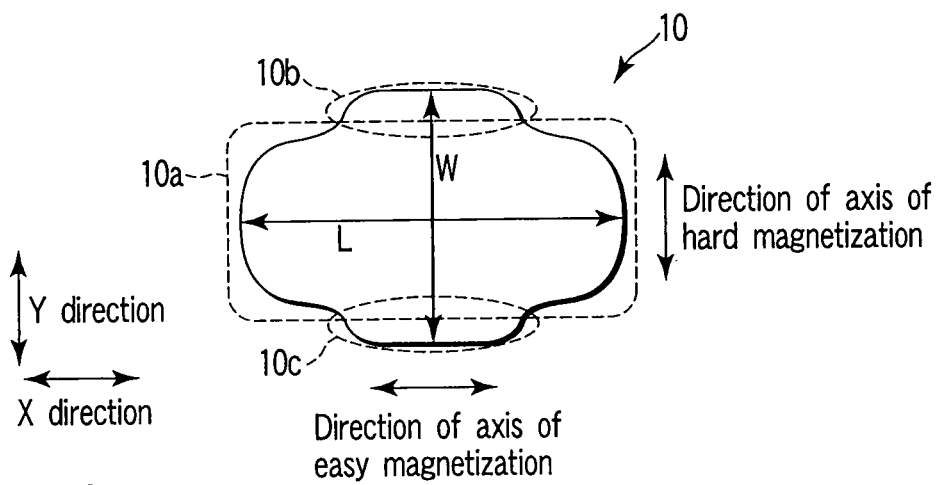
FIGS. 58A to 58C are plan views showing the MTJ elements according to the embodiment of the present invention, which have round corners.
Figure 58B:
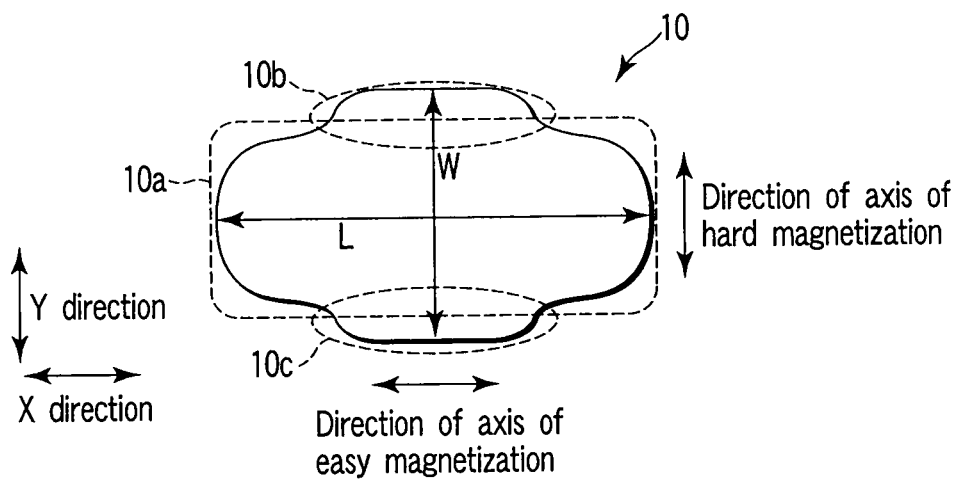
Figure 58C:
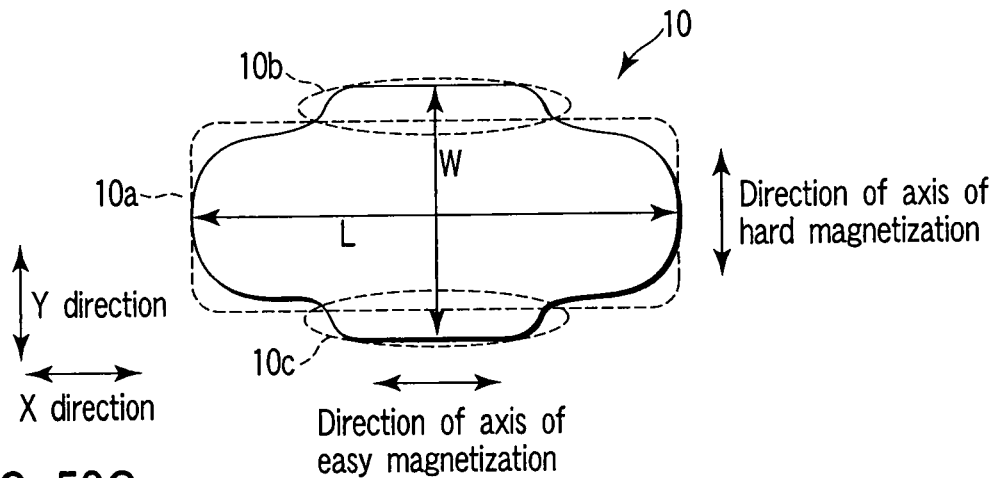
Figure 59A:
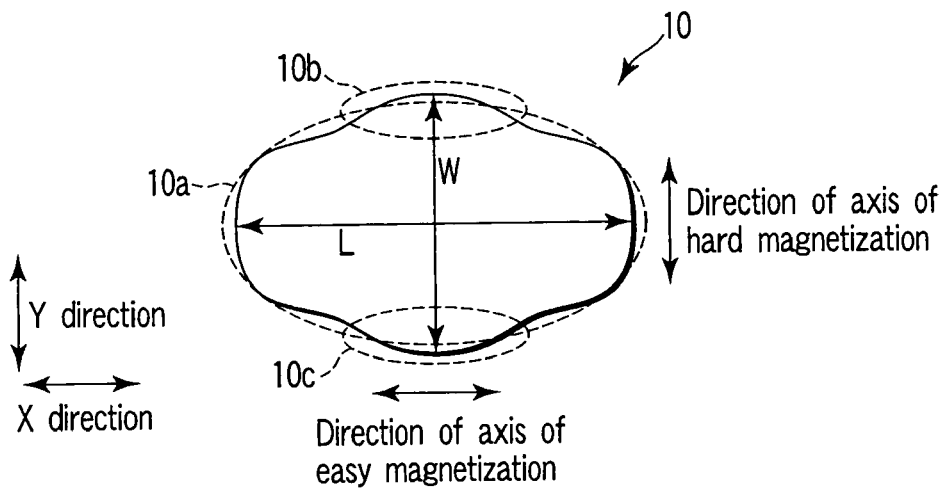
FIGS. 59A to 59C are plan views showing the MTJ elements according to the embodiment of the present invention, which have round corners.
Figure 59B:
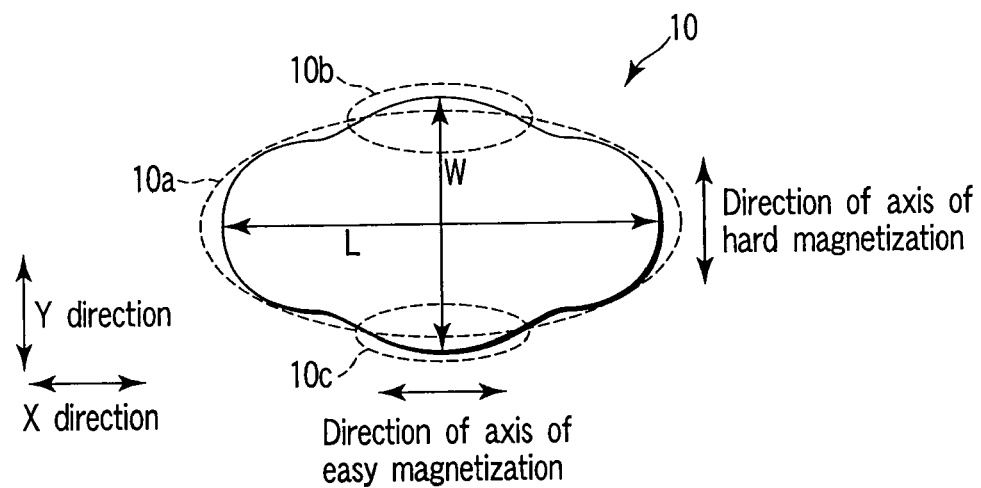
Figure 59C:
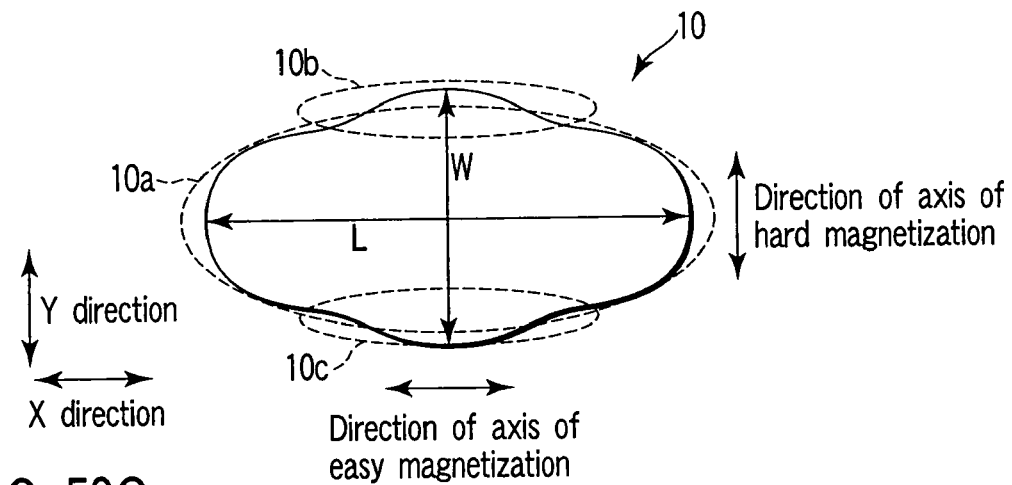
Figure 60A:
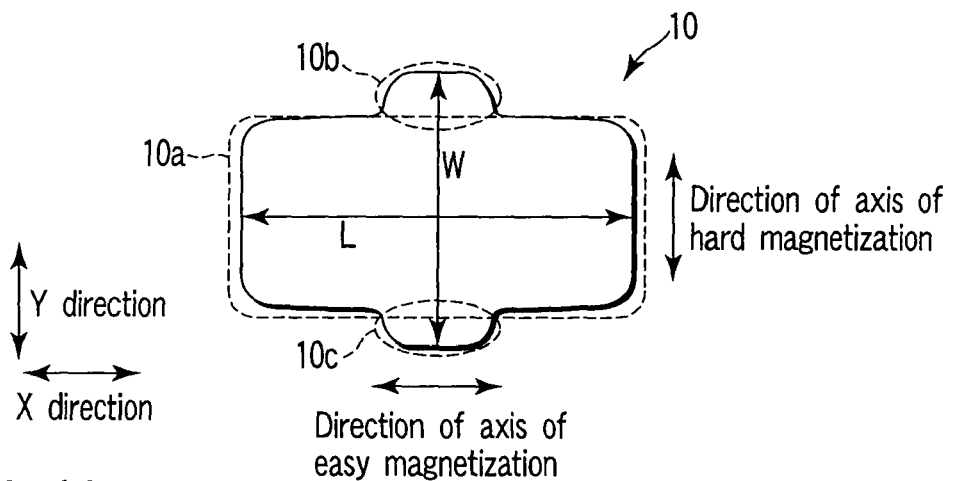
FIGS. 60A to 60C are plan views showing the MTJ elements according to the embodiment of the present invention, which have round corners.
Figure 60B:
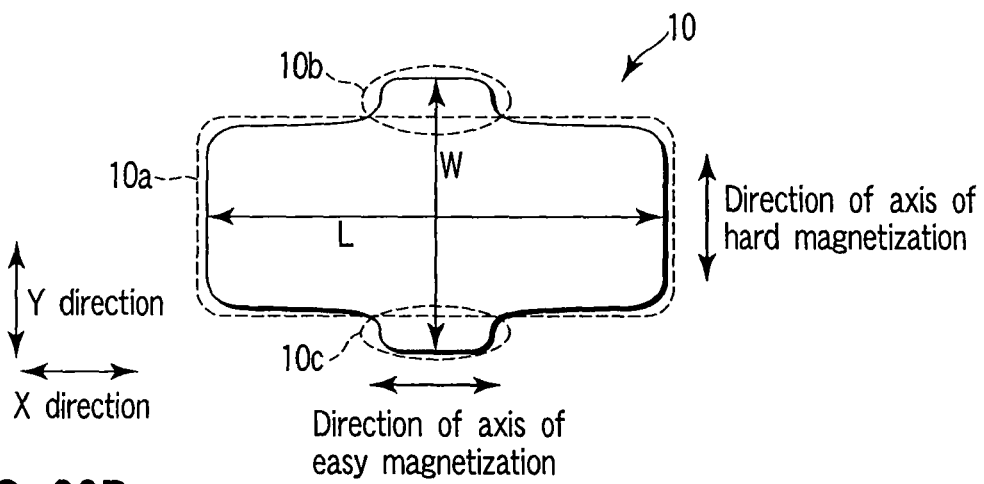
Figure 60C:
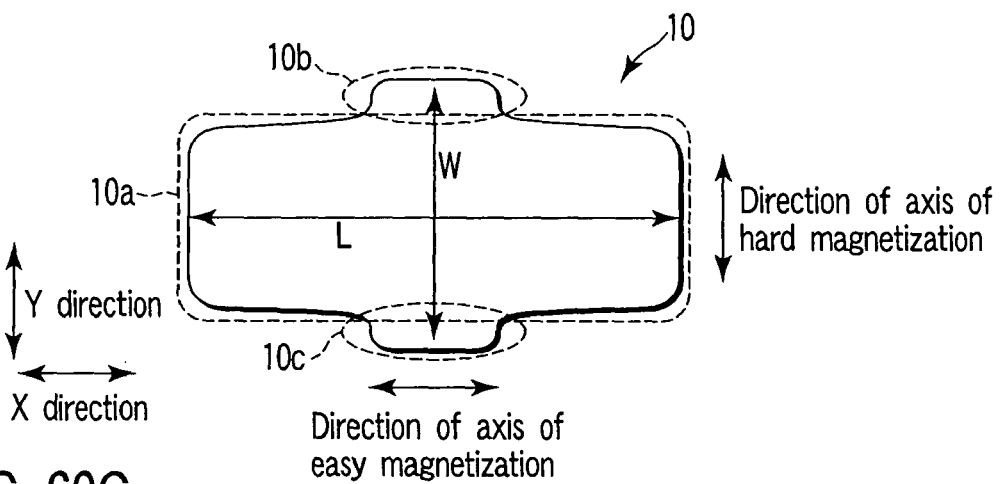
Figure 61A:
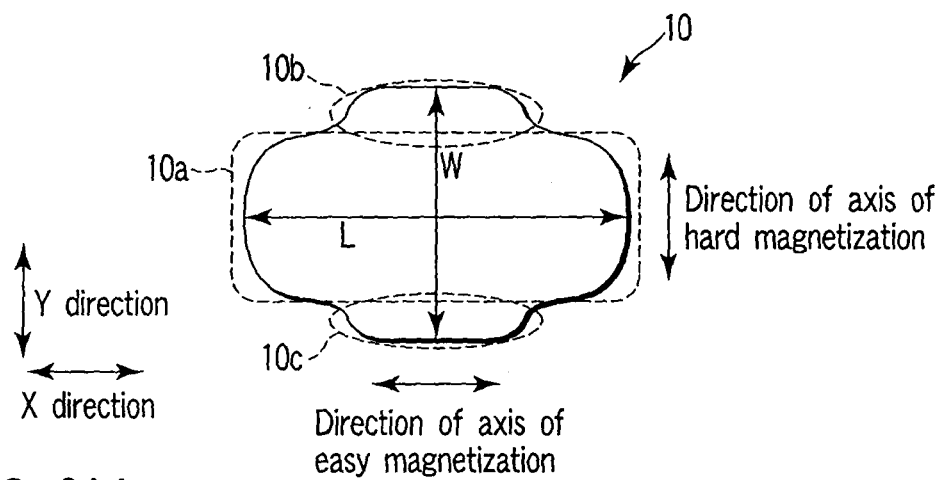
FIGS. 61A to 61C are plan views showing the MTJ elements according to the embodiment of the present invention, which have round corners.
Figure 61B:
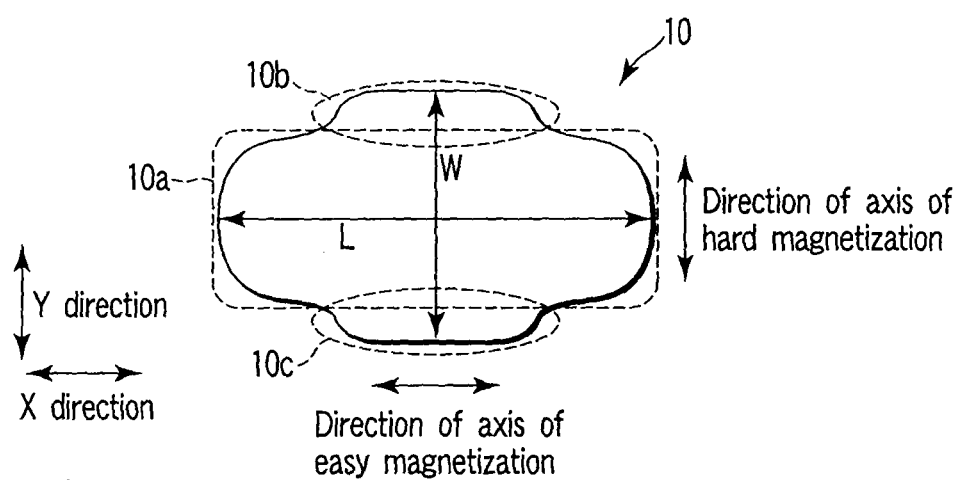
Figure 61C:
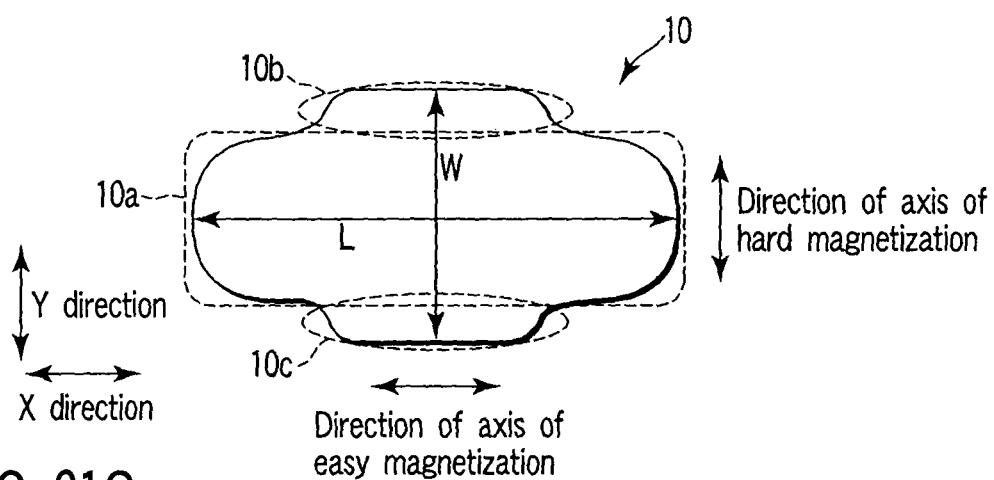
Figure 62A:
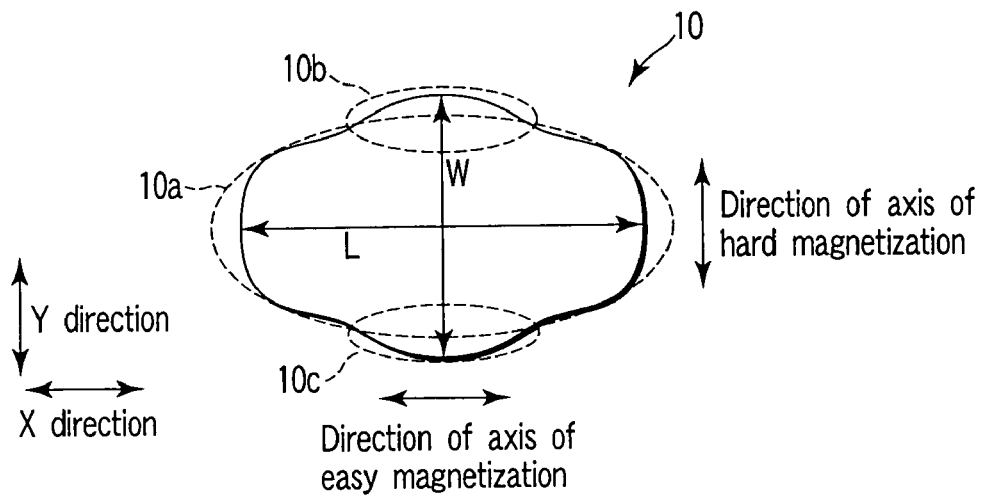
FIGS. 62A to 62C are plan views showing the MTJ elements according to the embodiment of the present invention, which have round corners.
Figure 62B:
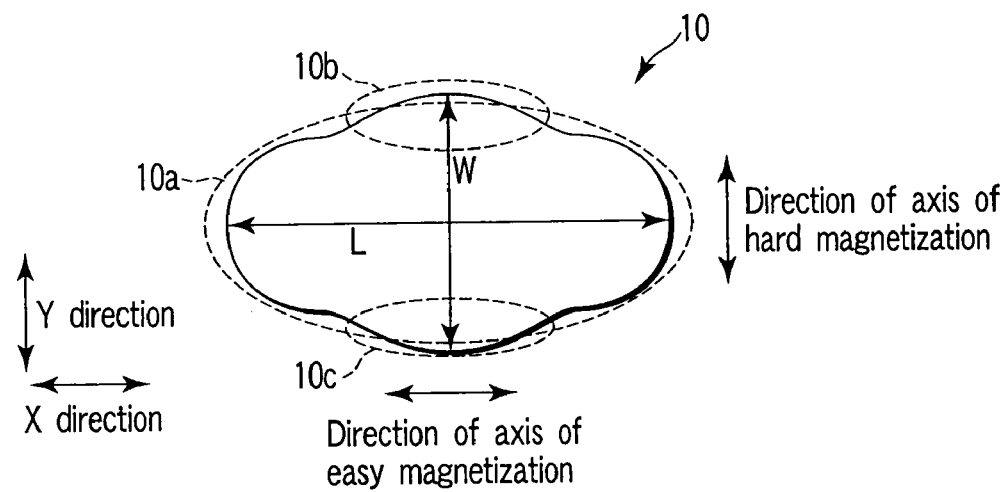
Figure 62C:
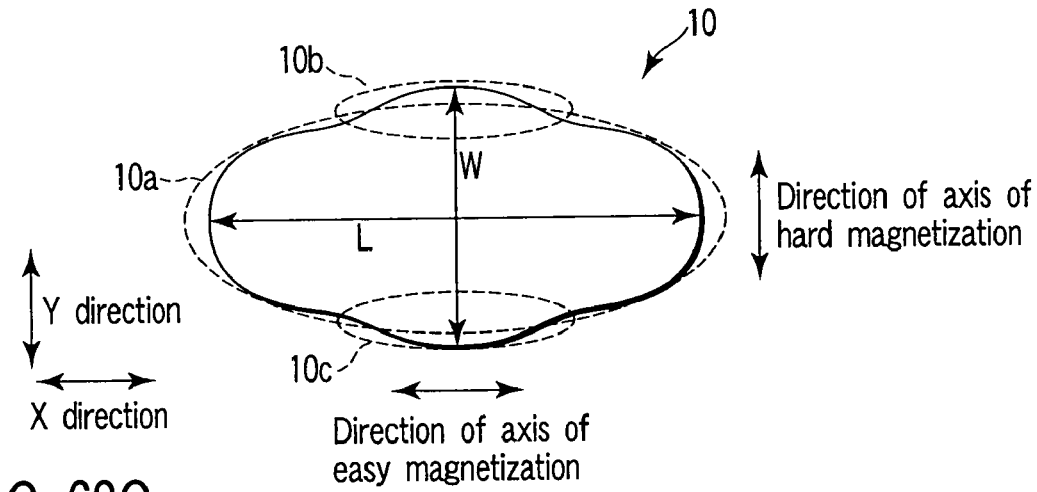

As shown in FIG. 53, the MTJ element 10 includes the long portion 10a running in the X direction and the projecting portions 10b, 10c, and 10d projecting in the Y direction from the side surfaces of the long portion 10a. The plurality of projecting portions 10b and 10d are provided on one surface of the long portion 10a. The number of projecting portions 10b, 10c, and 10d of the MTJ element 10 is not limited to one on each side surface of the long portion 10a. The projecting portions need not always be provided equal in number on the side surfaces of the long portion 10a. The projecting portions 10b, 10c, and 10d preferably project from near the central portions of the side surfaces of the long portion 10a such that the shape becomes as close as possible to a cross. In the planar shape shown in FIG. 53, the length L to define the aspect ratio L/W is defined by the maximum distance which is obtained when the side surfaces at the X-direction ends of the long portion 10a are connected in the X direction (direction of axis of easy magnetization). The width W is defined by the maximum distance which is obtained when the side surfaces at the Y-direction ends of the projecting portions 10b and 10d and the side surface at the Y-direction end of the projecting portion 10c are connected in the Y direction (direction of axis of hard magnetization), not by the maximum distance obtained by connecting the side surfaces obliquely.

As shown in FIGS. 54A, 54B, and 54C to FIGS. 62A, 62B, and 62C, the long portion 10a of the MTJ element 10 may be elliptical. The corners of the long portion 10a and projecting portions 10b and 10c or the bases of the projecting portions 10b and 10c may be round. The sides of the MTJ element 10 may curve. In the planar shapes shown in FIGS. 54A, 54B, and 54C to FIGS. 62A, 62B, and 62C, the length L to define the aspect ratio L/W is defined by the maximum distance which is obtained when the X-direction distal ends of the long portion 10a are connected in the X direction (direction of axis of easy magnetization). The width W is defined by the maximum distance which is obtained when the Y-direction distal end of the projecting portion 10b and the Y-direction distal end of the projecting portion 10c are connected in the Y direction (direction of axis of hard magnetization).

Figure 63:
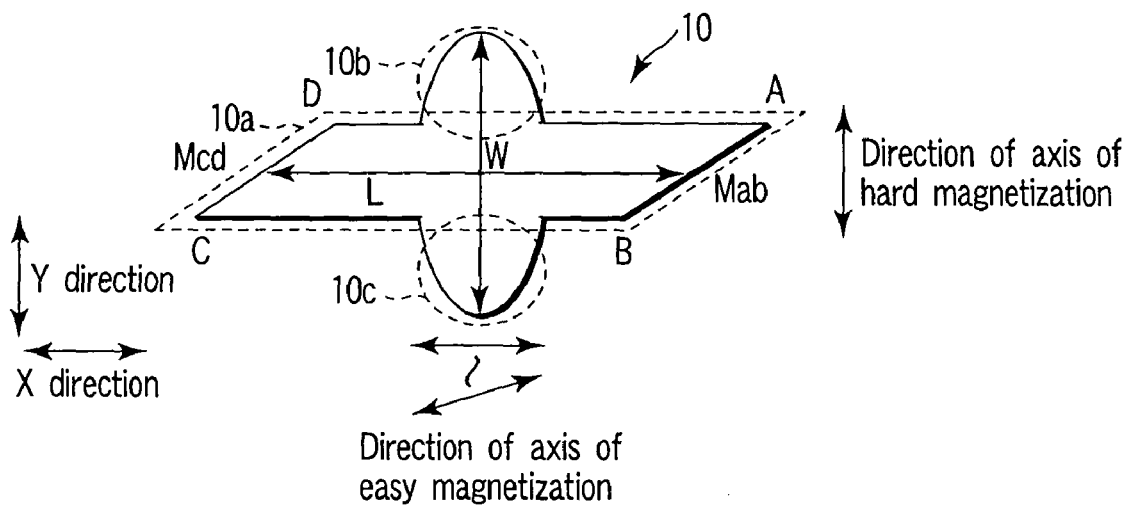
FIG. 63 is a plan view showing the MTJ element according to the embodiment of the present invention, which has a parallelogram-shaped long portion and projecting portions with round corners.

As shown in FIG. 63, the long portion 10a of the MTJ element 10 may have a parallelogram shape, and the corners of the projecting portions 10b and 10c may be round. In the planar shape shown in FIG. 63, the length L to define the aspect ratio L/W is defined by the X-direction maximum distance of the long portion 10a. The width W is defined by the maximum distance which is obtained when the Y-direction distal end of the projecting portion 10b and the Y-direction distal end of the projecting portion 10c are connected in the Y direction (direction of axis of hard magnetization). Let A, B, C, and D be the apexes of the long portion 10a having the parallelogram shape. In this case, the length L is defined by the distance obtained by connecting a median Mab of a side AB and a median Mcd of a side CD. In other words, the length L is defined by a side AD or BC.

Figure 64:
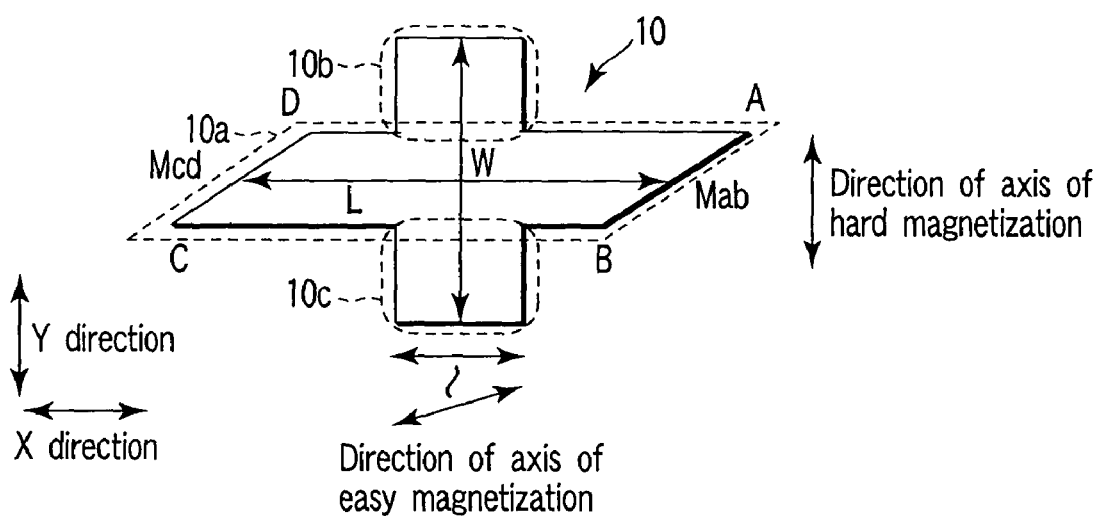
FIG. 64 is a plan view showing the MTJ element according to the embodiment of the present invention, which has a parallelogram-shaped long portion and projecting portions with angular corners.

As shown in FIG. 64, the long portion 10a of the MTJ element 10 may have a parallelogram shape, and the corners of the projecting portions 10b and 10c may be angular. In the planar shape shown in FIG. 64, the length L to define the aspect ratio L/W is defined by the X-direction maximum distance of the long portion 10a. The width W is defined by the maximum distance which is obtained when the side surface at the Y-direction end of the projecting portion 10b and the side surface at the Y-direction end of the projecting portion 10c are connected in the Y direction (direction of axis of hard magnetization). Let A, B, C, and D be the apexes of the long portion 10a having the parallelogram shape. In this case, the length L is defined by the distance obtained by connecting the median Mab of the side AB and the median Mcd of the side CD. In other words, the length L is defined by the side AD or BC.

Figure 65A:
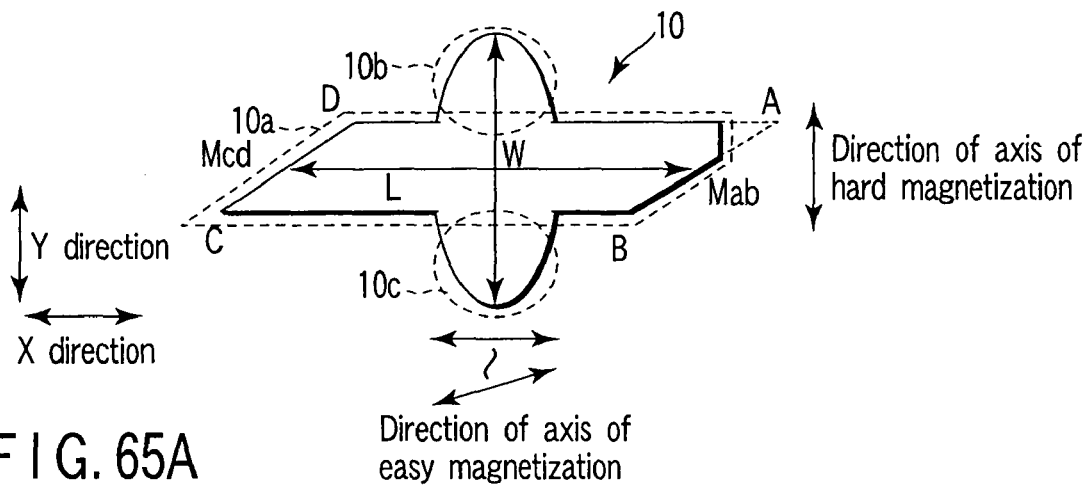
FIGS. 65A to 65C are plan views showing the MTJ elements according to the embodiment of the present invention, which have a parallelogram-shaped long portion with cut or round corners.
Figure 65B:
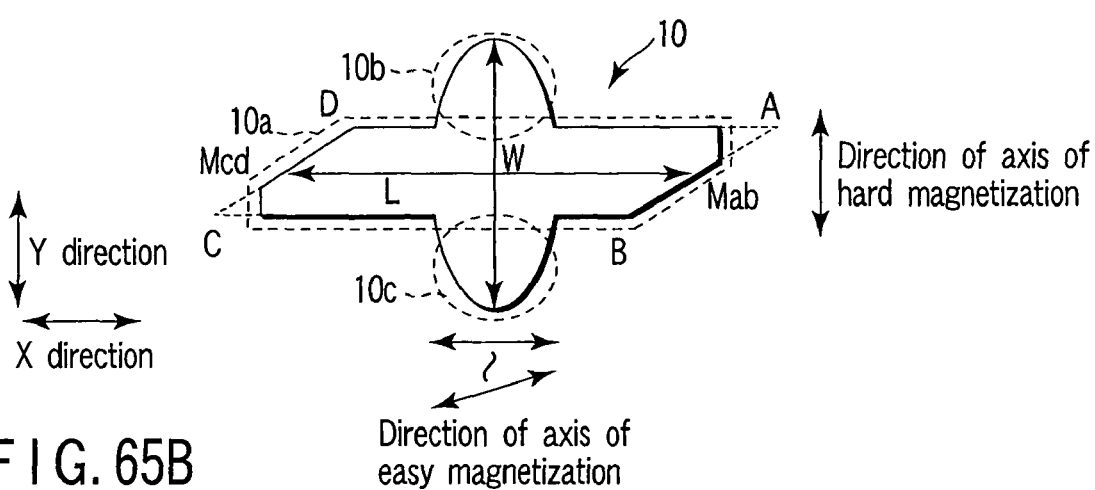
Figure 65C:
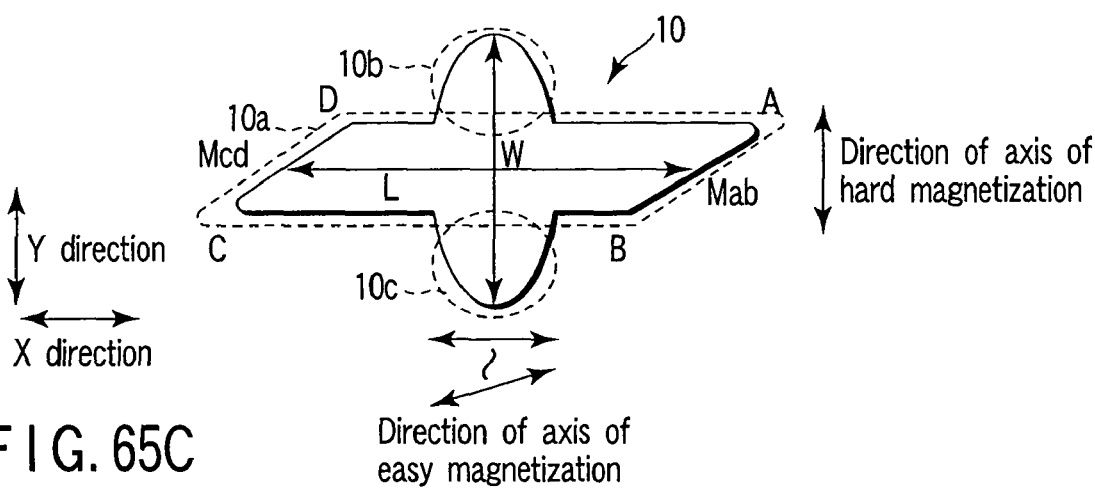

As shown in FIGS. 65A and 65B, the long portion 10a with the shape in FIG. 63 may be cut partially (e.g., at a part of the apex A or at two parts of the opposite apexes A and C). As shown in FIG. 65C, the corners of the long portion 10a may be round. Even when the long portion 10a having the parallelogram shape is partially cut or has round corners, the length L and width W can be defined as in FIG. 63.

In the shapes shown in FIGS. 51 to 62C, the direction of axis of easy magnetization is the X direction, and the direction of axis of hard magnetization is the Y direction. In the shapes shown in FIGS. 63 to 65C, i.e., in the long portion 10a with the parallelogram shape, the direction of axis of hard magnetization is the Y direction. However, the direction of axis of easy magnetization is sometimes the X direction or may be close to the direction to connect the apexes A and C depending on the shape of the parallelogram.

C. Sectional Shape

FIGS. 66A and 66B to FIGS. 68A and 68B are sectional and perspective views of the MTJ elements according to the embodiment of the present invention. The sectional shape of the MTJ element according to the embodiment of the present invention can be changed variously as will be described below.

The MTJ element 10 may have such a sectional shape that all the side surfaces of the antiferromagnetic layer 14, fixed layer 11, nonmagnetic layer 12, and recording layer 13 match continuously. Examples of this structure will be described below. As shown in FIGS. 66A and 66B, the MTJ element may have a rectangular section so that all the antiferromagnetic layer 14, fixed layer 11, nonmagnetic layer 12, and recording layer 13 have the same planar shape. Alternatively, as shown in FIGS. 67A and 67B, the MTJ element may have a trapezoidal section so that the planar shape becomes smaller in the order of the antiferromagnetic layer 14, fixed layer 11, nonmagnetic layer 12, and recording layer 13.

Figure 68A:
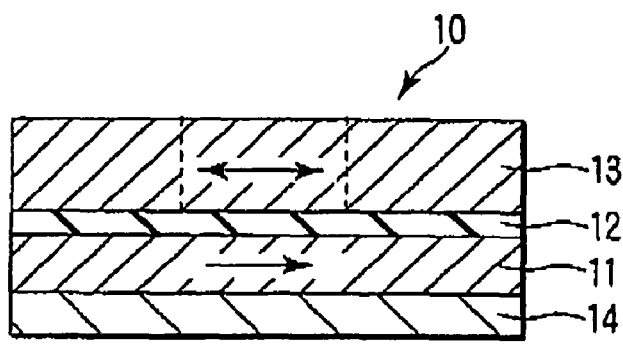
Figure 68B:
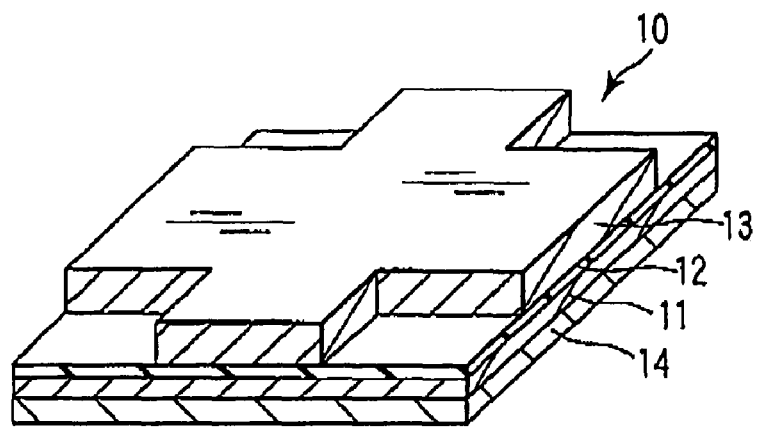

The MTJ element 10 may have such a sectional shape that the side surfaces of the antiferromagnetic layer 14, fixed layer 11, nonmagnetic layer 12, and recording layer 13 are partially discontinuous. An example of this structure will be described below. As shown in FIGS. 68A and 68B, the recording layer 13 has a so-called cross planar shape. The antiferromagnetic layer 14, fixed layer 11, and nonmagnetic layer 12 may have a rectangular planar shape. That is, a convex sectional shape is formed partially. In this structure, the short circuit between the fixed layer 11 and the recording layer 13 can be suppressed as compared to FIGS. 66A, 66B, 67A, and 67B.

D. Tunnel Junction Structure

Figure 69A:
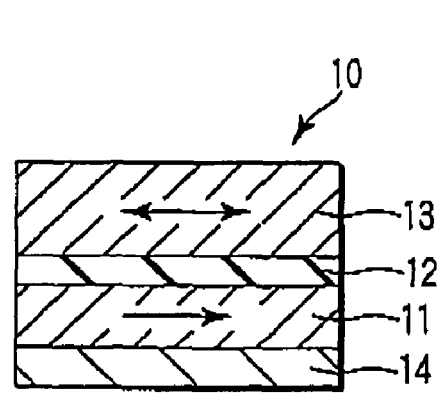
Figure 69B:
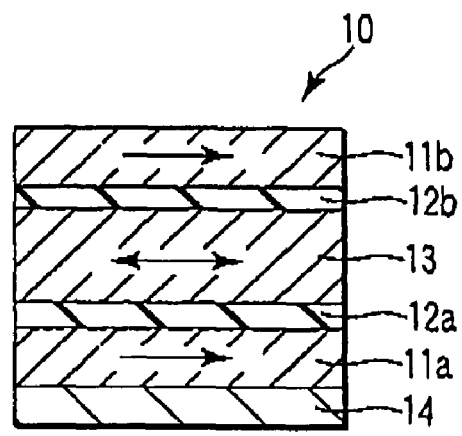

FIGS. 69A and 69B are sectional views showing the tunnel junction structure of the MTJ element according to the embodiment of the present invention. The structure of the MTJ element according to the embodiment of the present invention can be changed variously as will be described below.

As shown in FIGS. 69A and 69B, the MTJ element 10 can have either a single tunnel junction structure or a double tunnel junction structure.

As shown in FIG. 69A, the MTJ element 10 having a single tunnel junction structure has the single nonmagnetic layer 12 functioning as a tunnel junction layer.

As shown in FIG. 69B, the MTJ element 10 having a double tunnel junction structure has two nonmagnetic layers 12a and 12b each functioning as a tunnel junction layer. A first fixed layer 11a is provided at one end of the recording layer 13 via the first nonmagnetic layer 12a. A second fixed layer 11b is provided at the other end of the recording layer 13 via the second nonmagnetic layer 12b. In the double tunnel junction structure, the bias voltage per tunnel junction is ½ the applied voltage as compared to the single tunnel junction structure. Hence, a decrease in magnetoresistive (MR) ratio caused by an increase in bias voltage can be suppressed.

E. Interlayer Exchange Coupling Structure

FIGS. 70A to 70H are sectional views showing the interlayer exchange coupling structures of the MTJ element according to the embodiment of the present invention. The structure of the MTJ element according to the embodiment of the present invention can be changed variously as will be described below.

As shown in FIGS. 70A to 70H, in the MTJ element 10, at least one of the fixed layer 11 and recording layer 13 may have an antiferromagnetic coupling structure or ferromagnetic coupling structure. In the antiferromagnetic coupling structure, two ferromagnetic layers sandwiching a nonmagnetic layer are so coupled by interlayer exchange coupling that the magnetization directions are anti-parallel. In the ferromagnetic coupling structure, two ferromagnetic layers sandwiching a nonmagnetic layer are so coupled by interlayer exchange coupling that the magnetization directions are parallel.

Figure 70A:
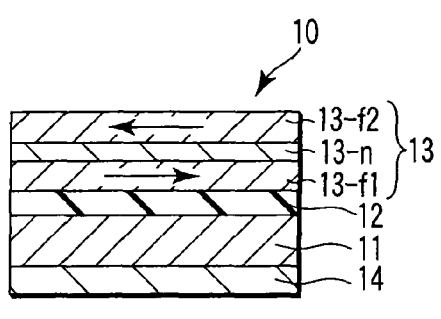
FIGS. 70A to 70H are sectional views showing the interlayer exchange coupling structures of the MTJ element according to the embodiment of the present invention.

In the MTJ element 10 shown in FIG. 70A, the recording layer 13 has the antiferromagnetic coupling structure. More specifically, the recording layer 13 has a three-layer structure of a ferromagnetic layer 13-*f*1/nonmagnetic layer 13-*n*/ferromagnetic layer 13-*f*2. They are magnetically coupled such that the magnetization directions of the ferromagnetic layers 13-*f*1 and 13-*f*2 are set in the anti-parallel state.

Figure 70B:
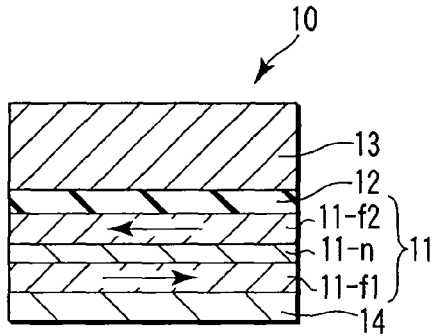

In the MTJ element 10 shown in FIG. 70B, the fixed layer 11 has the antiferromagnetic coupling structure. More specifically, the fixed layer 11 has a three-layer structure of a ferromagnetic layer 11-*f*1/nonmagnetic layer 11-*n*/ferromagnetic layer 11-*f*2. They are magnetically coupled such that the magnetization directions of the ferromagnetic layers 11-*f*1 and 11-*f*2 are set in the anti-parallel state.

Figure 70C:
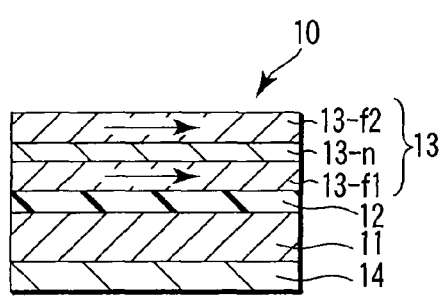

In the MTJ element 10 shown in FIG. 70C, the recording layer 13 has the ferromagnetic coupling structure. More specifically, the recording layer 13 has the three-layer structure of the ferromagnetic layer 13-*f*1/nonmagnetic layer 13-*n*/ferromagnetic layer 13-*f*2. They are magnetically coupled such that the magnetization directions of the ferromagnetic layers 13-*f*1 and 13-*f*2 are set in the parallel state.

Figure 70D:
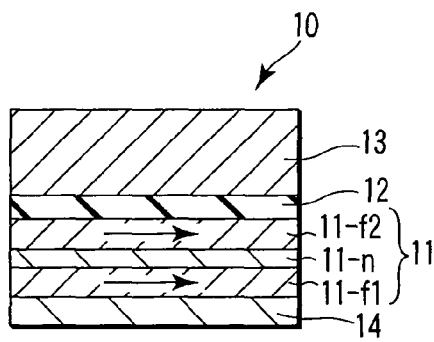

In the MTJ element 10 shown in FIG. 70D, the fixed layer 11 has the ferromagnetic coupling structure. More specifically, the fixed layer 11 has the three-layer structure of the ferromagnetic layer 11-*f*1/nonmagnetic layer 11-*n*/ferromagnetic layer 11-*f*2. They are magnetically coupled such that the magnetization directions of the ferromagnetic layers 11-*f*1 and 11-*f*2 are set in the parallel state.

Figure 70E:
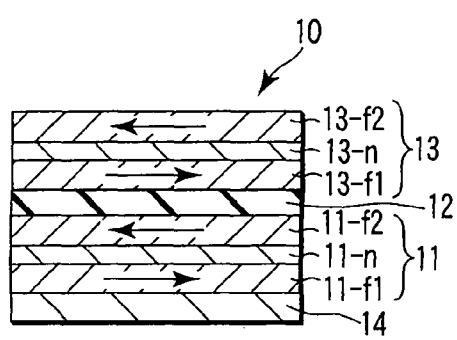

In the MTJ element 10 shown in FIG. 70E, both the recording layer 13 and the fixed layer 11 have the antiferromagnetic coupling structure. More specifically, the recording layer 13 has the three-layer structure of the ferromagnetic layer 13-*f*1/nonmagnetic layer 13-*n*/ferromagnetic layer 13-*f*2. They are magnetically coupled such that the magnetization directions of the ferromagnetic layers 13-*f*1 and 13-*f*2 are set in the anti-parallel state. The fixed layer 11 has the three-layer structure of the ferromagnetic layer 11-*f*1/nonmagnetic layer 11-*n*/ferromagnetic layer 11-*f*2. They are magnetically coupled such that the magnetization directions of the ferromagnetic layers 11-*f*1 and 11-*f*2 are set in the anti-parallel state.

Figure 70F:
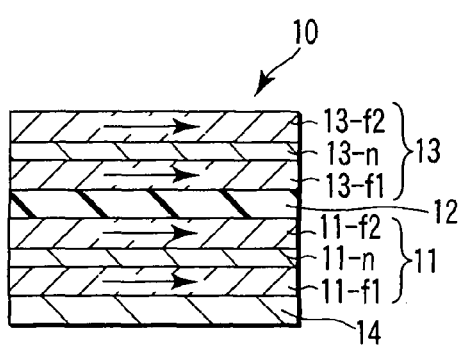

In the MTJ element 10 shown in FIG. 70F, both the recording layer 13 and the fixed layer 11 have the ferromagnetic coupling structure. More specifically, the recording layer 13 has the three-layer structure of the ferromagnetic layer 13-*f*1/nonmagnetic layer 13-*n*/ferromagnetic layer 13-*f*2. They are magnetically coupled such that the magnetization directions of the ferromagnetic layers 13-*f*1 and 13-*f*2 are set in the parallel state. The fixed layer 11 has the three-layer structure of the ferromagnetic layer 11-*f*1/nonmagnetic layer 11-*n*/ferromagnetic layer 11-*f*2. They are magnetically coupled such that the magnetization directions of the ferromagnetic layers 11-*f*1 and 11-*f*2 are set in the parallel state.

Figure 70G:
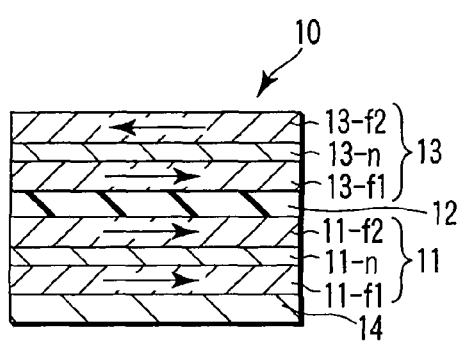

In the MTJ element 10 shown in FIG. 70G, the recording layer 13 has the antiferromagnetic coupling structure, and the fixed layer 11 has the ferromagnetic coupling structure. More specifically, the recording layer 13 has the three-layer structure of the ferromagnetic layer 13-*f*1/nonmagnetic layer 13-*n*/ferromagnetic layer 13-*f*2. They are magnetically coupled such that the magnetization directions of the ferromagnetic layers 13-*f*1 and 13-*f*2 are set in the anti-parallel state. The fixed layer 11 has the three-layer structure of the ferromagnetic layer 11-*f*1/nonmagnetic layer 11-*n*/ferromagnetic layer 11-*f*2. They are magnetically coupled such that the magnetization directions of the ferromagnetic layers 11-*f*1 and 11-*f*2 are set in the parallel state.

Figure 70H:
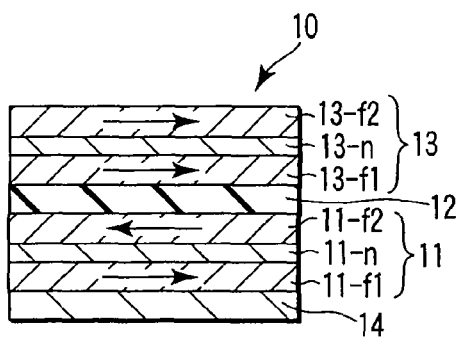

In the MTJ element 10 shown in FIG. 70H, the recording layer 13 has the ferromagnetic coupling structure, and the fixed layer 11 has the antiferromagnetic coupling structure. More specifically, the recording layer 13 has the three-layer structure of the ferromagnetic layer 13-*f*1/nonmagnetic layer 13-*n*/ferromagnetic layer 13-*f*2. They are magnetically coupled such that the magnetization directions of the ferromagnetic layers 13-*f*1 and 13-*f*2 are set in the parallel state. The fixed layer 11 has the three-layer structure of the ferromagnetic layer 11-*f*1/nonmagnetic layer 11-*n*/ferromagnetic layer 11-*f*2. They are magnetically coupled such that the magnetization directions of the ferromagnetic layers 11-*f*1 and 11-*f*2 are set in the anti-parallel state.

As described above, according to the MTJ element 10 in which at least one of the fixed layer 11 and recording layer 13 has an interlayer exchange coupling, the leakage field can be reduced as compared to a structure having the fixed layer 11 and recording layer 13 with a single-layer structure.

The thickness T of the recording layer 13 preferably satisfies expression (1). When the recording layer 13 has a multilayered structure like an interlayer exchange coupling structure, the total thickness T of the multiple layers included in the recording layer 13 (the total thickness T of the three layers: ferromagnetic layer 13-*f*1/nonmagnetic layer 13-*n*/ferromagnetic layer 13-*f*2 in the interlayer exchange coupling structure) is preferably 5 to 20 nm (both inclusive) so that expression (1) is satisfied.

Referring to FIGS. 70A to 70H, the MTJ elements 10 having the single tunnel junction structure have been exemplified. However, the present invention can also be applied to the MTJ element 10 with the double tunnel junction structure. The fixed layer 11 or recording layer 13 need not always include the three-layer structure of the ferromagnetic layer/nonmagnetic layer/ferromagnetic layer, and the number of layers may be increased. The fixed layer 11 or recording layer 13 may have a layered structure including a plurality of ferromagnetic materials.

F. Material

The following ferromagnetic materials are used for the fixed layer 11 and recording layer 13. For example, Fe, Co, Ni, a layered film thereof, an alloy thereof, magnetite having a high spin polarizability, an oxide such as $CrO_2$ or $RXMnO_{3-Y}$(R: rare earth, X: Ca, Ba, or Sr), or a Heusler alloy such as NiMnSb or PtMnSb is preferably used. The magnetic materials may contain a small amount of a nonmagnetic element such as Ag, Cu, Au, Al, Mg, Si, Bi, Ta, B, C, O, N, Pd, Pt, Zr, Ir, W, Mo, or Nb as long as the ferromagnetism is not lost.

As the material of the antiferromagnetic layer 14, for example, Fe—Mn, Pt—Mn, Pt—Cr—Mn, Ni—Mn, Ir—Mn, NiO, or $Fe_2O_3$ is preferably used.

As the material of the nonmagnetic layer 12, various dielectric materials such as $Al_2O_3$, $SiO_2$, MgO, AlN, $Bi_2O_3$, $MgF_2$, $CaF_2$, $SrTiO_2$, or $AlLaO_3$ can be used. These dielectric materials may contain oxygen, nitrogen, or fluorine defects.

In the above-described interlayer exchange coupling structure, a nonmagnetic metal material such as Cu, Au, Ru, or Al is preferably used for the nonmagnetic layer sandwiched between the two ferromagnetic layers.

G. Examples

Example 1

Figure 71:
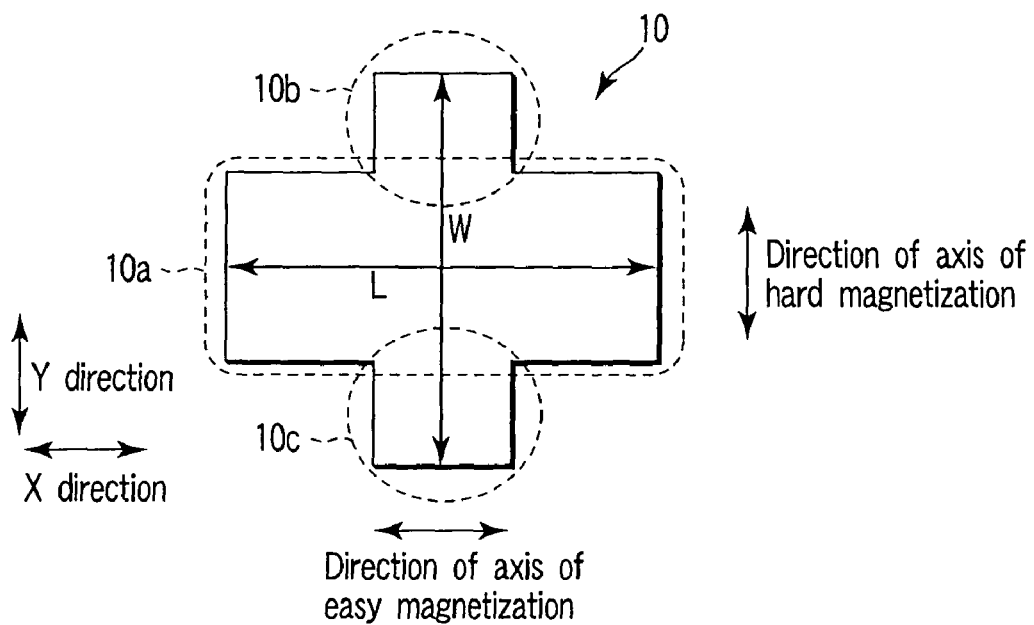
FIG. 71 is a plan view showing an MTJ element according to Example 1 of the present invention.

FIG. 71 is a plan view showing an MTJ element according to Example 1 of the present invention. The MTJ element of Example 1 will be described below.

As shown in FIG. 71, an MTJ element 10 has a so-called cross shape including a long portion 10a and projecting portions 10b and 10c. In the MTJ element 10, a maximum width W in the Y direction (direction of axis of hard magnetization) is 0.48 μm. A maximum length L in the X direction (direction of axis of easy magnetization) is 0.79 μm. An aspect ratio L/W is about 1.65. A thickness T of a recording layer 13 is 5 or 8 nm.

Figure 72:
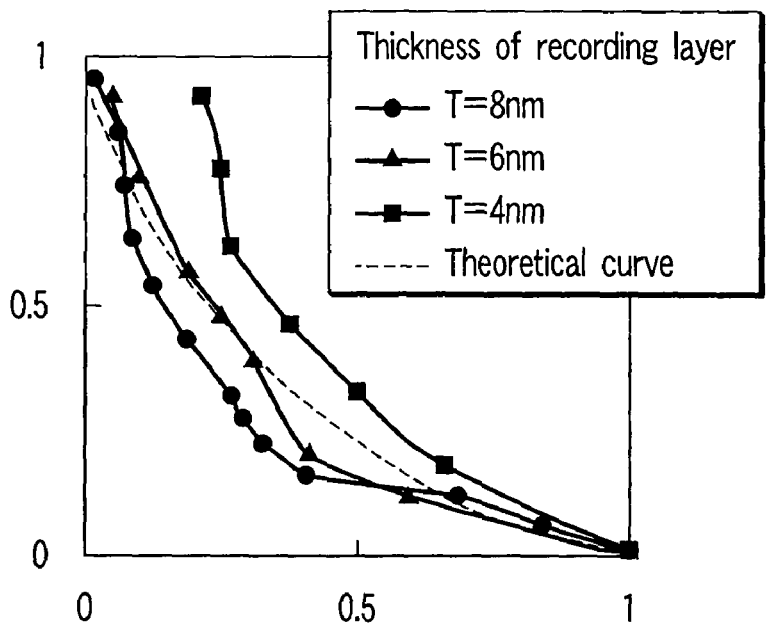
FIG. 72 is a graph showing asteroid curves when the thickness of the recording layer was changed in the MTJ element having the planar shape shown in FIG. 71.

FIG. 72 shows asteroid curves when the thickness T of the recording layer 13 was changed to 3.5 nm, 5 nm, and 8 nm in a memory cell having the planar shape shown in FIG. 71. The asteroid curve was normalized by setting the reversal field in the easy-axis direction to 1. The broken line in FIG. 72 indicates a theoretical asteroid curve in a coherent rotation model. An NiFe alloy was used as the material of the recording layer 13.

As shown in FIG. 72, the asteroid curve of a memory cell in which the thickness T of the recording layer 13 is 3.5 nm is plotted outside the theoretical curve (broken line). To the contrary, the asteroid curves of memory cells, in which the thickness T of the recording layer 13 is 5 nm or 8 nm, i.e., within the range defined by the present invention (expression (1)), are plotted inside the theoretical curve (broken line). As can be seen from this result, a write field Hsw much smaller than an easy-axis write field Hc can be implemented.

Example 2

Figure 73:
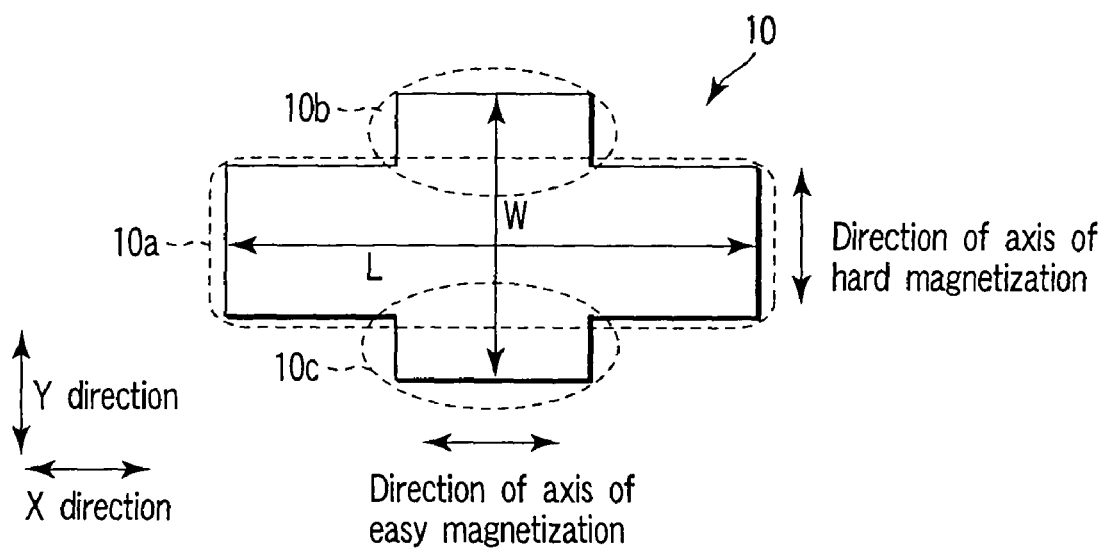
FIG. 73 is a plan view showing an MTJ element according to Example 2 of the present invention.

FIG. 73 is a plan view showing an MTJ element according to Example 2 of the present invention. The MTJ element of Example 2 will be described below.

As shown in FIG. 73, an MTJ element 10 has a so-called cross shape, like Example 1. However, the shape is longer than Example 1. In the MTJ element 10, a maximum width W in the Y direction (direction of axis of hard magnetization) is 0.35 μm. A maximum length L in the X direction (direction of axis of easy magnetization) is 0.72 μm. An aspect ratio L/W is about 2.06. A thickness T of a recording layer 13 is 5 or 8 nm.

Figure 74:
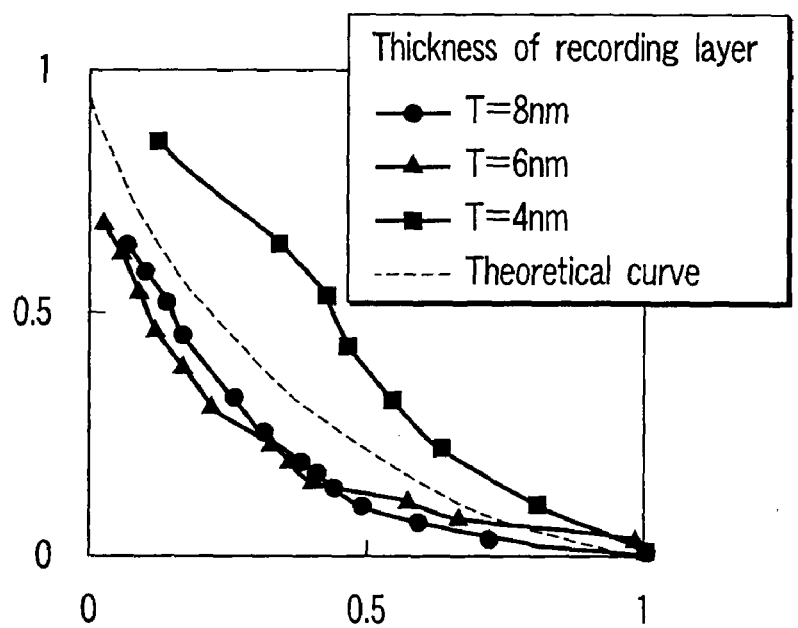
FIG. 74 is a graph showing asteroid curves when the thickness of the recording layer was changed in the MTJ element having the planar shape shown in FIG. 73.

FIG. 74 shows asteroid curves when the thickness T of the recording layer 13 was changed to 3.5 nm, 5 nm, and 8 nm in a memory cell having the planar shape shown in FIG. 73. The asteroid curve was normalized by setting the reversal field in the easy-axis direction to 1. The broken line in FIG. 74 indicates a theoretical asteroid curve in a coherent rotation model. An NiFe alloy was used as the material of the recording layer 13.

As shown in FIG. 74, the asteroid curve of a memory cell in which the thickness T of the recording layer 13 is 3.5 nm is plotted outside the theoretical curve (broken line). To the contrary, the asteroid curves of memory cells, in which the thickness T of the recording layer 13 is 5 nm or 8 nm, i.e., within the range defined by the present invention (expression (1)), are plotted inside the theoretical curve (broken line). As can be seen from this result, even when the width W or length L is changed in the MTJ element 10 having the so-called cross shape, a write field Hsw much smaller than an easy-axis write field Hc can be implemented by setting the thickness T of the recording layer 13 within the range defined by the present invention (expression (1)).

In both of Examples 1 and 2, when the thickness T of the recording layer 13 was 5 or 8 nm, the thermal fluctuation constant was 1.5 times or 2 times that at the thickness of 3.5 nm so that the thermal stability increased.

H. Manufacturing Method Examples

Examples of a method of manufacturing the MTJ element 10 having the above-described shape will be described below.

Manufacturing Method Example 1

In Manufacturing Method Example 1, a method of manufacturing an MTJ element 10 with a general size will be described.

An MTJ material layer is formed by sputtering. A resist is applied to the upper surface of the MTJ material layer. A pattern is formed by using one of light, electron beam, and X-rays. A resist pattern is formed by development. The MTJ material layer is subjected to ion milling or etching using the resist pattern as a mask to form the MTJ element 10 with a desired shape. Then, the resist is removed.

Manufacturing Method Example 2

In Manufacturing Method Example 2, a method of manufacturing an MTJ element 10 with a relatively large size on the order of, e.g., micron will be described.

An MTJ material layer is formed by sputtering. A hard mask of, e.g., silicon oxide or silicon nitride is formed on the MTJ material layer. The hard mask is etched by reactive ion etching (RIE) to form a hard mask pattern having a desired shape. The MTJ material layer is subjected to ion milling using the hard mask pattern to form the MTJ element 10 with a desired shape.

Manufacturing Method Example 3

In Manufacturing Method Example 3, a method of manufacturing a smaller element, i.e., an MTJ element 10 with a submicron size of, e.g., about 2 to 3 μm to 0.1 μm will be described. To process an MTJ element with such a size, photolithography can be used as will be described below.

An MTJ material layer is formed by sputtering. A hard mask of, e.g., silicon oxide or silicon nitride is formed on the MTJ material layer. The hard mask is etched by reactive ion etching (RIE) to form a hard mask pattern having a desired shape. The MTJ material layer is etched by photolithography using the hard mask pattern as a mask to form the MTJ element 10 with a desired shape.

Manufacturing Method Example 4

In Manufacturing Method Example 4, a method of manufacturing an MTJ element 10 with a smaller size of, e.g., 0.5 μm or less will be described. To process an MTJ element with such a very small size, electron beam exposure can be used.

In this case, since the element itself is very small, a shaped portion to extend the edge domain region according to the embodiment of the present invention becomes smaller. It is therefore very difficult to manufacture the MTJ element 10.

To obtain a desired shape according to the embodiment of the present invention, the proximity effect correction of an electron beam is used. Proximity effect correction is normally used to form an accurate pattern by correcting an intra-graphic proximity effect generated by back scattering of an electron beam from a substrate. Proximity effect correction is executed in, e.g., the following way. In forming, e.g., a rectangular pattern, the stored charge amount is insufficient near the apexes of the rectangle so that they are rounded. To make the apexes sharp, a correction point beam is injected near the apexes and, more particularly, outside the graphic of an element with a size of 0.5 μm or less to increase the stored charge amount. With this process, a normal pattern can be obtained.

In Manufacturing Method Example 4, the shape of a wide element end is formed in the following manner by using the above-described proximity effect correction method of an electron beam. To form, e.g., a so-called cross shape, a rectangle is defined as the basic pattern. When a correction point beam is injected near two apexes facing each other, the shape of a wide element end can be formed. At this time, the shape is preferably corrected more than recovering the apexes by increasing the injection charge amount as compared to the normal proximity effect correction, appropriately correcting the correction point beam injection position, or using both the methods. To form, e.g., a so-called cross shape, a plurality of points can also be irradiated with a correction point beam.

(2) Magnetic Random Access Memory

A magnetic random access memory according to the embodiment of the present invention will be described below.

The above-described MTJ element 10 according to the embodiment of the present invention can suitably be used as the storage element of a memory cell in a magnetic random access memory. In general, a magnetic random access memory which uses a magnetic material for a recording layer is required to prevent any write error in an adjacent cell and, even in a small-sized memory cell, have a thermally stable recording layer to hold recorded information for a long time. When the above-described MTJ element 10 according to the embodiment of the present invention is used, a memory cell capable of reducing the switching field and having a sufficiently large thermal fluctuation constant can be provided. For this reason, the write current necessary in writing a storage bit can be made small.

As examples of the memory cell structure of the magnetic random access memory, A. Select Transistor Cell, B. Select Diode Cell, C. Cross-Point Cell, and D. Toggle Cell will be described here.

A. Select Transistor Cell

FIGS. 75A and 75B show select transistor memory cells of the magnetic random access memory according to the embodiment of the present invention. The select transistor cell structure will be described below.

As shown in FIGS. 75A and 75B, one cell MC having a select transistor structure includes one MTJ element 10, a transistor (e.g., MOS transistor) Tr connected to the MTJ element, a bit line (BL) 28, and a word line (WWL) 26. A memory cell array MCA is formed by laying out a plurality of memory cells MC in an array.

More specifically, one terminal of the MTJ element 10 is connected to one end (drain diffusion layer) 23a of the current path of the transistor Tr through a base metal layer 27, contacts 24a, 24b, and 24c, and interconnections 25a and 25b. The other terminal of the MTJ element 10 is connected to the bit line 28. The write word line 26 electrically disconnected from the MTJ element 10 is provided under the MTJ element 10. The other end (source diffusion layer) 23b of the current path of the transistor Tr is connected to, e.g., ground through a contact 24d and interconnection 25c. A gate electrode 22 of the transistor Tr functions as a read word line (RWL).

One terminal of the MTJ element 10 on the side of the base metal layer 27 is, e.g., the fixed layer 11. The other terminal of the MTJ element 10 on the side of the bit line 28 is, e.g., the recording layer 13. The arrangement may be reversed, as a matter of course. For example, a hard mask may be inserted between the MTJ element 10 and the bit line 28. The axis of easy magnetization of the MTJ element 10 can be arranged in various directions with respect to the running direction of the write interconnection. For example, the axis of easy magnetization can be arranged either in the running direction of the bit line 28 or in the running direction of the word line 26. The axis of easy magnetization can also be tilted by, e.g., 45° with respect to the running directions of the bit line 28 and word line 26.

In the above-described select transistor memory cell, the data write and read are executed in the following way.

The write operation is executed in the following manner. The bit line 28 and write word line 26 corresponding to a selected one of the plurality of MTJ elements 10 are selected. Write currents Iw1 and Iw2 are supplied to the selected bit line 28 and write word line 26, respectively. A synthetic field H by the write currents Iw1 and Iw2 is applied to the MTJ element 10. The magnetization of the recording layer 13 of the MTJ element 10 is reversed to set a state wherein the magnetization directions of the fixed layer 11 and recording layer 13 are parallel or anti-parallel. When the parallel state is defined as, e.g., a "1" state, and the anti-parallel state is defined as a "0" state, a binary data write is implemented.

The read operation is executed in the following way by using the transistor Tr which functions as a read switching element. The bit line 28 and read word line (RWL) corresponding to the selected MTJ element 10 are selected. A read current Ir which tunnels through the nonmagnetic layer 12 of the MTJ element 10 is supplied. The junction resistance value changes in proportion to the cosine of the relative angle between the magnetization of the fixed layer 11 and that of the recording layer 13. When the magnetization of the MTJ element 10 is in the parallel state (e.g., "1" state), the resistance is low. When the magnetization is in the anti-parallel state (e.g., "0" state), the resistance is high. That is, the tunnel magnetoresistive (TMR) effect is obtained. The "1" or "0" state of the MTJ element 10 is discriminated by reading the difference in resistance value.

B. Select Diode Cell

Figure 76A:
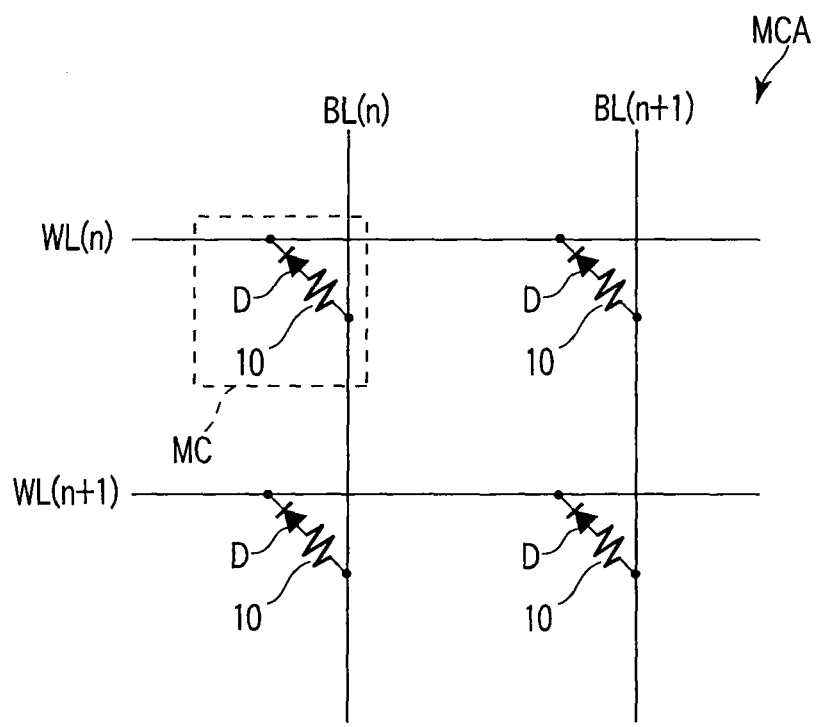
Figure 76B:
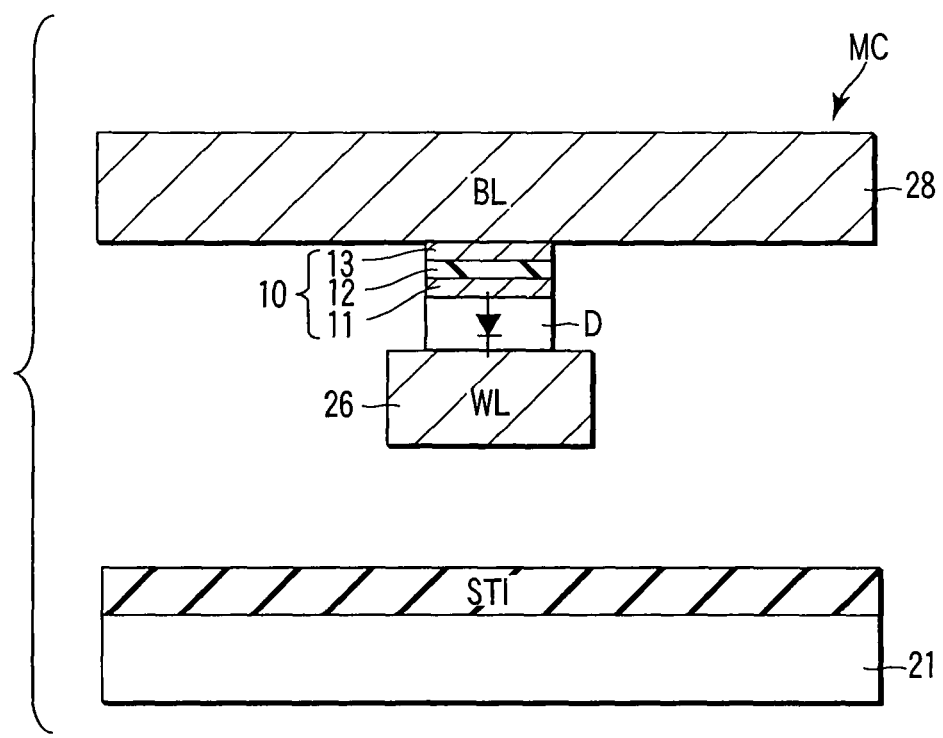

FIGS. 76A and 76B show select diode memory cells of the magnetic random access memory according to the embodiment of the present invention. The select diode cell structure will be described below.

As shown in FIGS. 76A and 76B, one cell MC having a select diode structure includes one MTJ element 10, a diode D connected to the MTJ element, the bit line (BL) 28, and the word line (WL) 26. The memory cell array MCA is formed by laying out a plurality of memory cells MC in an array.

The diode D is, e.g., a p-n junction diode including a p-type semiconductor layer and an n-type semiconductor layer. One terminal (e.g., p-type semiconductor layer) of the diode D is connected to the MTJ element 10. The other terminal (e.g., n-type semiconductor layer) of the diode D is connected to the word line 26. In the structure shown in FIGS. 76A and 76B, a current flows from the bit line 28 to the word line 26.

The location or direction of the diode D can be changed variously. For example, the diode D may be arranged in a direction to supply a current from the word line 26 to the bit line 28. The diode D may be formed in a semiconductor substrate 21. The diode D may have the same shape (e.g., a so-called cross shape) as the MTJ element 10.

The data write operation of the select diode memory cell is the same as that of the above-described select transistor cell. The write currents Iw1 and Iw2 are supplied to the bit line 28 and word line 26 to set the magnetization of the MTJ element 10 in the parallel or anti-parallel state.

The data read operation is also almost the same as that of the select transistor cell. In the select diode cell, the diode D is used as a read switching element. More specifically, the biases of the bit line 28 and word line 26 are controlled by using the rectifying effect of the diode D such that an unselected MTJ element 10 is reverse-biased. Accordingly, the read current Ir is supplied to only the selected MTJ element 10.

C. Cross-Point Cell

Figure 77A:
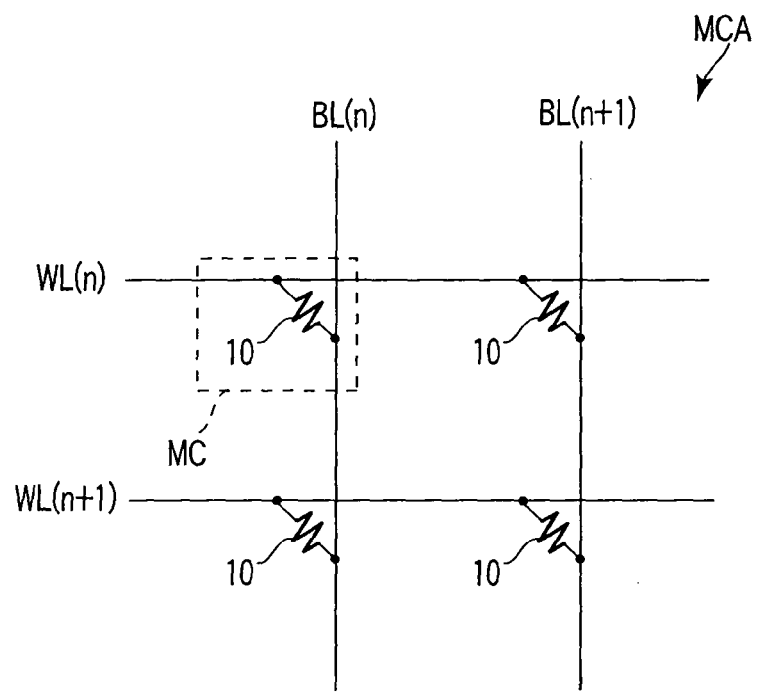
Figure 77B:
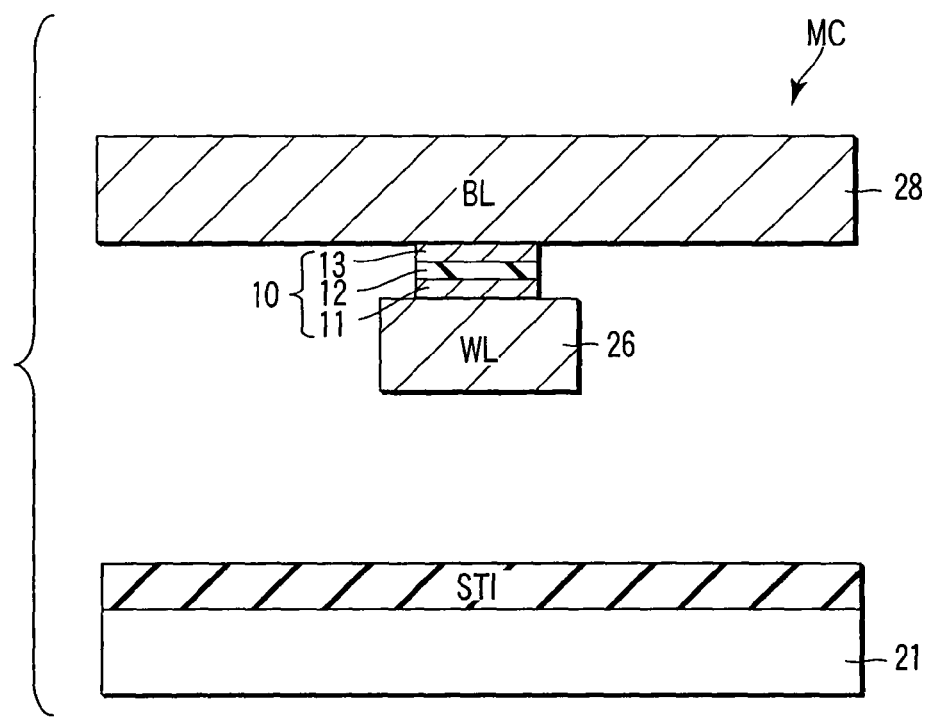

FIGS. 77A and 77B show cross-point memory cells of the magnetic random access memory according to the embodiment of the present invention. The cross-point cell structure will be described below.

As shown in FIGS. 77A and 77B, one cell MC having a cross-point structure includes one MTJ element 10, the bit line 28, and the word line 26. The memory cell array MCA is formed by laying out a plurality of memory cells MC in an array.

More specifically, the MTJ element 10 is arranged near the intersection between the bit line 28 and the word line 26. One terminal of the MTJ element 10 is connected to the word line 26. The other terminal of the MTJ element 10 is connected to the bit line 28.

The data write operation of the cross-point memory cell is the same as that of the above-described select transistor cell. The write currents Iw1 and Iw2 are supplied to the bit line 28 and word line 26 to set the magnetization of the MTJ element 10 in the parallel or anti-parallel state. In the data read operation, the read current Ir is supplied to the bit line 28 and word line 26 connected to the selected MTJ element 10, thereby reading out the data of the MTJ element 10.

D. Toggle Cell

Figure 78:
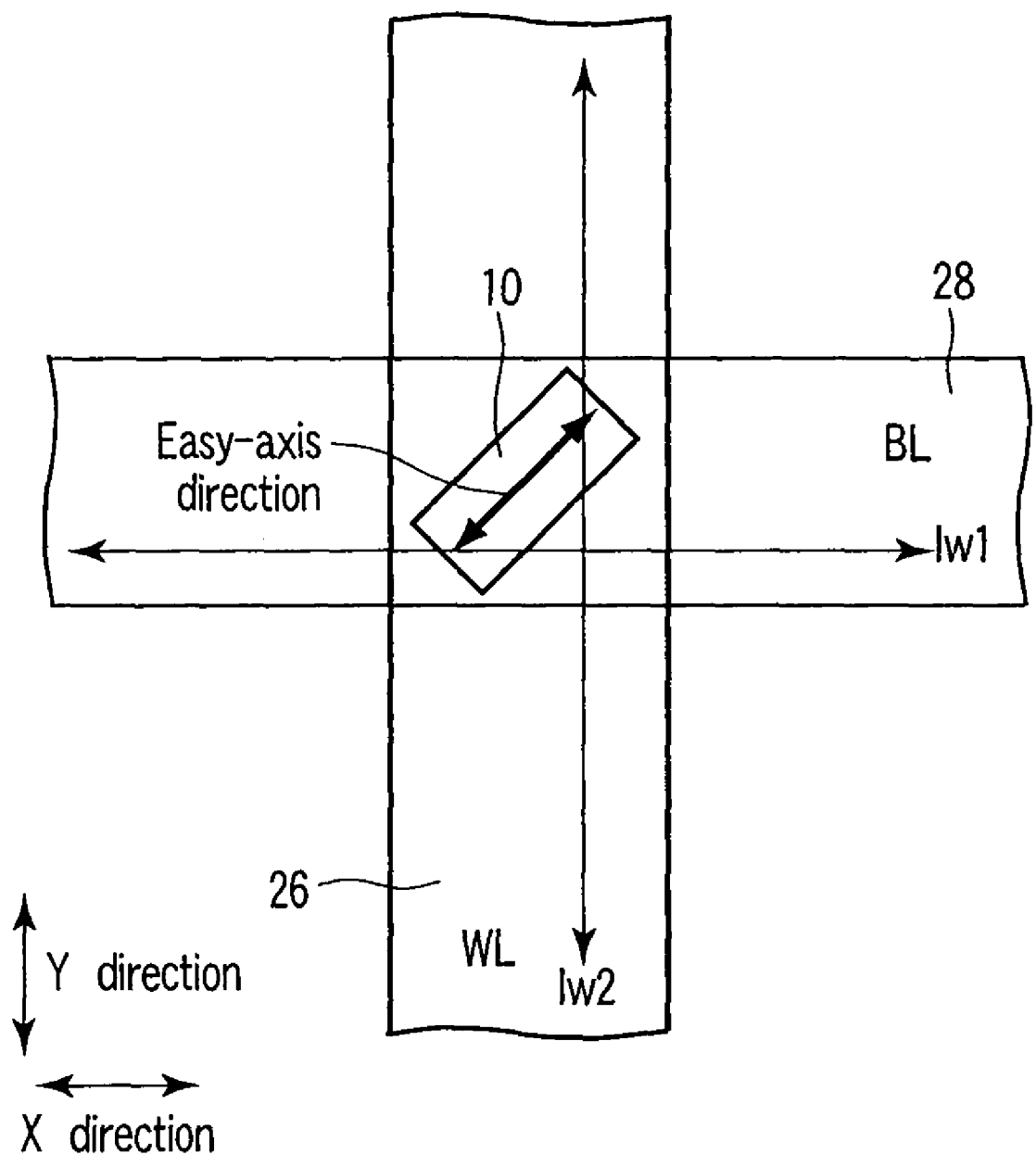
FIG. 78 is a plan view showing a toggle memory cell of a magnetic random access memory according to an embodiment of the present invention.

FIG. 78 is a plan view showing a toggle memory cell of the magnetic random access memory according to the embodiment of the present invention. The toggle cell structure will be described below.

As shown in FIG. 78, in the toggle cell, the MTJ element 10 is arranged such that the axis of easy magnetization of the MTJ element 10 is tilted with respect to the running direction (X direction) of the bit line 28 or the running direction (Y direction) of the word line 26, i.e., tilted with respect to the direction of the write current Iw1 to be supplied to the bit line 28 or the direction of the write current Iw2 to be supplied to the word line 26. The tilt of the MTJ element 10 is, e.g., about 30° to 60°, and preferably, about 45°. The MTJ element 10 can use the above-described various structures. At least the recording layer 13 preferably has an antiferromagnetic coupling structure.

In the above-described toggle memory cell, the data write and read are executed in the following way.

The write operation is executed in the following manner. In the toggle write, before arbitrary data is written in the selected cell, the data of the selected cell is read out. If it is determined by reading out the data of the selected cell that the arbitrary data has already been written, no write is executed. If data different from the arbitrary data is written, the write is executed to rewrite the data.

After the above-described check cycle, if data must be written in the selected cell, the two write interconnections (bit line 28 and word line 26) are sequentially turned on. The write interconnection turned on first is turned off. Then, the write interconnection turned on later is turned off. For example, the procedures comprise four cycles: the word line 26 is turned on to supply the write current Iw2→the bit line 28 is turned on to supply the write current Iw1→the word line 26 is turned off to stop supplying the write current Iw2→the bit line 28 is turned off to stop supplying the write current Iw1.

In the data read operation, the read current Ir is supplied to the bit line 28 and word line 26 connected to the selected MTJ element 10, thereby reading out the data of the MTJ element 10.

According to the MTJ element 10 of the embodiment of the present invention and the magnetic random access memory having the MTJ element 10, the following effects can be obtained.

First, when, of the fixed layer 11, nonmagnetic layer 12, and recording layer 13, at least the recording layer 13 has a so-called cross planar shape with portions projecting in the hard-axis direction, the switching field Hsw can be made much smaller than the easy-axis reversal field Hc. For this reason, the write error in an adjacent memory cell can be reduced.

Second, even when the MTJ element 10 becomes small because it has the so-called cross planar shape, as described above, the volume of the recording layer 13 can be increased sufficiently by setting the thickness T of the recording layer 13 to 5 to 20 nm and the aspect ratio L/W to 1.5 to 2.2. For this reason, even the small MTJ element 10 can hold a sufficient thermal fluctuation constant and implement high thermal stability.

Reference 5 described above discloses forming the planar shape of the MTJ element 10 into the so-called cross shape. Reference 5 however contains no mention about defining the relationship between the thickness and aspect ratio of the recording layer 13 to improve the thermal stability. If the so-called cross-shaped MTJ element 10 is formed actually while keeping the recording layer 13 thin, irregular magnetic anisotropy caused due to the nonuniformity of the film material formed in the neighborhood or a finite shape variation caused by the nonuniformity of the manufacturing process is present. For this reason, formation of a magnetic structure complying with the shape is suppressed, and no desired reversal characteristic is exhibited.

To the contrary, in the embodiment of the present invention, the thickness of the cross-shaped recording layer 13 is set to 5 to 20 nm, and the aspect ratio of the recording layer 13 is set to 1.5 to 2.2. With the two settings, a magnetic random access memory can be provided at high yield, which can easily control the magnetic structure unique to the shape and, more specifically, the edge domain, sufficiently reduce the magnetic field necessary for the write, and prevent any write error in a half-selected cell.

5. Second Example of Magnetoresistive Element

The second example of a magnetoresistive element to execute the above-described 2.(1) Magnetization State Switching Mechanism will be described next.

In the second example of the magnetoresistive element, a magnetic tunnel junction (MTJ) element will be described in (1) as an example of the magnetoresistive element. A magnetic random access memory (MRAM) having the MTJ element as a recording element will be described in (2). In the following description, the same reference numerals denote the same parts throughout the drawing.

(1) MTJ Element

An MTJ element according to an embodiment of the present invention will be described first. A. Planar Shape, B. Manufacturing Method, C. Tunnel Junction Structure, D. Sectional Shape, E. Interlayer Exchange Coupling Structure, and F. Material will be described here.

A. Planar Shape

Examples 1 to 9 of the planar shape of the MTJ element will be described below.

Example 1

Figure 79A:
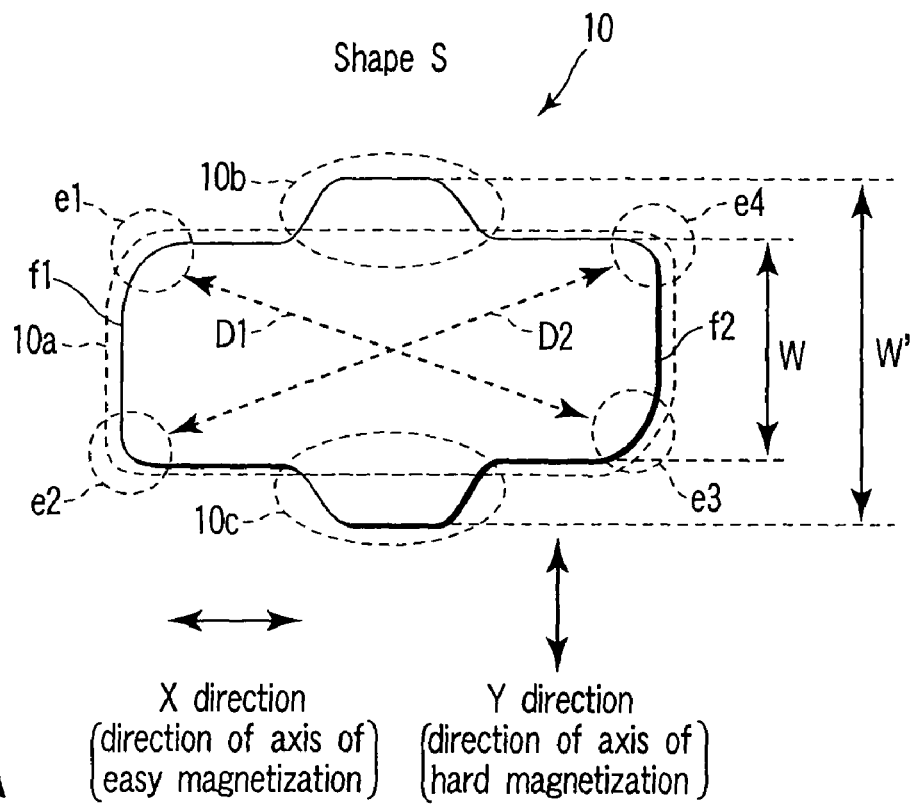
FIGS. 79A and 79B are plan and sectional views, respectively, showing a shape S of the MTJ element according to Example 1 of the present invention.
Figure 79B:
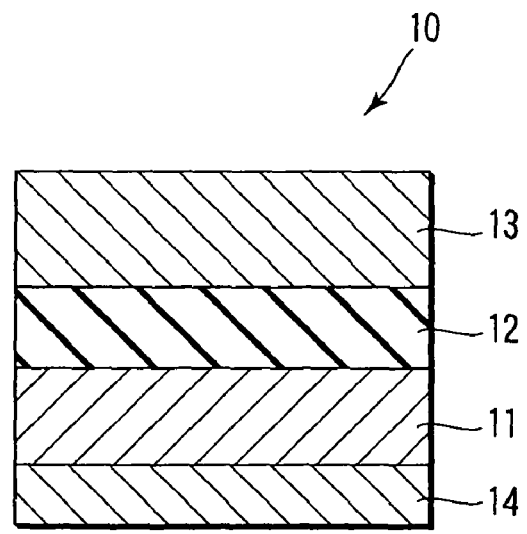

FIGS. 79A and 79B are plan and sectional views showing a shape S of an MTJ element according to Example 1 of the present invention. The shape S of the MTJ element according to Example 1 will be described below.

As shown in FIGS. 79A and 79B, an MTJ element 10 has at least a magnetization fixed layer (to be referred to as a fixed layer hereinafter) 11 with a fixed magnetization direction, a magnetization free layer (to be referred to as a recording layer hereinafter) 13 whose magnetization direction is reversed by an applied field, and a nonmagnetic layer (e.g., a tunnel insulating layer) 12 sandwiched between the fixed layer 11 and the recording layer 13. An antiferromagnetic layer 14 to fix the magnetization of the fixed layer 11 is provided under the fixed layer 11.

The MTJ element 10 includes a long portion 10a running in the X direction and projecting portions 10b and 10c projecting in the Y direction (a direction perpendicular to the X direction) from, e.g., near the central portions of the two side surfaces of the long portion 10a so that a so-called cross shape is formed. In other words, in the planar shape of the MTJ element 10, a Y-direction width W' near the central portion is larger than a Y-direction width W at the ends. The X direction as the running direction of the long portion 10a corresponds to the direction of axis of easy magnetization of the MTJ element 10. The Y direction as the projecting direction of the projecting portions 10b and 10c corresponds to the direction of axis of hard magnetization of the MTJ element 10.

The long portion 10a has curved first to fourth ends e1, e2, e3, and e4. The first and third ends e1 and e3 are located on a first diagonal line D1. The second and fourth ends e2 and e4 are located on a second diagonal line D2. The first and third ends e1 and e3 are cut off in a larger amount than the second and fourth ends e2 and e4. In other words, the radii of curvature of the first and third ends e1 and e3 are larger than those of the second and fourth ends e2 and e4. The radii of curvature of the first and third ends e1 and e3 almost equal each other. The radii of curvature of the second and fourth ends e2 and e4 almost equal each other.

Two side surfaces f1 and f2 at the easy-axis direction ends of the long portion 10a extend almost parallel to the direction of axis of hard magnetization and connect with the curved first to fourth ends e1, e2, e3, and e4.

The projecting portions 10b and 10c project from the central regions of the side surfaces of the long portion 10a. They only need to project from regions except the ends of the side surfaces of the long portion 10a.

Figure 80:
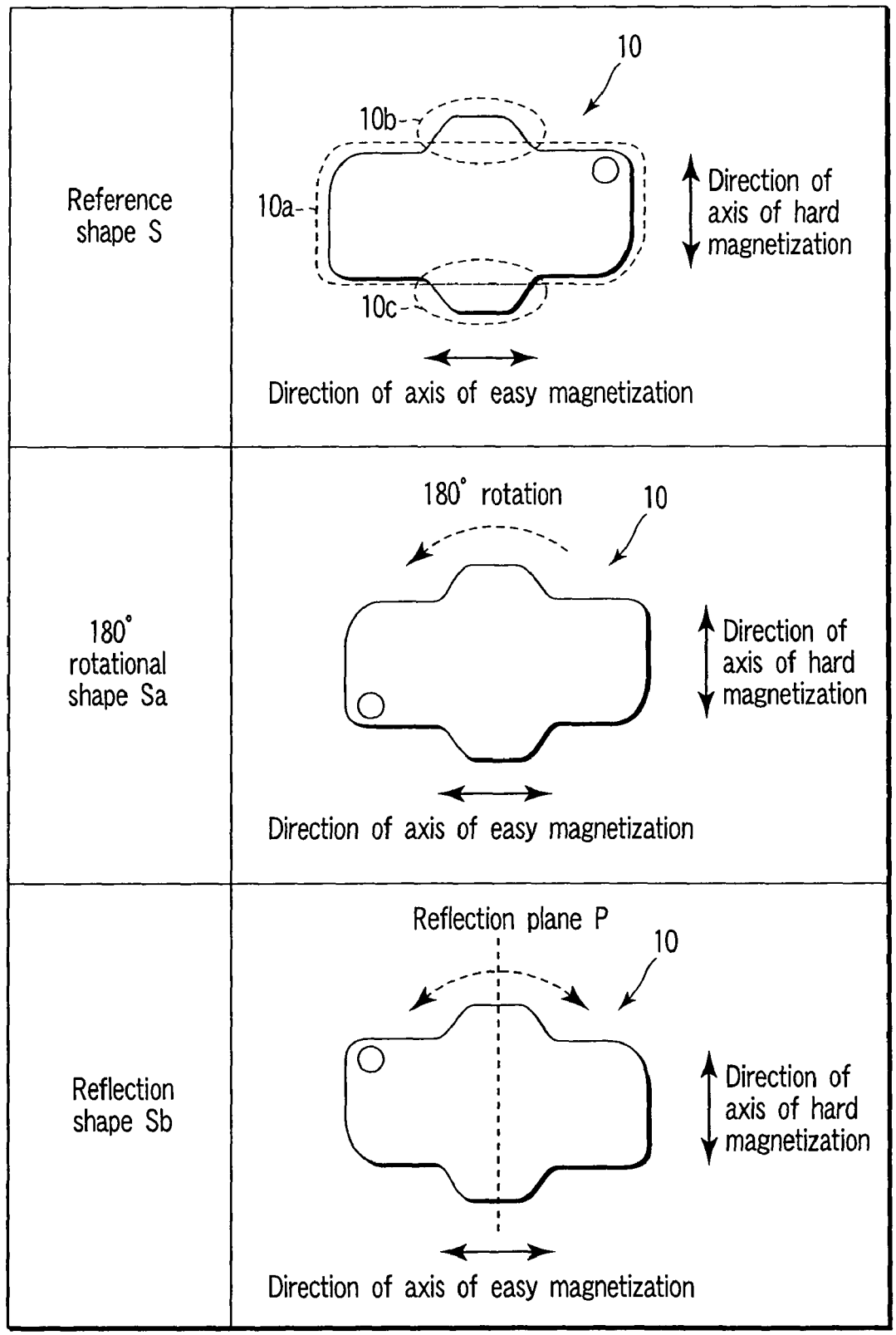
FIG. 80 is a table for explaining the 180° rotational symmetry and reflection symmetry of the shape S of the MTJ element according to Example 1 of the present invention.

FIG. 80 is a table for explaining the 180° rotational symmetry and reflection symmetry of the shape S of the MTJ element according to Example 1 of the present invention. A circle in the MTJ element shown in FIG. 80 is added for convenience to explain the 180° rotational symmetry and reflection symmetry of the MTJ element.

As shown in FIG. 80, the shape S of the MTJ element 10 is an in-plane shape which has the 180° rotational symmetry but no reflection symmetry.

The "180° rotational symmetry" means the symmetry between the reference shape S and a shape Sa obtained by rotating the planar shape of the MTJ element 10 by 180°. The 180° rotational symmetry is also called two times-rotation symmetry. Since the 180° rotational shape Sa is the same as the reference shape S, the shape S of the MTJ element 10 has the 180° rotational symmetry.

The "reflection symmetry" means the symmetry between the reference shape S and a reflection shape Sb based on a reflection plane P in the direction of axis of hard magnetization. Since the reflection shape Sb is different from the reference shape S, the shape S of the MTJ element 10 has no reflection symmetry.

The reason why the planar shape of the MTJ element 10 preferably has the 180° rotational symmetry and no reflection symmetry will be described next.

Figure 81:
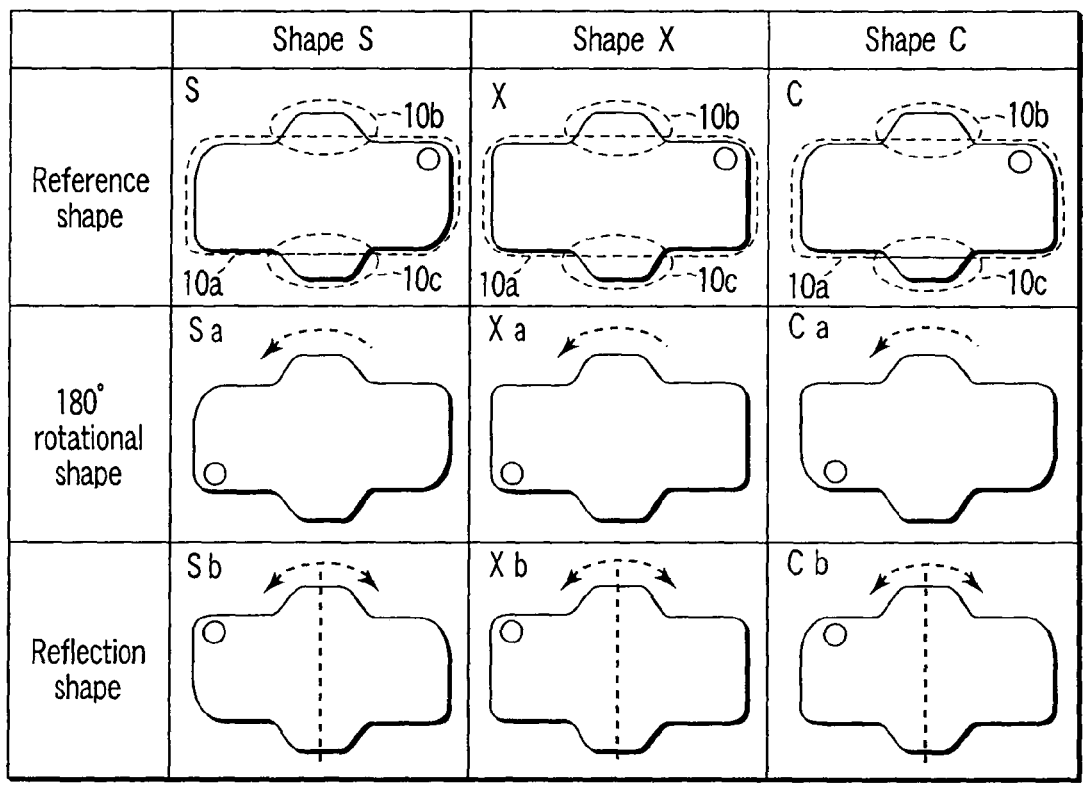
FIG. 81 is a table for explaining the 180° rotational symmetry and reflection symmetry of the shapes S, X, and C of the MTJ element according to Example 1 of the present invention.

FIG. 81 is a table for explaining the 180° rotational symmetry and reflection symmetry of the shapes S, X, and C of the MTJ element according to Example 1 of the present invention. A circle in the MTJ element shown in FIG. 81 is added for convenience to explain the 180° rotational symmetry and reflection symmetry of the MTJ element. The shapes S, X, and C used in the following explanation will be described first.

As shown in FIG. 81, in the shapes S, X, and C, all the MTJ elements 10 have a so-called cross shape. The long portions 10a of the MTJ elements 10 have ends with different shapes.

The shape S is the shape of the MTJ element 10 according to Example 1 of the present invention. As described above, the shape S has the 180° rotational symmetry and no reflection symmetry.

In the shape X, the long portion 10a is rectangular. In the shape X, a 180° rotational shape Xa is the same as the reference shape X. A reflection shape Xb is the same as the reference shape X. Hence, the shape X has both the 180° rotational symmetry and the reflection symmetry.

In the shape C, the long portion 10a is trapezoidal. In the shape C, a 180° rotational shape Ca is different from the reference shape C. A reflection shape Cb is the same as the reference shape C. Hence, the shape C has the reflection symmetry but no 180° rotational symmetry.

The difference in asteroid characteristic between the MTJ elements 10 with the shapes S, X, and C will be described next.

Figure 82:
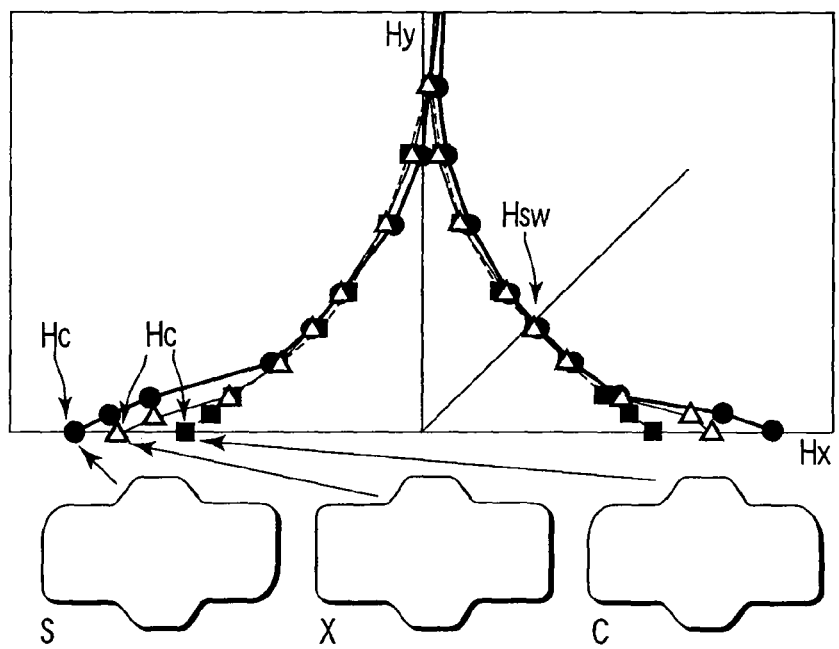
FIG. 82 is a graph showing the comparison of asteroid characteristics between MTJ elements with the shapes S, X, and C according to Example 1 of the present invention.

FIG. 82 is a graph showing the comparison of asteroid characteristic between the MTJ elements with the shapes S, X, and C according to Example 1 of the present invention. Each experimental value in FIG. 82 was obtained by measuring and averaging about 100-bit elements.

As shown in FIG. 82, in the shape S, a reversal field Hc in the easy-axis direction is much larger than a reversal field Hsw at the write point, and the write margin is large, as compared to the shapes X and C. Hence, the shape S can effectively suppress a write error in a half-selected cell. The reason why a satisfactory asteroid characteristic is obtained by the shape S can be considered as follows. Since the ends of the shapes S, X, and C have different symmetries, as described above, different residual domain states are stabilized.

The magnetic field Hsw is a write field (a synthetic field in the easy-axis and hard-axis directions) necessary for flux reversal at a point where a line tilted by 45° from the origin crosses the asteroid curve. The magnetic field Hc is a write field (a magnetic field in only the easy-axis direction) necessary for flux reversal.

A condition to increase the reversal field Hc in the easy-axis direction when the recording layer 13 has a so-called cross shape will be examined. The above-described shape X is used in this examination.

FIG. 83 shows residual domain states possible for the shape X according to Example 1 of the present invention and domain states obtained by applying a magnetic field in the easy-axis direction. A solid arrow in FIG. 83 schematically represents an in-plane magnetization direction.

As shown in FIG. 83, the shape X has the 180° rotational symmetry and reflection symmetry and therefore can take two residual domain states: S-shaped domain and C-shaped domain.

In the S-shaped residual domain, when a magnetic field is applied in the easy-axis direction, the magnetization at the central portion of the element is directed in the direction reverse to the edge domain to decrease the energy of the entire system because of the relationship between magnetic anisotropy in the hard-axis direction caused by the projecting portions 10b and 10c projecting at the central portion and magnetostatic energy generated by the magnetizations directed in the same direction at the ends (solid line in FIG. 83). Hence, two C-shaped domains are generated, as indicated by dotted lines in FIG. 83. The C-shaped domain is generally stable in its energy. For this reason, the reversal field along the easy-axis has a value much larger than in a case without the C-shaped domain.

In the C-shaped residual domain, although anisotropy in the hard-axis direction is given by the projecting portions 10b and 10c, the magnetization directions at the ends are different. Hence, unlike the S-shaped residual domain, only one C-shaped domain is generated, as indicated by a dotted line in FIG. 83. The magnetic field Hc is smaller than in the S-shaped residual domain state.

In conclusion, the condition to sufficiently increase the magnetic field Hc when the recording layer 13 has a so-called cross shape is to set the S-shaped residual domain state.

A condition to stabilize only the S-shaped residual domain state will be considered.

Generally, the residual domain state of a ferromagnetic material is so determined as to minimize the energy of the entire system, which is determined by exchange magnetic interaction acting between magnetic moments and the magnetostatic energy of a magnetic pole generated at an in-plane shape end. Which of the S-shaped domain and C-shaped domain is stabilized depends on the symmetry of the in-plane shape.

FIGS. 84A and 84B are schematic views showing cases wherein the S-shaped residual domain state and C-shaped residual domain state are assumed in the shape S according to Example 1 of the present invention.

As shown in FIG. 84B, when the C-shaped residual domain state is assumed, a large magnetic pole appears in a region indicated by the dotted line in FIG. 84B, and the magnetostatic energy rises. In the S-shaped residual domain state, as shown in FIG. 84A, since the magnetic domain and shape have the same symmetry, a magnetic pole is rarely generated in a region indicated by the dotted line, and the magnetostatic energy does not rise. Hence, the shape S can be regarded to stably have only the S-shaped residual domain.

In the shape C shown in FIG. 81, the C-shaped residual domain is stabilized. In the shape X shown in FIG. 81, both the S-shaped residual domain and the C-shaped residual domain exist stably. Hence, the shapes X and C do not satisfy the condition to stabilize only the S-shaped residual domain state.

In conclusion, the MTJ element 10 according to Example 1 of the present invention preferably has a so-called cross shape having the 180° rotational symmetry but no reflection symmetry. With this structure, an element can be obtained at high yield, in which the reversal field Hc in the easy-axis direction is much larger than the reversal field Hsw at a write point, and the write margin is large.

Example 2

Figure 85:
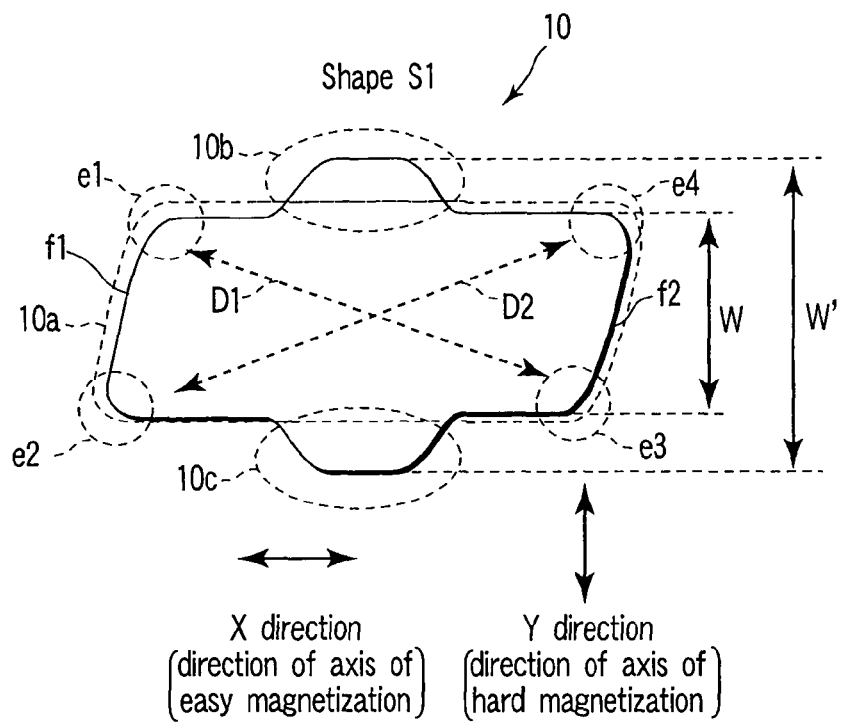
FIG. 85 is a plan view showing a shape S1 of an MTJ element according to Example 2 of the present invention.

FIG. 85 is a plan view showing a shape S1 of an MTJ element according to Example 2 of the present invention. The shape S1 of the MTJ element according to Example 2 will be described below.

As shown in FIG. 85, the shape S1 of an MTJ element 10 according to Example 2 is a so-called cross shape having the 180° rotational symmetry but no reflection symmetry, as in Example 1.

A long portion 10a has curved first to fourth ends e1, e2, e3, and e4. The first and third ends e1 and e3 are located on a first diagonal line D1. The second and fourth ends e2 and e4 are located on a second diagonal line D2. The first and third ends e1 and e3 are cut off in a larger amount than the second and fourth ends e2 and e4. In other words, the radii of curvature of the first and third ends e1 and e3 are larger than those of the second and fourth ends e2 and e4. The radii of curvature of the first and third ends e1 and e3 almost equal each other. The radii of curvature of the second and fourth ends e2 and e4 almost equal each other.

Example 2 is different from Example 1 in that two side surfaces f1 and f2 at the easy-axis direction ends of the long portion 10a are formed from almost straight lines which are tilted by the same angle in the same direction with respect to the direction of axis of hard magnetization. Hence, the long portion 10a of Example 2 has a shape close to a parallelogram.

Figure 86:
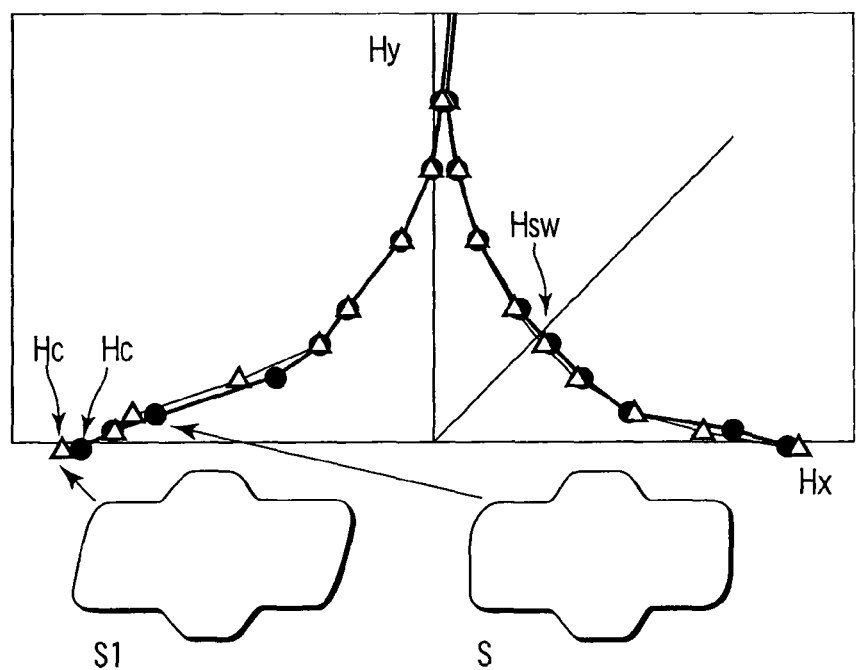
FIG. 86 is a graph showing the experiment result of comparison of asteroid characteristics between the MTJ elements with the shapes S and S1 according to Examples 1 and 2 of the present invention.

FIG. 86 is a graph showing the experiment result of comparison of asteroid characteristics between the MTJ elements with the shapes S and S1 according to Examples 1 and 2 of the present invention.

As shown in FIG. 86, even the shape S1 of Example 2 satisfies the condition about the symmetry. For this reason, the residual state is stabilized in the S-shaped domain state, an asteroid characteristic with a magnetic field Hc much larger than a magnetic field Hsw can be obtained, and the write margin becomes large.

Example 3

Figure 87:
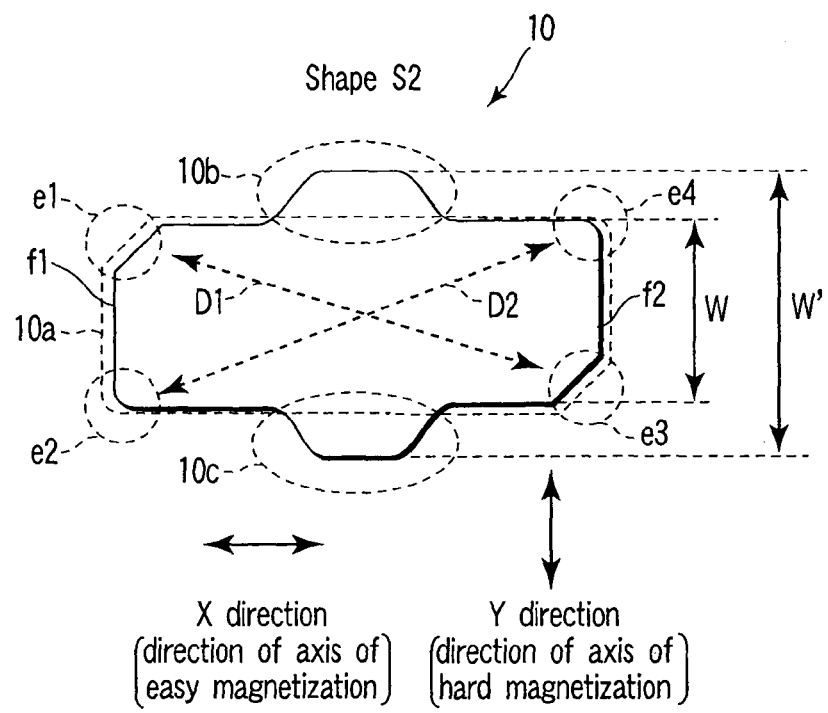
FIG. 87 is a plan view showing a shape S2 of an MTJ element according to Example 3 of the present invention.

FIG. 87 is a plan view showing a shape S2 of an MTJ element according to Example 3 of the present invention. The shape S2 of the MTJ element according to Example 3 will be described below.

As shown in FIG. 87, the shape S2 of an MTJ element 10 according to Example 3 is a so-called cross shape having the 180° rotational symmetry but no reflection symmetry, as in Example 1.

A long portion 10a has first to fourth ends e1, e2, e3, and e4. The first and third ends e1 and e3 are located on a first diagonal line D1. The second and fourth ends e2 and e4 are located on a second diagonal line D2.

Example 3 is different from Example 1 in that the first and third ends e1 and e3 are cut off in a larger amount than the second and fourth ends e2 and e4. More specifically, in the shape S of Example 1, the first and third ends e1 and e3 are cut off curvilinearly. In the shape S2 of Example 3, the first and third ends e1 and e3 are cut off linearly. The lines of the first and third ends e1 and e3 are tilted by the same angle with respect to the direction of axis of easy magnetization and the direction of axis of hard magnetization.

Figure 88:
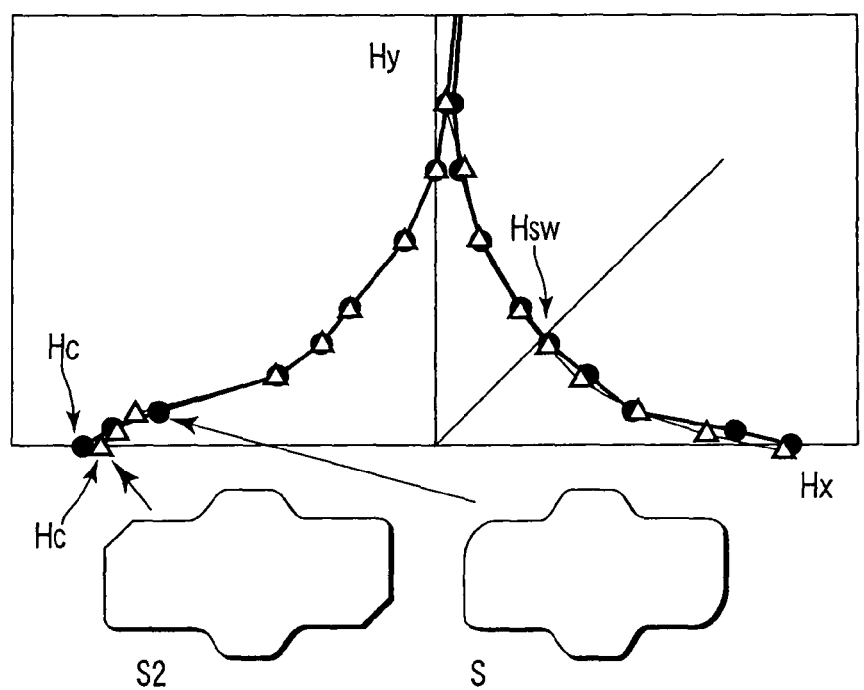
FIG. 88 is a graph showing the experiment result of comparison of asteroid characteristics between the MTJ elements with the shapes S and S2 according to Examples 1 and 3 of the present invention.

FIG. 88 is a graph showing the experiment result of comparison of asteroid characteristics between the MTJ elements with the shapes S and S2 according to Examples 1 and 3 of the present invention.

As shown in FIG. 88, although the shapes S and S2 are different, no large change is observed in their asteroid characteristics. When the ends of the long portion 10a are cut off asymmetrically in accordance with the above-described definition of symmetry, an asteroid characteristic with a magnetic field Hc much larger than a magnetic field Hsw can be obtained, and the write margin becomes large.

Example 4

Figure 89:
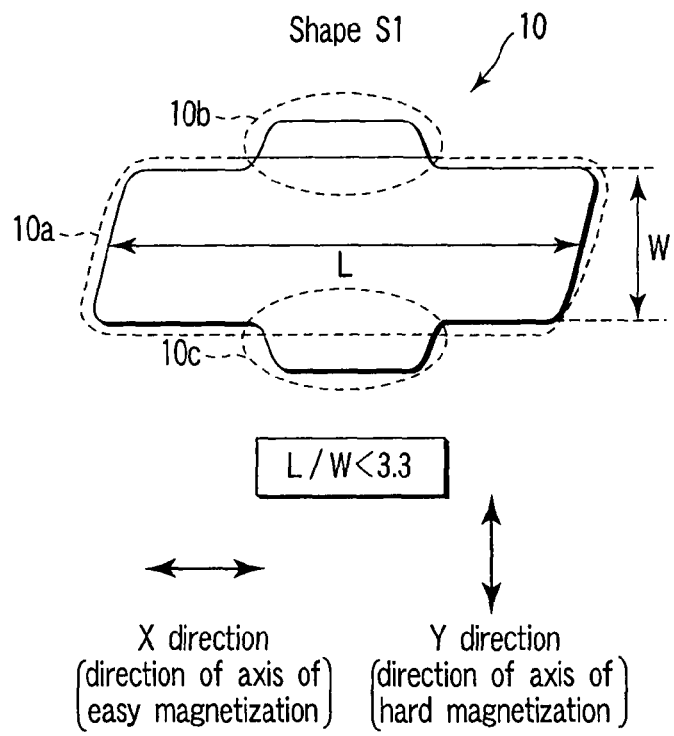
FIG. 89 is a plan view showing an MTJ element according to Example 4 of the present invention.

FIG. 89 is a plan view showing an MTJ element according to Example 4 of the present invention. The MTJ element according to Example 4 will be described below.

As shown in FIG. 89, in Example 4, let L be the maximum width of a long portion 10a in the direction of axis of easy magnetization, and W be the maximum width of the long portion 10a in the direction of axis of hard magnetization. Then, L/W is defined. In this example, the width L is defined by a line passing through the median of the maximum width W. In this example, an MTJ element 10 having a shape S1 is used.

Figure 90:
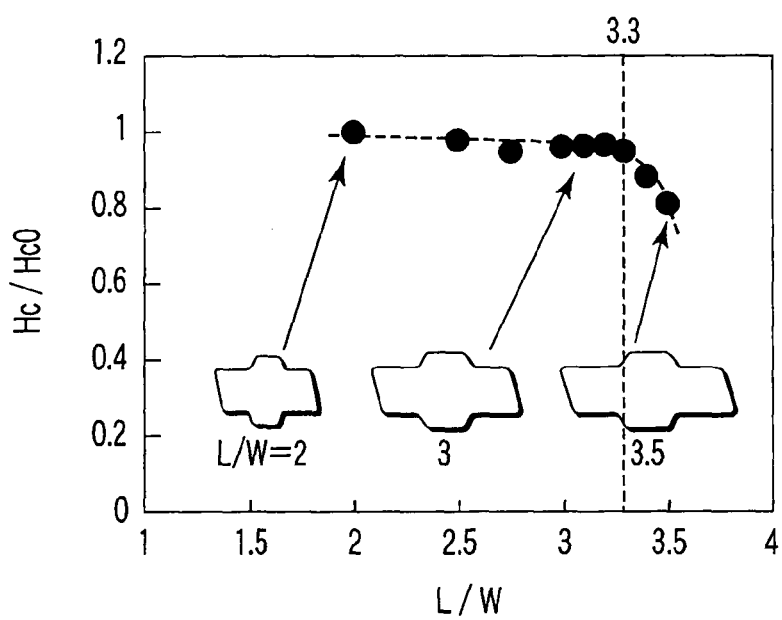
FIG. 90 is a graph showing the measurement result of the L/W dependence of a magnetic field Hc in the MTJ element according to Example 4 of the present invention.

FIG. 90 shows the measurement result of the L/W dependence of a magnetic field Hc in the MTJ element according to Example 4 of the present invention. Shapes when L/W=2, 3, and 3.5 are illustrated for reference purposes. Hc is normalized by an easy-axis reversal field Hc0 of the shape with L/W=3. The L/W dependence of the magnetic field Hc will be described below.

As shown in FIG. 90, when L/W>3.3, Hc abruptly decreases. However, when L/W<3.3, Hc rarely changes. Hence, when the shape satisfies L/W<3.3, an element can be obtained, in which the characteristic change in magnetic field Hc is small even when L/W slightly changes in the shaping process, and a large write margin can be obtained stably.

From the above description, L/W preferably satisfies $$L/W < 3.3 \quad (3)$$

Considering that the direction of axis of easy magnetization is defined by using shape anisotropy, L/W is preferably larger than 1 to prevent the long portion 10a from being square.

When suppressing the manufacturing variation in the direction of axis of easy magnetization is taken into consideration, L/W can also be defined by, e.g., $$2 < L/W < 3.3 \quad (4)$$

$$2 < L/W < 3 \quad (5)$$

The experiment example of the L/W dependence obtained on the basis of the shape S1 has been described above. Even for a shape based on the shape S or S2, a stable characteristic with a small change in Hc can be obtained when L/W<3.3.

Example 5

Figure 91:
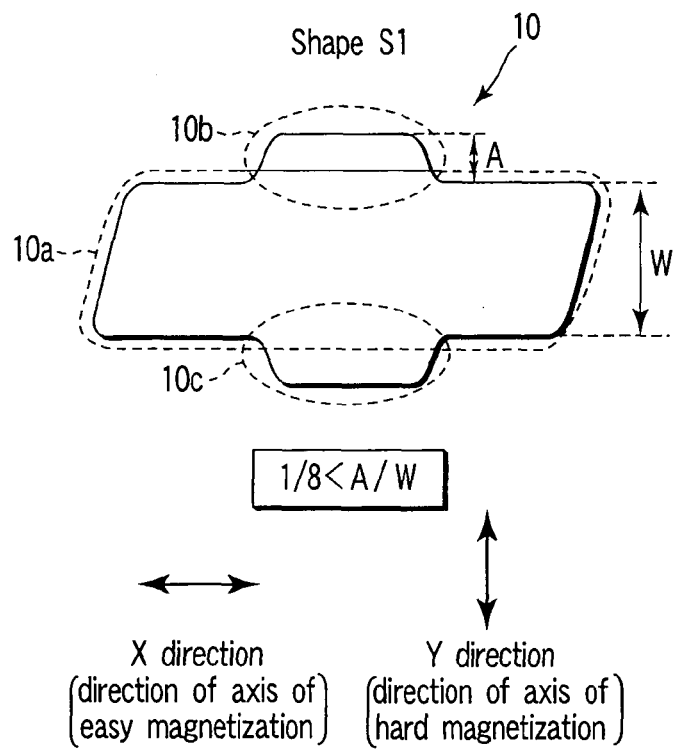
FIG. 91 is a plan view showing an MTJ element according to Example 5 of the present invention.

FIG. 91 is a plan view showing an MTJ element according to Example 5 of the present invention. The MTJ element according to Example 5 will be described below.

As shown in FIG. 91, in Example 5, let W be the maximum width of a long portion 10a in the direction of axis of hard magnetization, and A be the maximum width of each of projecting portions 10b and 10c in the direction of axis of hard magnetization. Then, A/W is defined. In this example, an MTJ element 10 having an shape S1 is used.

Figure 92:
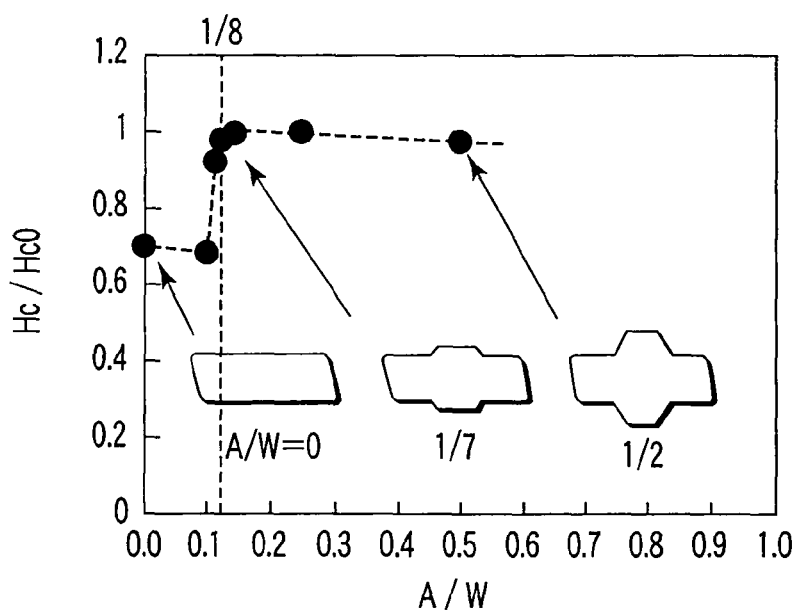
FIG. 92 is a graph showing the measurement result of the A/W dependence of a magnetic field Hc in the MTJ element according to Example 5 of the present invention.

FIG. 92 shows the measurement result of the A/W dependence of a magnetic field Hc in the MTJ element according to Example 5 of the present invention. Shapes when A/W=0, 1/7, and 1/2 are illustrated for reference purposes. Hc is normalized by an easy-axis reversal field Hc0 of the shape with A/W=1/7. The A/W dependence of the magnetic field Hc will be described below.

As shown in FIG. 92, Hc abruptly decreases near A/W=1/8. However, when A/W>1/8, Hc rarely changes. Hence, when the shape satisfies A/W>1/8, an element can be obtained, in which the characteristic change in magnetic field Hc is small, and a large write margin can be obtained stably.

From the above description, A/W preferably satisfies $$1/8 < A/W \quad (6)$$

When reducing the manufacturing variation is taken into consideration, A/W can also be defined by, e.g., $$1/7 < A/W \quad (7)$$

$$1/4 < A/W < 1/3 \quad (8)$$

When upper limit value of A/W can be obtained on the basis of [A+(W/2)]<L/2.

The experiment example of the A/W dependence obtained on the basis of the shape S1 has been described above. Even for a shape based on the shape S or S2, a stable characteristic with a small change in Hc can be obtained when A/W>1/8.

Example 6

Figure 93:
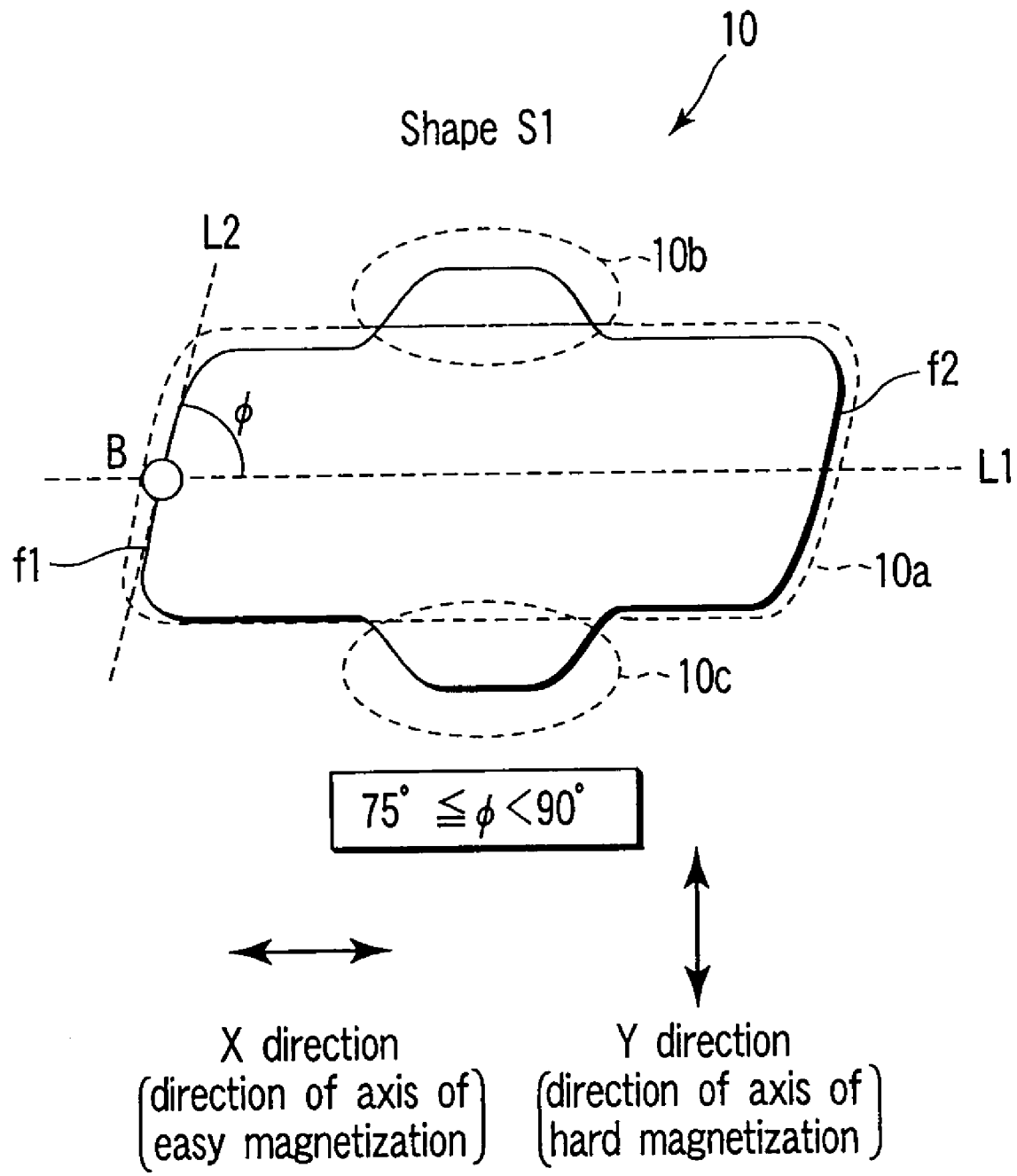
FIG. 93 is a plan view showing an MTJ element according to Example 6 of the present invention.

FIG. 93 is a plan view showing an MTJ element according to Example 6 of the present invention. The MTJ element according to Example 6 will be described below.

As shown in FIG. 93, in Example 6, when each of side surfaces f1 and f2 at the easy-axis direction ends of a long portion 10a is formed from a line L2, like the shape S1, an angle $\phi$ made by a line L1 in the direction of axis of easy magnetization and the side surfaces f1 and f2 (line L2) is defined.

Figure 94A:
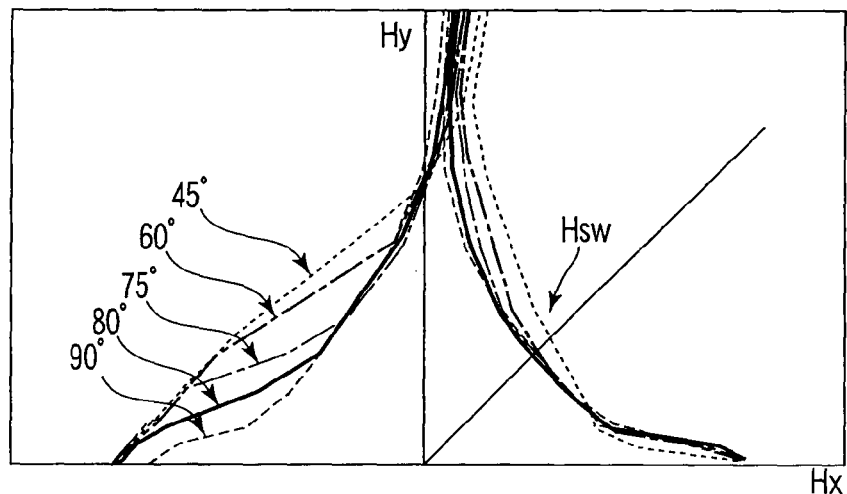
FIG. 94A is a graph showing the measurement result of the asteroid characteristic of the MTJ element according to Example 6 of the present invention.
Figure 94B:
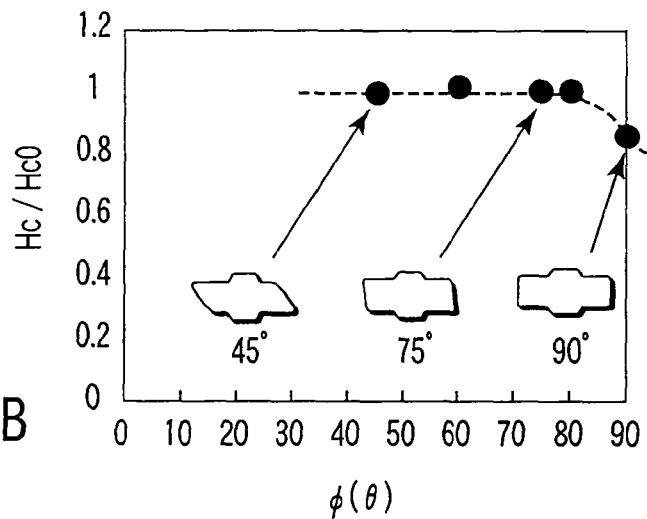
FIG. 94B is a graph showing the measurement result of the φ dependence of a magnetic field Hc in the MTJ element according to Example 6 of the present invention.
Figure 94C:
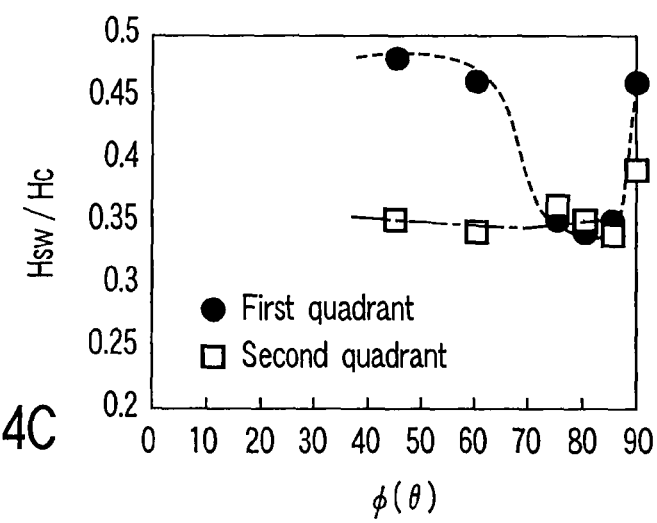
FIG. 94C is a graph showing the φ dependence of the first and second quadrants of the MTJ element according to Example 6 of the present invention.

FIG. 94A shows the measurement result of the asteroid characteristic of the MTJ element according to Example 6 of the present invention. FIG. 94B shows the measurement result of the $\phi$ dependence of a magnetic field Hc in the MTJ element according to Example 6 of the present invention. FIG. 94C shows the $\phi$ dependence of the first and second quadrants of the MTJ element according to Example 6 of the present invention. Hc is normalized by Hc of a shape with $\phi=75°$. The asteroid characteristic and the $\phi$ dependence of Hc will be described below.

As is apparent from FIGS. 94A and 94B, when $\phi<90°$, Hc abruptly increases. As shown in FIG. 94A, as $\phi$ decreases, the asteroid characteristic in the first quadrant and that in the second quadrant systematically become asymmetrical. As is apparent from FIG. 94C, a region where a ratio Hsw/Hc in the first and second quadrants is sufficiently low can be estimated as a range of $75° \leq \phi < 90°$.

As is apparent from the above result, in the shape S1, the angle $\phi$ made by the axis of easy magnetization and the side surfaces f1 and f2 satisfies $75° \leq \phi < 90°$, as indicated by $$75° \leq \phi < 90° \quad (9)$$

In this case, a characteristic with a sufficiently low ratio Hsw/Hc can be obtained stably.

Example 7

In Example 6 (FIG. 93), the angle $\phi$ when the side surfaces f1 and f2 at the easy-axis ends of the long portion 10a are linear is defined. In Example 7, an angle $\phi$ when side surfaces f1 and f2 at the easy-axis ends of a long portion 10a are curved is defined.

Figure 95:
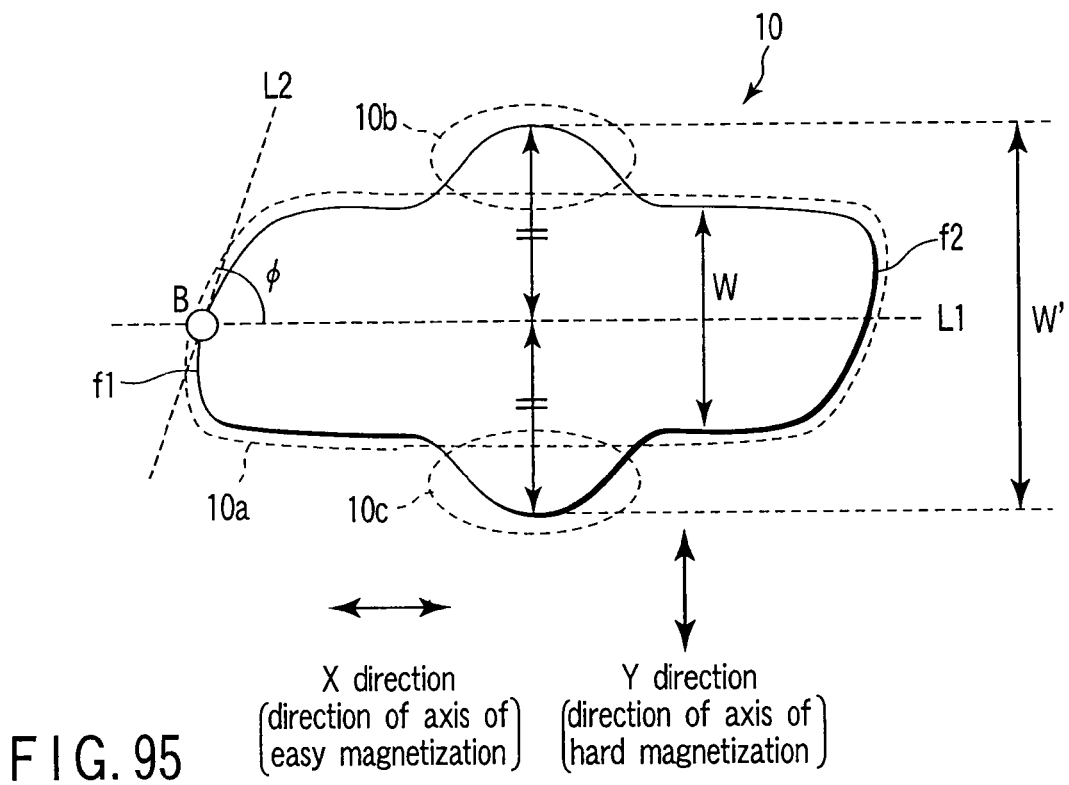
FIG. 95 is a plan view showing an MTJ element according to Example 7 of the present invention.

FIG. 95 is a plan view showing an MTJ element according to Example 7 of the present invention. The MTJ element according to Example 7 will be described below.

When the side surfaces f1 and f2 at the easy-axis ends of the long portion 10a are curved, as shown in FIG. 95, the angle φ is defined as follows.

A line L1 almost parallel to the axis of easy magnetization is drawn at a position where a maximum width W1 in the direction of axis of hard magnetization near the central portion of the cross shape of the MTJ element 10 is divided into two equal parts. A point where the line L1 crosses the cross shape is defined as B. A tangent L2 to the curve at the point B is drawn.

The angle made by the line L1 and tangent L2 is defined as φ.

Even when the angle φ is defined in this way, a characteristic with a sufficiently low ratio Hsw/Hc can be obtained stably by satisfying expression (9).

Example 8

In Examples 4 and 5 (FIGS. 89 and 91), the width W is defined. In Example 8, how to define a width W when the corners of the bases of projecting portions 10b and 10c are round will be described.

Figure 96:
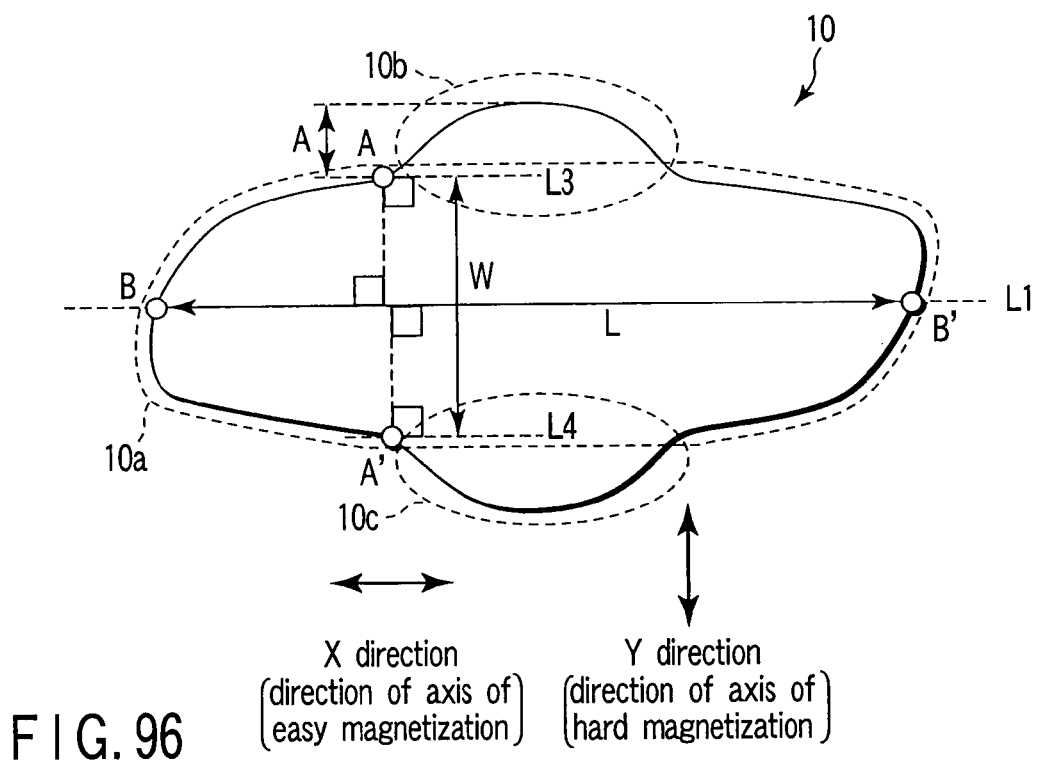
FIG. 96 is a plan view showing an MTJ element according to Example 8 of the present invention.

FIG. 96 is a plan view showing an MTJ element according to Example 8 of the present invention. The MTJ element according to Example 8 will be described below.

When the corners of the bases of the projecting portions 10b and 10c are round, as shown in FIG. 96, the width W is defined as follows.

Points of the curves of the bases of the projecting portions 10b and 10c, where the absolute values of differential coefficients are minimum, are defined as A and A'. Points B and B' are defined on the easy-axis direction two ends of a long portion 10a. A line L1 (line segment BB') parallel to the axis of easy magnetization is drawn. Lines L3 and L4 which are parallel to the line L1 and pass through the points A and A' are drawn. The interval between the two lines L3 and L4 is defined as the width W.

A width A of each of the projecting portions 10b and 10c is defined by the distance between the above-described line L3 or L4 and the apex of the projecting portion 10b or 10c.

Even when the widths W and A are defined in this way, an element can be obtained, in which the characteristic change in Hc is small, and a large write margin can be obtained stably, by satisfying expressions (3) to (8).

Example 9

In Example 9, the shape of an MTJ element 10 has neither 180° rotational symmetry nor reflection symmetry. However, the same effects as in the above-described examples are obtained by using a shape to stabilize the S-shaped domain.

Figure 97A:
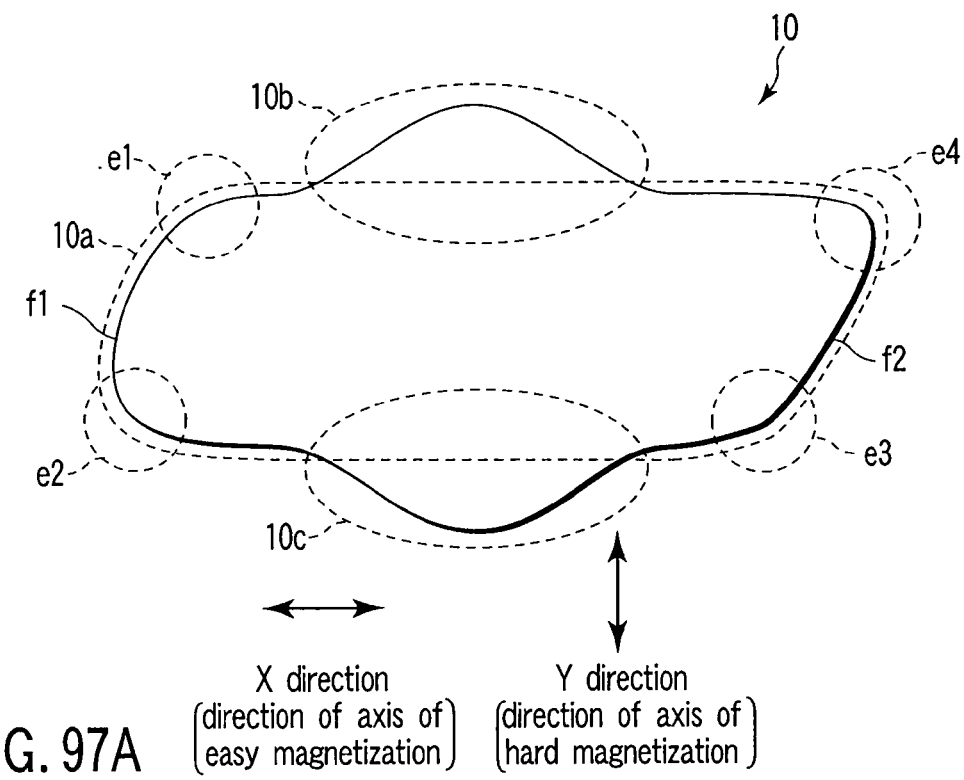
FIGS. 97A and 97B are plan views showing an MTJ element according to Example 9 of the present invention.
Figure 97B:
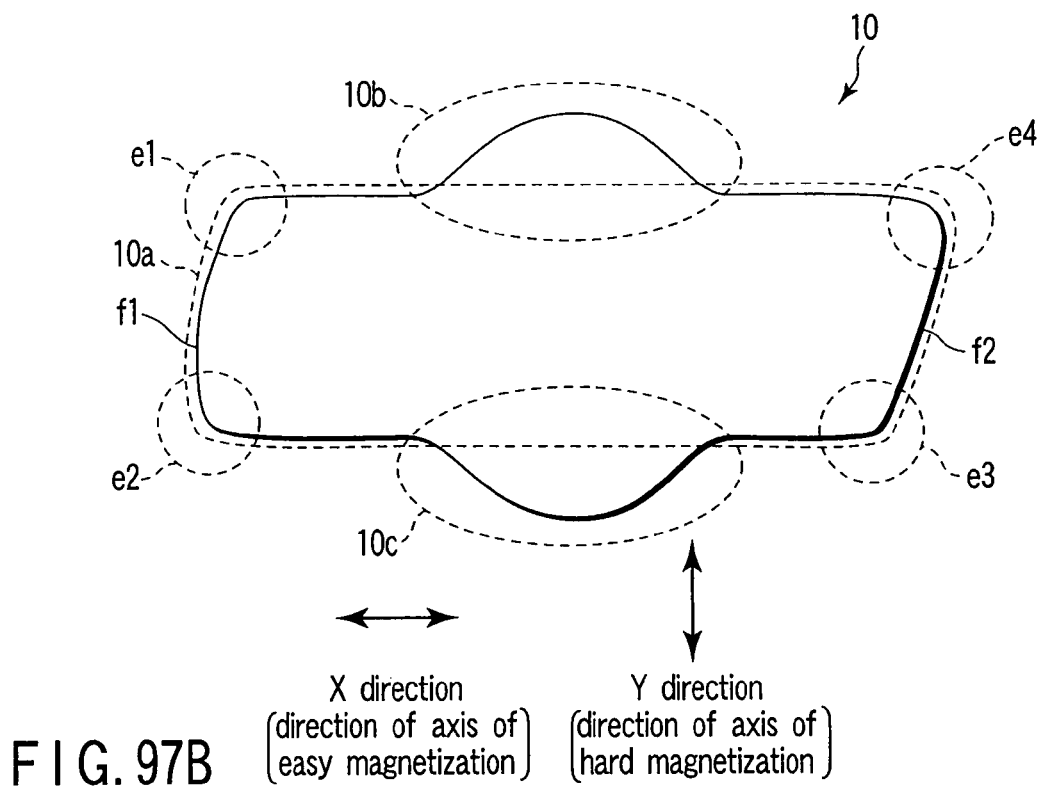

FIGS. 97A and 97B are plan views showing an MTJ element according to Example 9 of the present invention. The MTJ element according to Example 9 will be described below.

As shown in FIGS. 97A and 97B, in the MTJ element 10 according to Example 9, side surfaces f1 and f2 of a long portion 10a in the easy-axis direction have different shapes. Hence, the angular forms (radii of curvature) of second and fourth ends e2 and e4 located on the same diagonal line are different. The fourth end e4 is sharper than the second end e2.

When the MTJ element 10 is formed actually, the S-shaped domain can still be stabilized even when ends e1, e2, e3, and e4 are curved, or the symmetry between the projecting portions 10b and 10c is lost, as shown in FIG. 98.

In the above-described examples, the shape, angle φ, and width of the MTJ element 10 are defined. At least the recording layer 13 of the MTJ element 10 needs to be set as in the above-described examples. That is, the fixed layer 11 and nonmagnetic layer 12 may be different from the above-described examples.

Various examples may be combined.

The MTJ element 10 may have a so-called convex planar shape including the long portion 10a running in the X direction and the projecting portion 10b projecting in the Y direction from, e.g., near the central portion of a side surface of the long portion 10a. Even in this case, the shape of the MTJ element 10 preferably has the 180° rotational symmetry but no reflection symmetry.

The projecting portions 10b and 10c preferably project from near the central portions of the side surfaces of the long portion 10a such that the shape of the MTJ element 10 becomes as close as possible to a cross. The projecting portions 10b and 10c may be provided asymmetrically with respect to the long portion 10a. Even in this case, the shape of the MTJ element 10 preferably has the 180° rotational symmetry but no reflection symmetry.

The number of projecting portions 10b and 10c of the MTJ element 10 is not limited to one on each side surface of the long portion 10a. The projecting portions need not always be provided equal in number on the side surfaces of the long portion 10a. A plurality of projecting portions may be provided on one side surface of the long portion 10a. In this case, the shape of the long portion 10a of the MTJ element 10 preferably has the 180° rotational symmetry but no reflection symmetry.

If the planar shape of the MTJ element 10 has the 180° rotational symmetry but no reflection symmetry, the ends e1, e2, e3, and e4 of the long portion 10a, the ends of the projecting portions 10b and 10c, and the bases of the projecting portions 10b and 10c may be round.

The direction of axis of easy magnetization is defined on the basis of, e.g., the magnetization direction at the center of the long portion 10a.

B. Manufacturing Method

Examples 1 to 4 of a method of manufacturing an MTJ element having the above-described shape will be described here.

An MTJ element is generally formed in the following way. An element film is formed by sputtering. Then, a resist is applied. A pattern is formed by using one of light, electron beam, and X-rays and developed to form a resist pattern. Ion milling or etching is executed for the element film by using the resist pattern as a mask, thereby forming an MTJ element with a desired pattern. Then, the resist is removed. In this forming method, the step of forming the in-plane shape of the MTJ element is executed only once.

In the examples to be described below, the step of forming the in-plane shape of the MTJ element is executed at least twice. That is, a step of forming a cross shape including the long portion 10a and projecting portions 10b and 10c and a step of forming a shape having the 180° rotational symmetry but no reflection symmetry are executed. Detailed examples will be described below.

Example 1

In Example 1, an MTJ element having, e.g., the above-described shape S1 (FIG. 85) is formed.

FIGS. 99A to 99C are plan views showing steps in manufacturing the MTJ element according to Example 1 of the present invention. The MTJ element manufacturing method according to Example 1 will be described below.

As shown in FIG. 99A, an element film 100 and mask layer 200 are deposited sequentially. The mask layer 200 is formed into a cross shape including a long portion 10a running in the direction of axis of easy magnetization and projecting portions 10b and 10c projecting in the direction of axis of hard magnetization from the side surfaces of the long portion 10a. The element film 100 is patterned into the cross shape by using the mask layer 200 (step 1). Then, the mask layer 200 is removed.

As shown in FIG. 99B, a resist pattern 300 having lines tilted with respect to the easy-axis direction side surfaces of the long portion 10a is formed. The end shape of the long portion 10a is processed by using the resist pattern 300 as a mask (step 2). Then, the resist pattern 300 is removed.

The MTJ element 10 with the shape S1 which has the 180° rotational symmetry but no reflection symmetry is thus completed, as shown in FIG. 99C.

According to Example 1, when the two steps are used to form the shape of the MTJ element 10, an element in which a magnetic field Hc is much larger than a magnetic field Hsw can be formed stably at high yield.

Example 2

In Example 2, an easy-axis direction width L of a long portion 10a formed in step 1 is short. The angle of a resist pattern 300 used in step 2 with respect to the long portion 10a is different from Example 1. In Example 2, an MTJ element having, e.g., the above-described shape S2 (FIG. 87) is formed.

FIGS. 100A to 100C are plan views showing steps in manufacturing the MTJ element according to Example 2 of the present invention. The MTJ element manufacturing method according to Example 2 will be described below.

As shown in FIG. 100A, an element film 100 and mask layer 200 are deposited sequentially. The mask layer 200 is formed into a cross shape including the long portion 10a running in the direction of axis of easy magnetization and projecting portions 10b and 10c projecting in the direction of axis of hard magnetization from the side surfaces of the long portion 10a. The element film 100 is patterned into the cross shape by using the mask layer 200 (step 1). Then, the mask layer 200 is removed.

As shown in FIG. 100B, the resist pattern 300 having lines tilted with respect to the easy-axis direction side surfaces of the long portion 10a is formed. At this time, the mask layer 200 is laid out such that the easy-axis direction ends of the element film 100 are only partially removed. The end shape of the long portion 10a is processed by using the resist pattern 300 as a mask (step 2). Then, the resist pattern 300 is removed.

The MTJ element 10 with the shape S2 which has the 180° rotational symmetry but no reflection symmetry is thus completed, as shown in FIG. 100C.

According to Example 2, when the two steps are used to form the shape of the MTJ element 10, an element in which a magnetic field Hc is much larger than a magnetic field Hsw can be formed stably at high yield. In addition, an in-plane shape can stably be formed, in which the corners of ends e1 and e3 located on one diagonal line of the long portion 10a running in the direction of axis of easy magnetization are cut off in a larger amount than the corners of ends e2 and e4 on the other diagonal line.

In Examples 1 and 2, when the resist pattern 300 having a curve tilted with respect to the long portion 10a is formed, the easy-axis direction side surfaces of the long portion 10a can be rounded.

In Examples 1 and 2, the MTJ element is formed in this order: the cross-shaped mask layer 200 is formed→the element film 100 is patterned into a cross shape→the resist pattern 300 to cut the ends of the long portion 10a is formed→the ends of the element film 100 are cut. The shaping process of the element film 100 can also be executed in one step. For example, after the mask layer 200 is formed into a cross shape, the easy-axis direction ends of the mask layer 200 are patterned. Then, the element film 100 is processed by using the mask layer 200. In this case, steps 1 and 2 can be integrated into one step.

Example 3

In Example 3, a hard-axis direction width A1 of a projecting portion 10b and a hard-axis direction width A2 of a projecting portion 10c of an MTJ element can equal each other in the following MTJ element manufacturing method.

FIGS. 101A to 101E are plan views showing steps in manufacturing the MTJ element according to Example 3 of the present invention. The MTJ element manufacturing method according to Example 3 will be described below.

As shown in FIG. 101A, an element film 100 and mask layer 200 are deposited sequentially. The mask layer 200 is formed into, e.g., a parallelogram shape by lithography and reactive ion etching (RIE).

As shown in FIG. 101B, a sidewall layer 201 made of, e.g., an SiN film is deposited. The sidewall layer 201 is etched by, e.g. RIE. The sidewall layer 201 remains around the side surfaces of the mask layer 200.

As shown in FIG. 101C, a photoresist 202 having, e.g., a rectangular shape is formed by lithography.

As shown in FIG. 101D, the sidewall layer 201 exposed from the photoresist 202 is removed by using the photoresist 202 as a mask. With this process, a pair of sidewall layers 201b and 201c are formed on parts of the side surfaces of the mask layer 200. Then, the photoresist 202 is removed.

As shown in FIG. 101E, the element film 100 is etched by, e.g., RIE using the sidewall layers 201b and 201c and mask layer 200 as a mask. A cross-shaped MTJ element 10 having a long portion 10a and projecting portions 10b and 10c is formed in a self-aligned manner.

According to Example 3, the mask layer 200 is formed on the MTJ element 10. The pair of sidewall layers 201b and 201c are formed on the side surfaces of the mask layer 200. Then, the element film 100 is processed by using the mask layer 200 and sidewall layers 201b and 201c to form the so-called cross-shaped MTJ element 10. For this reason, the projecting portions 10b and 10c can be self-aligned to the long portion 10a by the sidewall layers 201b and 201c. Since misalignment between the projecting portions 10b and 10c projecting in the minor-axis direction (hard-axis direction) can be suppressed, the widths A1 and A2 of the projecting portions 10b and 10c can equal each other. Hence, the asteroid characteristic can be improved.

Example 4

In Example 4, a 3-step process is executed by applying the 2-step process of Example 3.

FIGS. 102A to 102F are plan views showing steps in manufacturing the MTJ element according to Example 4 of the present invention. The MTJ element manufacturing method according to Example 4 will be described below.

Figure 102B:
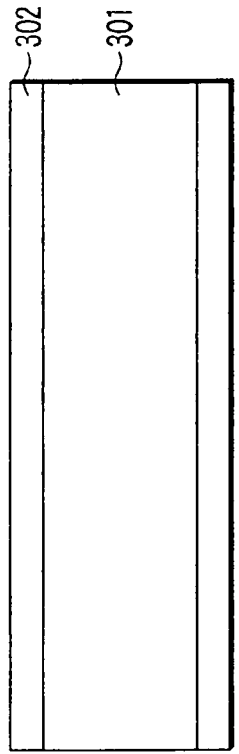
FIGS. 102A to 102F are plan views showing steps in manufacturing the MTJ element according to Example 4 of the present invention.
Figure 102A:
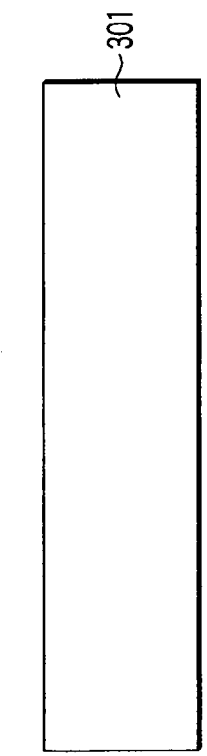

As shown in FIG. 102A, the first photolithography/etching step is executed to form a long linear portion extending over a plurality of memory cells is formed by a hard mask (e.g., SiO$_2$) 301. The hard mask 301 forms a long portion 10*a* of an MTJ element 10 later (first step).

As shown in FIG. 102B, an insulating layer (e.g., SiN) 302 is formed on each sidewall of the hard mask 301.

Figure 102E:
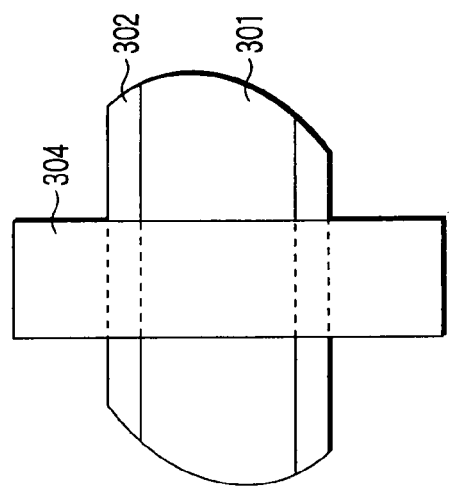
Figure 102D:
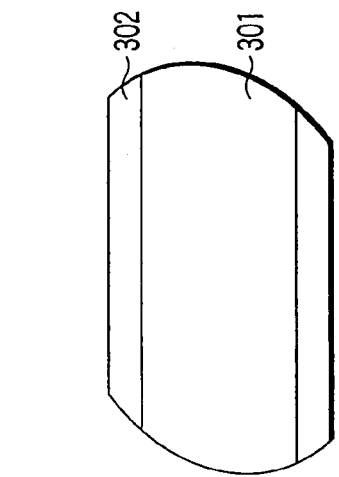
Figure 102C:
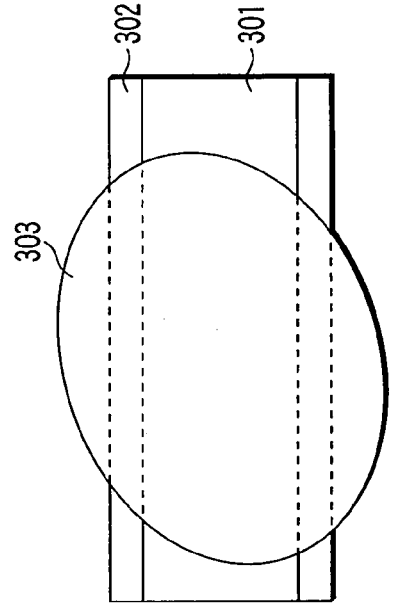

As shown in FIGS. 102C and 102D, the second photolithography/etching step is executed to transfer the pattern of a photoresist 303 to the hard mask 301 and insulating layer 302. With this process, the shape of the long portion 10*a* of the MTJ element 10 is determined (second step).

Figure 102F:
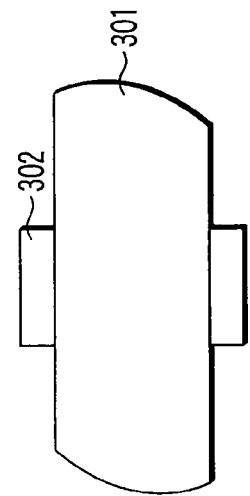
Figure 105:
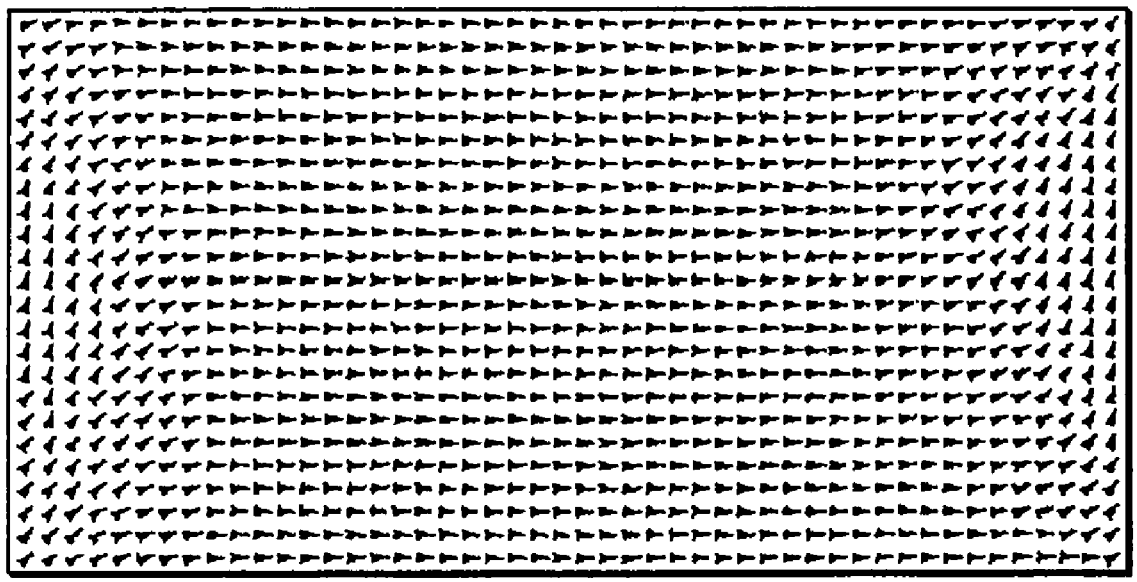
FIG. 105 is a view showing a rectangular magnetoresistive element.

As shown in FIGS. 102E and 102F, the third photolithography/etching step is executed to transfer the pattern of a photoresist 304 to the insulating layer 302 serving as a hard mask. The insulating layer 302 determines the shape of projecting portions 10*b* and 10*c* of the MTJ element 10 (third step).

Then, the MTJ element 10 is patterned by using the hard masks 301 and 302. The MTJ element 10 is formed into an S-cross shape in which both the long portion 10*a* and the projecting portions 10*b* and 10*c* are accurately controlled to the desired shapes.

According to Example 4, both the shape of the long portion 10*a* and the shape of the projecting portions 10*b* and 10*c* of the MTJ element 10 can be formed accurately. Hence, an array of MTJ elements 10 with an excellent asteroid characteristic and a small variation in it can be obtained.

In the manufacturing method of the MTJ element 10, Examples 1 to 4 can be combined variously.

C. Tunnel Junction Structure

The above-described MTJ element 10 may have a single tunnel junction structure including one nonmagnetic layer 12 functioning as a tunnel junction layer, as shown in FIG. 79A. However, the present invention is not limited to this. The MTJ element 10 may have a double tunnel junction structure.

FIG. 103 is a sectional view showing an MTJ element according to an embodiment of the present invention, which has a double tunnel junction structure. The MTJ element having the double tunnel junction structure will be described below.

As shown in FIG. 103, the MTJ element 10 with the double tunnel junction structure has two nonmagnetic layers 12-1 and 12-2 each functioning as a tunnel junction layer. A first fixed layer 11-1 is provided at one end of the recording layer 13 via the first nonmagnetic layer 12-1. A second fixed layer 11-2 is provided at the other end of the recording layer 13 via the second nonmagnetic layer 12-2.

In the double tunnel junction structure, the bias voltage per tunnel junction is ½ the applied voltage as compared to the single tunnel junction structure. Hence, a decrease in magnetoresistive (MR) ratio caused by an increase in bias voltage can be suppressed.

D. Sectional Shape

The above-described MTJ element 10 may have such a sectional shape that all the side surfaces of the fixed layer 11, nonmagnetic layer 12, and recording layer 13 match continuously. However, the present invention is not limited to this. The MTJ element 10 may have a sectional shape with discontinuous side surfaces.

FIGS. 104A and 104B are sectional views showing MTJ elements according to the embodiment of the present invention, which have convex sectional shapes. The convex sectional shape of the MTJ element will be described below.

As shown in FIG. 104A, in the MTJ element 10 having a single tunnel junction structure, the planar shape of the recording layer 13 is smaller than that of the fixed layer 11 and nonmagnetic layer 12 so that a convex sectional shape is formed.

As shown in FIG. 104B, in the MTJ element 10 having a double tunnel junction structure, the planar shape of the recording layer 13, second nonmagnetic layer 12-2, and second fixed layer 11-2 is smaller than that of the first fixed layer 11-1 and first nonmagnetic layer 12-1 so that a convex sectional shape is formed.

In the convex sectional shape, the short circuit between the fixed layer 11 and the recording layer 13 or between the first fixed layer 11-1 and the recording layer 13 can be suppressed as compared to the sectional shape shown in FIG. 79B.

E. Interlayer Exchange Coupling Structure

Even the second example of the magnetoresistive element can have the antiferromagnetic coupling structure or ferromagnetic coupling structure, like the first example of the magnetoresistive element. For further information, see 4. (1) E. Interlayer Exchange Coupling Structure described above.

F. Material

For the fixed layer 11, recording layer 13, antiferromagnetic layer 14, and nonmagnetic layer 12 of the second example of the magnetoresistive element, the same materials as in the first example of the magnetoresistive element can be used. For further information, see 4. (1) F. Material described above.

(2) Magnetic Random Access Memory

A magnetic random access memory according to the embodiment of the present invention will be described next.

The above-described various kinds of MTJ elements 10 can suitably be used as the storage element of a memory cell in a magnetic random access memory. Examples of the memory cell structure of the magnetic random access memory are a select transistor cell, select diode cell, and cross-point cell. For further information, see 4. (2) Magnetic Random Access Memory.

According to the MTJ element 10 of the above-described embodiment of the present invention and the magnetic random access memory with the MTJ element 10, the following effects can be obtained.

At least the recording layer 13 of the MTJ element 10 has a so-called cross shape, and the end shapes of the long portion 10*a* are changed so that a planar shape having the 180° rotational symmetry but no reflection symmetry is formed. For this reason, the S-domain state can be stabilized as the residual domain state. An element with a satisfactory reversal characteristic can be formed at high yield. The switching field Hsw can be much smaller than the easy-axis reversal field Hc. Hence, the write error in an adjacent memory cell can be reduced, and the thermal stability can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
   a fixed layer having a direction of magnetization fixed;
   a free layer having a direction of magnetization set variable; and
   a non-magnetic layer interposed between the fixed layer and the free layer,
   wherein: the free layer includes a long portion extending in a first direction and a projecting portion projecting from a region except an end of a side of the long portion in a second direction perpendicular to the first direction, a planar shape of the free layer has a 180° rotational symmetry but no reflection symmetry, the long portion has first and third corners located on a first diagonal line and second and fourth corners located on a second diagonal line, and the first and third corners are cut off linearly such that a single edge is added the free layer for each corner cut off.

2. The element according to claim 1, wherein both ends of the long portion in the first direction are tilted in the same direction with respect to the second direction.

3. The element according to claim 2, wherein the both ends of the long portion in the first direction are formed from straight lines.

4. The element according to claim 2, wherein $75° \leq \phi < 90°$, where $\phi$ is an angle made by a tilted direction of the both ends of the long portion and the first direction.

5. The element according to claim 1, wherein radii of curvature of the first and third ends equal each other, radii of curvature of the second and fourth ends equal each other.

6. The element according to claim 1, wherein L/W <3.3, where L is a maximum width of the long portion in the first direction and W is a maximum width of the long portion in the second direction.

7. The element according to claim 1, wherein A/W >1/8, where A is a maximum width of the projecting portion in the second direction and W is a maximum width of the long portion in the second direction.

8. The element according to claim 1, wherein the first direction is an axis of easy magnetization, and the second direction is an axis of hard magnetization.

9. The element according to claim 1, wherein a planar shape of the long portion has the 180° rotational symmetry but no reflection symmetry.

10. The element according to claim 1, wherein the projecting portion projects from a central portion of the side of the long portion in the second direction.

11. A magnetic random access memory comprising a memory element including a magnetoresistive element: the magnetoresistive element comprising:

a fixed layer having a direction of magnetization fixed;

a free layer having a direction of magnetization set variable; and a non-magnetic layer interposed between the fixed layer and the free layer, wherein: the free layer includes a long portion extending in a first direction and a projecting portion projecting from a region except an end of a side of the long portion in a second direction perpendicular to the first direction, a planar shape of the free layer has a 180° rotational symmetry but no reflection symmetry, the long portion has first and third corners located on a first diagonal line and second and fourth corners located on a second diagonal line, and the first and third corners are cut off linearly such that a single edge is added the free layer for each corners cut off.

12. The memory according to claim 11, wherein both ends of the long portion in the first direction are tilted in the same direction with respect to the second direction.

13. The memory according to claim 12, wherein the both ends of the long portion in the first direction are formed from straight lines.

14. The memory according to claim 11, wherein radii of curvature of the first and third ends equal each other, radii of curvature of the second and fourth ends equal each other.

15. The memory according to claim 11, wherein the first direction is an axis of easy magnetization, and the second direction is an axis of hard magnetization.

16. The memory according to claim 11, wherein the projecting portion projects from a central portion of the side of the long portion in the second direction.

17. The memory according to claim 11, wherein L/W <3.3, where L is a maximum width of the long portion in the first direction and W is a maximum width of the long portion in the second direction.

* * * * *